(12) United States Patent
Yamazaki et al.

(10) Patent No.: US 10,199,592 B2
(45) Date of Patent: Feb. 5, 2019

(54) DISPLAY ELEMENT, DISPLAY DEVICE, OR ELECTRONIC DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Takayuki Ikeda, Kanagawa (JP); Yoshiyuki Kurokawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/520,647

(22) PCT Filed: Oct. 20, 2015

(86) PCT No.: PCT/IB2015/058052
§ 371 (c)(1),
(2) Date: Apr. 20, 2017

(87) PCT Pub. No.: WO2016/067154
PCT Pub. Date: May 6, 2016

(65) Prior Publication Data
US 2017/0309856 A1    Oct. 26, 2017

(30) Foreign Application Priority Data

Oct. 29, 2014 (JP) ................... 2014-219838

(51) Int. Cl.
*H01L 29/04* (2006.01)
*H01L 51/50* (2006.01)
(Continued)

(52) U.S. Cl.
CPC .......... *H01L 51/5012* (2013.01); *B81B 7/008* (2013.01); *B81C 1/00246* (2013.01);
(Continued)

(58) Field of Classification Search
CPC ................... B81C 1/00174; B81B 2203/0181
See application file for complete search history.

(56) References Cited

U.S. PATENT DOCUMENTS 5,444,566 A    8/1995  Gale et al.
5,506,597 A    4/1996  Thompson et al.
(Continued)

FOREIGN PATENT DOCUMENTS

CN    102460968 A    5/2012
CN    103797400 A    5/2014
(Continued)

OTHER PUBLICATIONS

International Search Report (Application No. PCT/IB2015/058052) dated Jan. 19, 2016.
(Continued)

*Primary Examiner* — Kevin M Picardat
(74) *Attorney, Agent, or Firm* — Nixon Peabody LLP; Jeffrey L. Costellia

(57) ABSTRACT

A highly reliable micromachine, display element, or the like is provided. As a micromachine or a transistor including the micromachine, a transistor including an oxide semiconductor in a semiconductor layer where a channel is formed is used. For example, a transistor including an oxide semiconductor is used as at least one transistor in one or a plurality of transistors driving a micromachine.

15 Claims, 31 Drawing Sheets

(51) Int. Cl.
*G02B 26/02* (2006.01)
*H01L 29/786* (2006.01)
*C09K 11/59* (2006.01)
*H01L 51/00* (2006.01)
*B81B 7/00* (2006.01)
*B81C 1/00* (2006.01)
*C09K 11/06* (2006.01)
*H01L 51/05* (2006.01)
*H01L 51/42* (2006.01)

(52) U.S. Cl.
CPC .............. *C09K 11/59* (2013.01); *G02B 26/02* (2013.01); *H01L 29/786* (2013.01); *H01L 51/0051* (2013.01); *B81B 2201/042* (2013.01); *B81C 2203/0735* (2013.01); *C09K 11/06* (2013.01); *H01L 51/0508* (2013.01); *H01L 51/4226* (2013.01)

(56) References Cited

U.S. PATENT DOCUMENTS

| | | | |
|---|---|---|---|
| 6,034,660 A | 3/2000 | Millward et al. | |
| 6,184,852 B1 | 2/2001 | Millward et al. | |
| 6,188,426 B1 | 2/2001 | Nakamura | |
| 6,455,392 B2 | 9/2002 | Maimon et al. | |
| 6,636,194 B2 | 10/2003 | Ishii | |
| 6,690,033 B2 | 2/2004 | Yamazaki et al. | |
| 6,762,873 B1 | 7/2004 | Coker et al. | |
| 6,781,742 B2 | 8/2004 | Yamazaki et al. | |
| 6,906,552 B2 * | 6/2005 | Ajit | H03K 19/00315 326/63 |
| 7,205,820 B1 * | 4/2007 | Yeung | H03K 3/356165 326/81 |
| 7,304,782 B2 | 12/2007 | Kimura et al. | |
| 7,528,933 B2 | 5/2009 | Venema | |
| 7,804,327 B2 * | 9/2010 | Jao | H03K 3/356182 326/68 |
| 8,362,853 B2 | 1/2013 | Park | |
| 8,981,875 B2 | 3/2015 | Park | |
| 9,235,047 B2 | 1/2016 | Miyamoto et al. | |
| 2005/0073735 A1 * | 4/2005 | Monroe | B81C 1/00174 359/290 |
| 2005/0134355 A1 * | 6/2005 | Maede | H03K 3/356113 327/333 |
| 2005/0219676 A1 | 10/2005 | Kimura et al. | |
| 2005/0270066 A1 * | 12/2005 | Kozawa | H03K 3/356113 326/81 |
| 2007/0236675 A1 | 10/2007 | Venema | |
| 2008/0174532 A1 * | 7/2008 | Lewis | G09G 3/3433 345/85 |
| 2010/0321132 A1 | 12/2010 | Park | |
| 2012/0306562 A1 | 12/2012 | Miyamoto et al. | |

FOREIGN PATENT DOCUMENTS

| | | |
|---|---|---|
| JP | 2000-208018 A | 7/2000 |
| JP | 2005-309416 A | 11/2005 |
| JP | 2006-175564 A | 7/2006 |
| JP | 2007-293331 A | 11/2007 |
| JP | 2012-531122 | 12/2012 |
| JP | 2014-523659 | 9/2014 |
| KR | 2012-0039645 A | 4/2012 |
| KR | 2014-0030278 A | 3/2014 |
| TW | 201119225 | 6/2011 |
| WO | WO-2010/148405 | 12/2010 |
| WO | WO-2012/166941 | 12/2012 |

OTHER PUBLICATIONS

Written Opinion (Application No. PCT/IB2015/058052) dated Jan. 19, 2016.

* cited by examiner

1300

FIG. 13A1
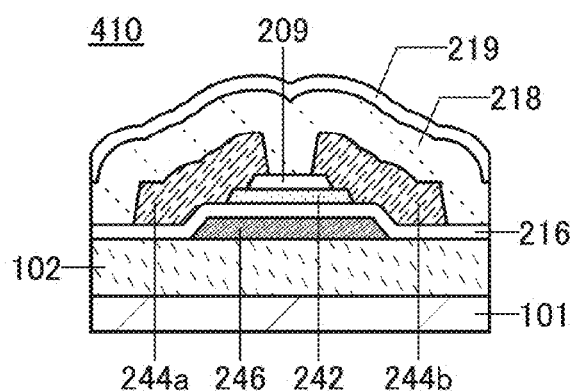
FIG. 13A2
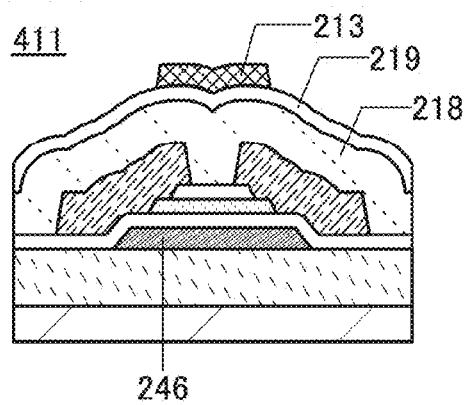
FIG. 13B1
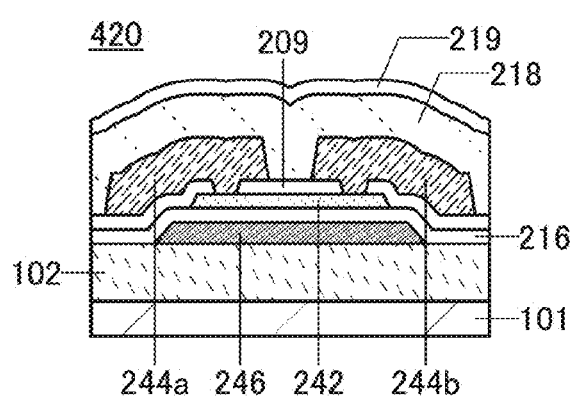
FIG. 13B2
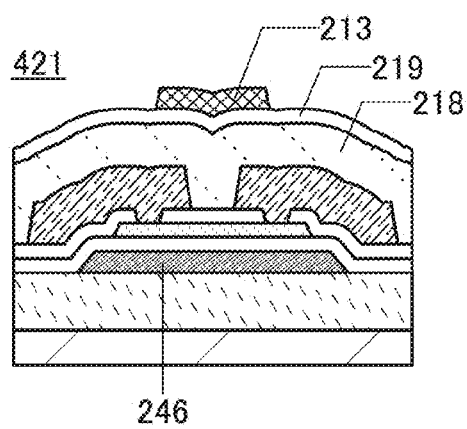

FIG. 14A1
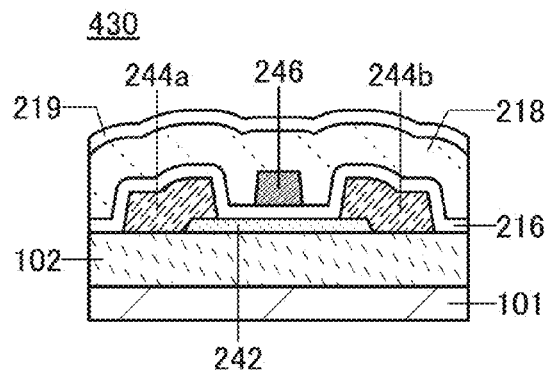
FIG. 14A2
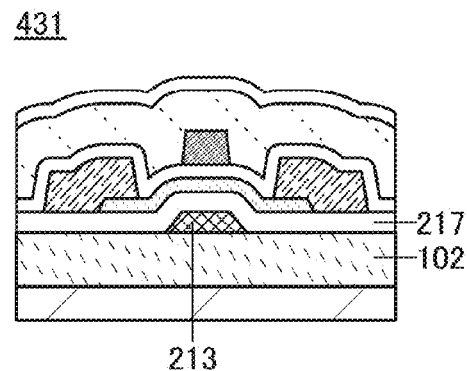
FIG. 14A3
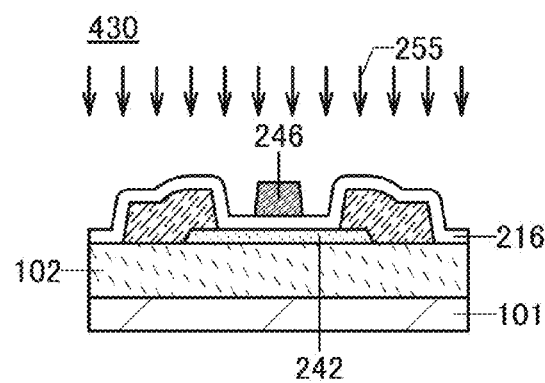
FIG. 14B1
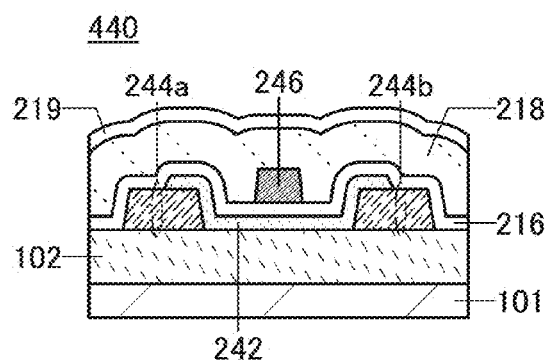
FIG. 14B2
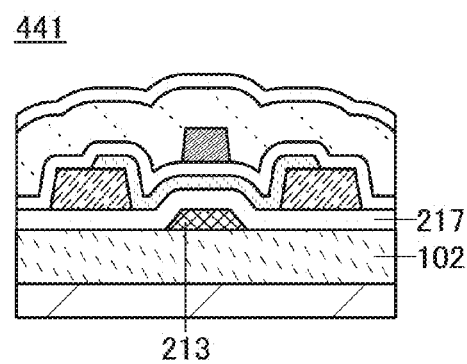

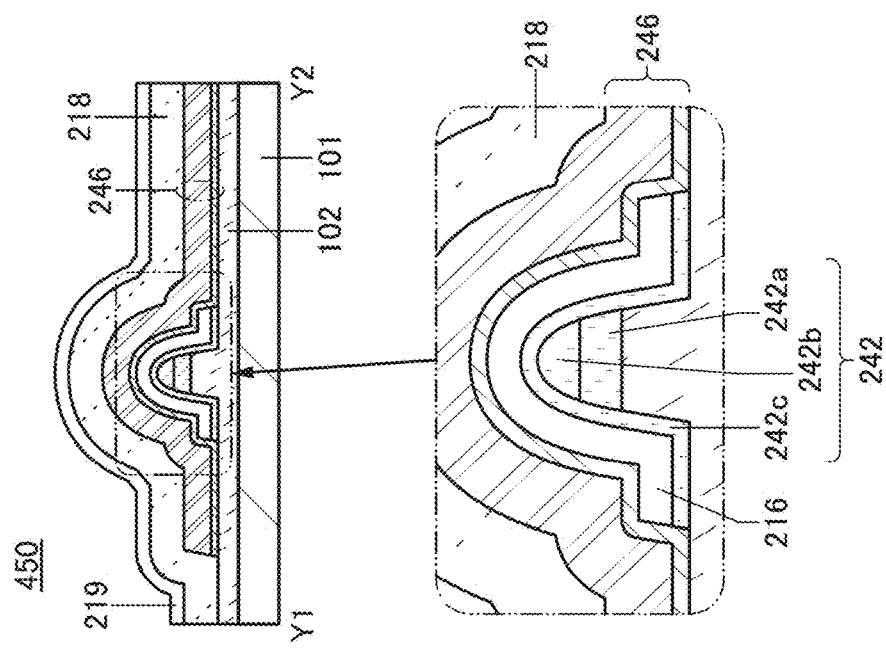
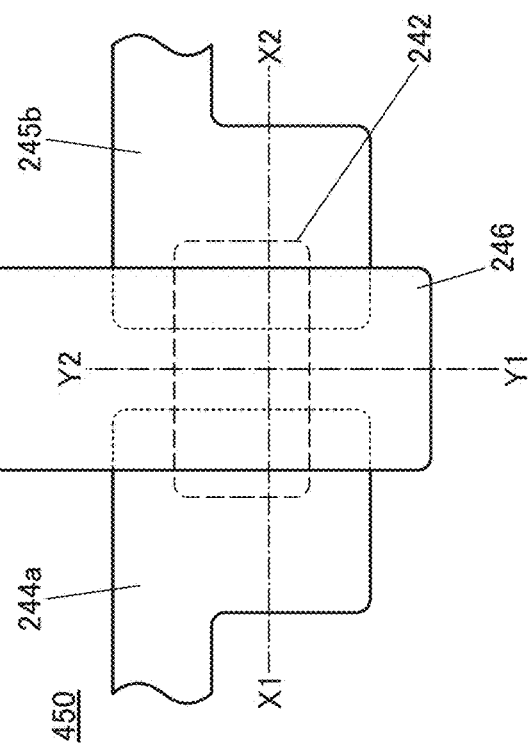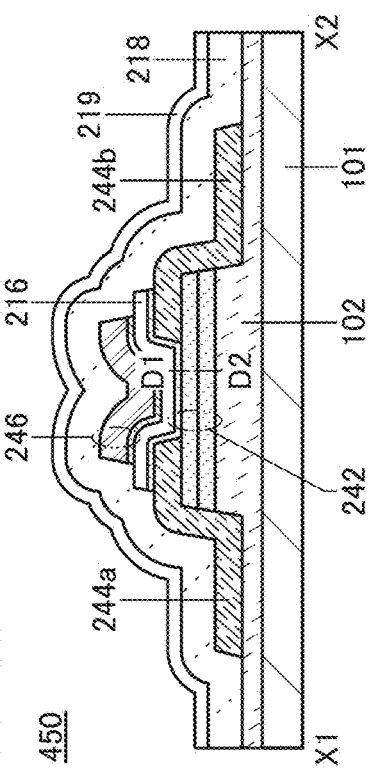

DISPLAY ELEMENT, DISPLAY DEVICE, OR ELECTRONIC DEVICE

TECHNICAL FIELD

One embodiment of the present invention relates to a semiconductor device. Alternatively, one embodiment of the present invention relates to a method for manufacturing the semiconductor device.

Note that one embodiment of the present invention is not limited to the above technical field. For example, one embodiment of the present invention relates to an object, a method, or a manufacturing method. Alternatively, the present invention relates to a process, a machine, manufacture, or a composition of matter. Alternatively, one embodiment of the present invention relates to a micromachine, a display element, a display device, or an electronic device.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like include a semiconductor element or a semiconductor circuit in some cases. Thus, a display device, a light-emitting device, a lighting device, an electro-optical device, an imaging device, an electronic device, and the like include a semiconductor device in some cases.

BACKGROUND ART

A micromachine is also called MEMS (Micro Electro Mechanical System), MST (Micro System Technology), and the like and refers to a comprehensive system combining a mechanical microstructure and an electric circuit. Unlike general semiconductor elements, the above-described microstructure has a three-dimensional structure and is partly movable in many cases. The micromachine can have various functions of a sensor, an actuator, an inductor, a motor, a passive element such as a variable capacitor, a switch, an optical element, and the like.

Note that the aforementioned electric circuit is generally formed using a semiconductor element and can control the operation of the microstructure, or receive and process a weak signal output from the microstructure.

Furthermore, micromachines can be classified according to their manufacturing methods. For example, there are bulk micromachines in which microstructures are manufactured using crystal anisotropy of a silicon substrate, and surface micromachines in which thin films are stacked over various substrates to manufacture three-dimensional microstructures (see Patent Document 1). In particular, the surface micromachines have attracted attention because a microstructure and an electric circuit can be formed over one substrate.

Furthermore, micromachines functioning as actuators can be classified according to their driving mechanism, e.g., into electrostatic, piezoelectric, electromagnetic, and thermal actuators. In particular, micromachines functioning as electrostatic actuators are easily fabricated and have high reliability because they can be manufactured by typical semiconductor processes.

Furthermore, electrostatic actuators can be classified into parallel-plate types, cantilever types, comb-drive types, rotational types, and the like. A display device using a DMD (Digital Micromirror Device) is known as an example of the parallel-plate electrostatic actuators. The display device using a DMD uses neither polarizers nor color filters, and therefore, has high light use efficiency. Hence, the display device using a DMD is said to be capable of displaying high-contrast, high-quality images.

PRIOR ART DOCUMENT

Patent Document

[Patent Document 1] Japanese Published Patent Application No. 2000-208018

SUMMARY OF THE INVENTION

Problems to be Solved by the Invention

Meanwhile, a voltage as high as approximately 20 V to 30 V is necessary to drive a micromachine functioning as an electrostatic actuator. In addition, a semiconductor element such as a transistor is generally used to drive the micromachine. A transistor formed using an inorganic semiconductor material such as single crystal silicon is easily microfabricated but is difficult to have an improved withstand voltage and a lower off-state current. This makes it difficult to improve the reliability and reduce the power consumption of a micromachine driven with the transistor.

An object of one embodiment of the present invention is to provide a highly reliable semiconductor device, micromachine, display element, display device, electronic device, or the like. Another object of one embodiment of the present invention is to provide a lower power consumption semiconductor device, micromachine, display element, display device, electronic device, or the like.

Another object of one embodiment of the present invention is to provide a high display quality semiconductor device, micromachine, display element, display device, electronic device, or the like. Another object of one embodiment of the present invention is to provide a highly productive semiconductor device, micromachine, display element, display device, electronic device, or the like. Another object of one embodiment of the present invention is to provide a novel semiconductor device, a novel micromachine, a novel display element, a novel display device, a novel electronic device, or the like.

Note that the description of these objects does not preclude the existence of other objects. Note that one embodiment of the present invention does not necessarily achieve all these objects. Other objects are apparent from and can be derived from the description of the specification, the drawings, the claims, and the like.

Means for Solving the Problems

One embodiment of the present invention is a display element which includes first to fourth wirings, first to fourth transistors, and first to third electrodes, and which is characterized in that at least one of the first to fourth transistors includes an oxide semiconductor, one of a source and a drain of the first transistor is electrically connected to the first wiring, the other of the source and the drain of the first transistor is electrically connected to a first node, a gate of the first transistor is electrically connected to the second wiring, one of a source and a drain of the second transistor is electrically connected to the second wiring, the other of the source and the drain of the second transistor is electrically connected to a second node, a gate of the second transistor is electrically connected to the second wiring, one of a source and a drain of the third transistor is electrically connected to the first node, the other of the source and the drain of the third transistor is electrically connected to the fourth wiring, a gate of the third transistor is electrically connected to the second node, one of a source and a drain of the fourth transistor is electrically connected to the second node, the other of the source and the drain of the fourth transistor is electrically connected to the fourth wiring, a gate of the fourth transistor is electrically connected to the first node, the first electrode is electrically connected to the first node, the second electrode is electrically connected to the second node, and the third electrode has a function of tilting in accordance with signals supplied to the first electrode and the second electrode.

At least one of the first to fourth transistors preferably includes a back gate electrode.

The first electrode and the second electrode can function as fixed electrodes. In contrast, the third electrode can function as a movable electrode.

Effect of the Invention

According to one embodiment of the present invention, a high display quality semiconductor device, micromachine, display element, display device, electronic device, or the like can be provided. According to another embodiment of the present invention, a highly productive semiconductor device, micromachine, display element, display device, electronic device, or the like can be provided. According to another embodiment of the present invention, a novel semiconductor device, a novel micromachine, a novel display element, a novel display device, a novel electronic device, or the like can be provided.

Note that the description of these effects does not preclude the existence of other effects. Note that one embodiment of the present invention does not necessarily have all these effects. Note that other effects will be apparent from and can be derived from the description of the specification, the drawings, the claims, and the like.

MODE FOR CARRYING OUT THE INVENTION

Figure 1B:
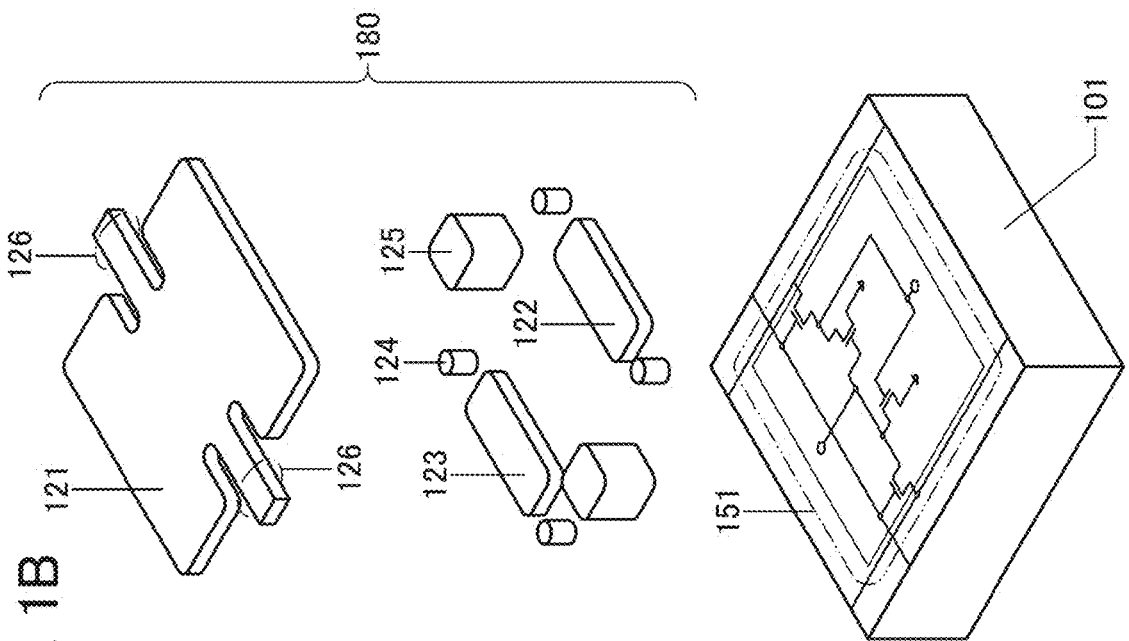
FIG. 1 Perspective views illustrating one mode of a micromachine

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and the description thereof is not repeated in some cases.

Furthermore, the position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which might not be illustrated for easy understanding.

Furthermore, in a top view (also referred to as a plan view), a perspective view, or the like, some components might not be illustrated for easy understanding.

Furthermore, in this specification and the like, the term "electrode" or "wiring" does not limit a function of a component. For example, an "electrode" is used as part of a "wiring" in some cases, and vice versa. In addition, the term "electrode" or "wiring" can also mean a combination of a plurality of "electrodes" and "wirings" formed in an integrated manner.

Note that the term "over" or "under" in this specification and the like does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, for example, when a transistor having opposite polarity is employed or the direction of current flow is changed in circuit operation. Thus, it is difficult to define which is a source or a drain. Accordingly, the terms source and drain can be switched in this specification.

Furthermore, in this specification and the like, the expression "electrically connected" includes the case where components are connected through an "object having any electric function". Here, there is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

Furthermore, in this specification and the like, the term "parallel" indicates that, for example, the angle formed between two straight lines is greater than or equal to −100 and less than or equal to 100, and accordingly also includes the case where the angle is greater than or equal to −5° and less than or equal to 50. In addition, the term "perpendicular" and "orthogonal" indicate that, for example, the angle formed between two straight lines is greater than or equal to 80° and less than or equal to 1000, and accordingly also includes the case where the angle is greater than or equal to 85° and less than or equal to 950.

Note that in the specification and the like, the terms "identical", "the same", "equal", "uniform", and the like used in describing calculation values and actual measurement values allow for a margin of error of ±20% unless otherwise specified.

Also in this specification, when etching treatment is performed after a resist mask is formed, the resist mask is removed after the completion of the etching treatment, unless otherwise specified.

Furthermore, a voltage usually refers to a potential difference between a given potential and a reference potential (e.g., a ground potential (GND potential) or a source potential). Thus, a voltage can be referred to as a potential and vice versa.

Note that an impurity in a semiconductor refers to, for example, elements other than the main components of the semiconductor. For example, an element with a concentration lower than 0.1 atomic % can be regarded as an impurity. When containing an impurity, a semiconductor potentially has increased DOS (Density of State), decreased carrier mobility, decreased crystallinity, or the like. In the case where the semiconductor is an oxide semiconductor, examples of the impurity that changes the characteristics of the semiconductor include Group 1 elements, Group 2 elements, Group 13 elements, Group 14 elements, Group 15 elements, and transition metals other than the main components of the oxide semiconductor; specifically, for example, hydrogen (also included in water), lithium, sodium, silicon, boron, phosphorus, carbon, and nitrogen are given. In the case of an oxide semiconductor, oxygen vacancies are formed, for example, by entry of impurities such as hydrogen in some cases. In the case where the semiconductor is silicon, examples of the impurity that changes the characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. In addition, a term without an ordinal number in this specification and the like might be provided with an ordinal number in a claim in order to avoid confusion among components. Also, a term with an ordinal number in this specification and the like might be provided with a different ordinal number in a claim. Moreover, even when a term has an ordinal number in this specification and the like, the ordinal number might be omitted in a claim.

Note that a "channel length" refers to, for example, the distance, observed in a top view of a transistor, between a source (a source region or a source electrode) and a drain (a drain region or a drain electrode) in a region where a semiconductor (or a portion where a current flows in a semiconductor when the transistor is on) and a gate electrode overlap with each other or in a region where a channel is formed. Note that in one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

Note that in this specification and the like, an "on state" of a transistor refers to a state in which a source and a drain of the transistor are electrically short-circuited (also referred to as a "conductive state"). Furthermore, an "off state" of the transistor refers to a state in which the source and the drain of the transistor are electrically disconnected (also referred to as a "non-conductive state").

Also in this specification and the like, in some cases, an "on-state current" means a current that flows between a source and a drain when a transistor is on, and an "off-state current" means a current that flows between a source and a drain when a transistor is off.

Furthermore, the off-state current of a transistor depends on a voltage between a gate and a source (hereinafter, also referred to as "Vgs") in some cases. Thus, when there is Vgs with which the off-state current of the transistor is lower than or equal to I, it may be said that the off-state current of the transistor is lower than or equal to I. The off-state current of a transistor may also mean a current at a certain Vgs or at Vgs in a certain voltage range.

As an example, the assumption is made of an n-channel transistor where the threshold voltage Vth is 0.5 V and the current flowing between a source and a drain (hereinafter, also referred to as "Ids") is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The Ids of the transistor is $1\times10^{-19}$ A or lower at Vgs of −0.5 V or at Vgs in the range of −0.5 V to −0.8 V; therefore, it is sometimes said that the off-state current of the transistor is $1\times10^{-19}$ A or lower. Since there is Vgs at which the drain current of the transistor is $1\times10^{-22}$ A or lower, it is sometimes said that the off-state current of the transistor is $1\times10^{-22}$ A or lower.

Furthermore, the off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., any temperature in the range of 5° C. to 35° C.). When there is Vgs at which the off-state current of a transistor at room temperature, 60° C., 85° C., 95° C., 125° C., a temperature at which the reliability of a semiconductor device including the transistor is ensured, or a temperature at which the semiconductor device or the like including the transistor is used (e.g., any temperature in the range of 5° C. to 35° C.) is lower than or equal to I, it may be said that the off-state current of the transistor is lower than or equal to I.

The off-state current of a transistor depends on voltage between its drain and source (hereinafter, also referred to as Vds) in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured or Vds used in the semiconductor device or the like including the transistor. When there is Vgs at which the off-state current of a transistor at Vds of 0.1 V, 0.8 V, 1 V, 1.2 V, 1.8 V, 2.5 V, 3 V, 3.3 V, 10 V, 12 V, 16 V, or 20 V, at Vds at which the reliability of a semiconductor device or the like including the transistor is ensured, or at Vds used in the semiconductor device or the like including the transistor is lower than or equal to I, it may be said that the off-state current of the transistor is lower than or equal to I.

Furthermore, a "channel width" refers to, for example, the length of a portion where a source and a drain face each other in a region where a semiconductor and a gate electrode overlap with each other (or a portion where a current flows in a semiconductor when a transistor is on), or in a region where a channel is formed. Note that in one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a transistor having a miniaturized, three-dimensional structure, the proportion of a channel region formed in a side surface of a semiconductor is higher than the proportion of a channel region formed in a top surface of the semiconductor in some cases. In that case, an effective channel width where the channel is actually formed is greater than an apparent channel width shown in the top view.

Note that in a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Thus, in this specification, an apparent channel width, which is the length of a portion where a source and a drain face each other in a region where a semiconductor and a gate electrode overlap with each other in a top view of a transistor, is referred to as a "surrounded channel width (SCW)" in some cases. Also in this specification, the channel width may denote a surrounded channel width or an apparent channel width. Alternatively, in this specification, the channel width may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where a field-effect mobility, a current value per channel width, and the like of a transistor are obtained by calculation, a surrounded channel width may be used for the calculation. The value obtained in that case may be different from the one obtained by calculation using an effective channel width.

Embodiment 1

An example of a micromachine 100 is described with reference to FIG. 1 to FIG. 10. Note that in this specification and the like, an example of a parallel-plate electrostatic actuator is shown as the micromachine 100.

<Structure of Micromachine 100>

Figure 1A:
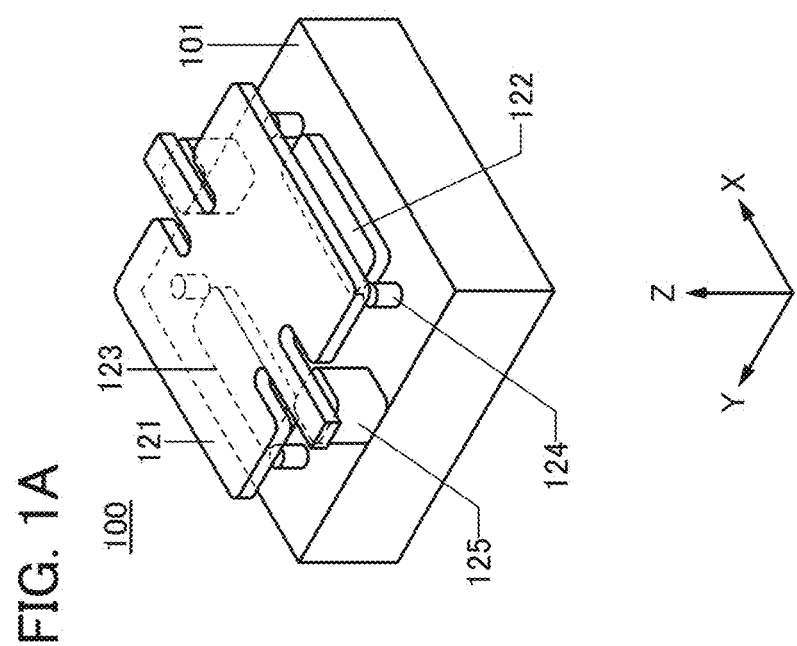
Figure 2A:
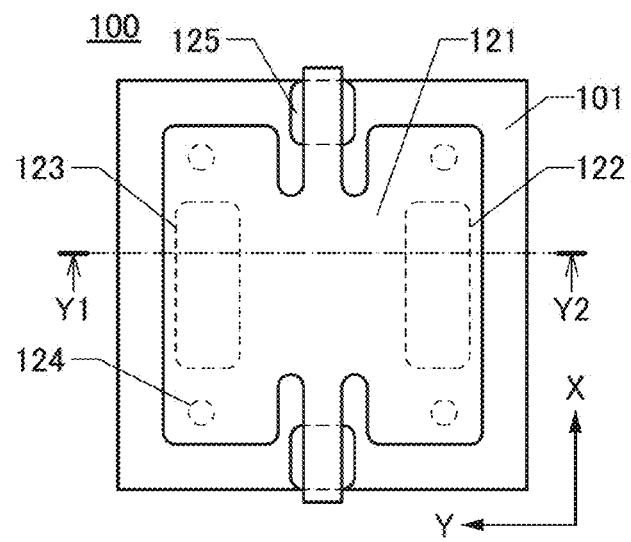
FIG. 2 A top view and side views illustrating one mode of a micromachine
Figure 2C:
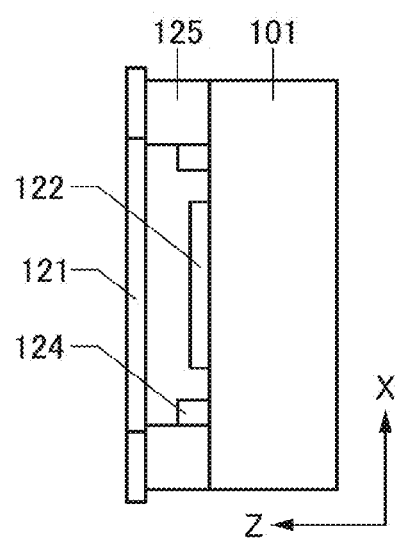
Figure 2B:
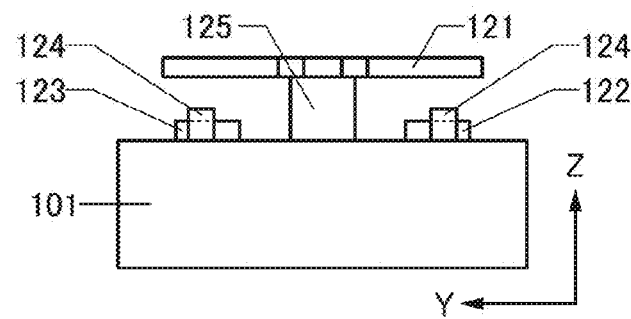

FIG. 1(A) and FIG. 1(B) are perspective views illustrating an example of the micromachine 100. Note that FIG. 1(A) shows arrows indicating the X-axis direction, the Y-axis direction, and the Z-axis direction, which are perpendicular to one another. FIG. 2(A) is a top view of the micromachine 100. FIG. 2(B) is a side view of the micromachine 100 that is seen from the X-axis direction. FIG. 2(C) is a side view of the micromachine 100 that is seen from the Y-axis direction.

The micromachine 100 exemplified in this embodiment includes a structure body 180 that includes an electrode 121, an electrode 122, an electrode 123, a pillar 125, and a stopper 124, and a substrate 101 where a circuit 151 is provided. Furthermore, the electrodes 122 and 123, the pillar 125, and the stopper 124 are provided over the substrate 101. The electrode 121 includes supports 126, which are around the center of the Y-axis direction and extend in opposite directions along the X-axis direction. In addition, the electrode 121 has a function of reflecting light and can serve as a reflective electrode. The micromachine 100 exemplified in this embodiment includes two pillars 125 over the substrate 101. The two pillars 125 are connected to the respective supports 126. Furthermore, the pillars 125 have a function of supplying a potential to the electrode 121.

Figure 3A:
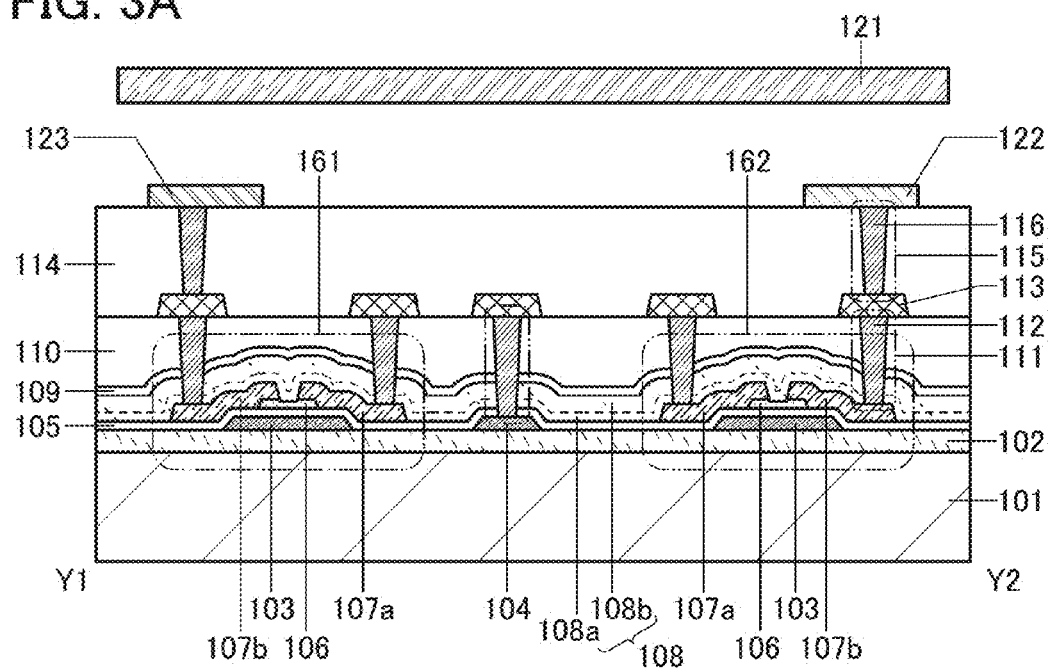
FIG. 3 Cross-sectional views illustrating one mode of a micromachine

FIG. 3(A) illustrates an example of a layered structure of the micromachine 100. FIG. 3(A) is a cross-sectional view of a portion taken along dashed-dotted line Y1-Y2 in FIG. 2(A). In FIG. 3(A), the micromachine 100 includes a transistor 161 and a transistor 162 over the substrate 101 with an insulating layer 102 positioned therebetween. Note that the transistors 161 and 162 each include an electrode 103 that can serve as a gate electrode, an insulating layer 105 that can serve as a gate insulating layer, a semiconductor layer 106 in which a channel is formed, an electrode 107a that can serve as one of a source electrode and a drain electrode, and an electrode 107b that can serve as the other of the source electrode and the drain electrode. The other transistors that are not illustrated also have a structure similar to that of the transistors 161 and 162.

Also in FIG. 3, the insulating layer 102 is over the substrate 101 and the electrode 103 and an electrode 104 are over the insulating layer 102. In addition, the insulating layer 105 is over the electrodes 103 and 104; the semiconductor layer 106 is over the insulating layer 105 and overlaps with the electrode 103; the electrodes 107a and 107b are over the insulating layer 105 and in contact with part of the semiconductor layer 106; an insulating layer 108 is over the electrodes 107a and 107b and the semiconductor layer 106; an insulating layer 109 is over the insulating layer 108; an insulating layer 110 is over the insulating layer 109; and an electrode 113 is over the insulating layer 110.

In addition, an opening 111, which is provided by removing part of the insulating layers 110, 109, and 108, overlaps with the electrode 107a or 107b. The electrode 113 is electrically connected to the electrode 107b of the transistor 162 through an electrode 112 provided in the opening 111.

In addition, an insulating layer 114 is over the insulating layer 110 and the electrode 113. The electrodes 122 and 123 are over the insulating layer 114. Furthermore, an opening 115, which is provided by removing part of the insulating layer 114, overlaps with the electrode 113. The electrode 122 is electrically connected to the electrode 113 through an electrode 116 provided in the opening 115; thus, the electrode 122 is electrically connected to the electrode 107b of the transistor 162. Similarly, the electrode 123 is electrically connected to the electrode 107b of the transistor 161.

Furthermore, the electrode 121 is over the electrodes 122 and 123 with a space therebetween.

[Substrate 101]

As the substrate 101, a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), a silicon on insulator (SOI) substrate, or the like can be used. Alternatively, a plastic substrate having heat resistance to the processing temperature of this embodiment may be used. Examples of the glass substrate include a barium borosilicate glass substrate, an aluminosilicate glass substrate, an aluminoborosilicate glass substrate, and a soda lime glass substrate. Alternatively, crystallized glass or the like may be used.

Alternatively, a flexible substrate, an attachment film, paper including a fibrous material, a base material film, or the like may be used as the substrate 101. Examples of the flexible substrate, the attachment film, the base material film, and the like are as follows. For example, plastics typified by polyethylene terephthalate (PET), polyethylene naphthalate (PEN), polyether sulfone (PES), and polytetrafluoroethylene (PTFE) can be given. Another example is a synthetic resin such as acrylic. Another example is polypropylene, polyester, polyvinyl fluoride, and polyvinyl chloride. Another example is polyamide, polyimide, aramid, epoxy, an inorganic vapor deposition film, and paper. Specifically, the use of semiconductor substrates, single crystal substrates, SOI substrates, and the like enables the manufacture of small-sized transistors with a small variation in characteristics, size, shape, or the like and with high current capability. A circuit using such transistors achieves lower power consumption or higher integration.

Alternatively, a flexible substrate may be used as the substrate, and the transistor or the micromachine may be formed directly on the flexible substrate. Still alternatively, a separation layer may be provided between the substrate and the transistor or the like. The separation layer can be used when part or the whole of a semiconductor device formed over the separation layer is separated from the substrate and transferred onto another substrate. In such a case, the transistor can be transferred to a substrate having low heat resistance or a flexible substrate. For the separation layer, for example, a stack of inorganic films, a tungsten film and a silicon oxide film, or an organic resin film of polyimide or the like formed over a substrate can be used.

That is, after at least one of a transistor and a micromachine is formed using a substrate, the at least one of the transistor and the micromachine may be transferred to another substrate so that the at least one of the transistor and the micromachine is arranged on the other substrate. Examples of the substrate to which at least one of the transistor and the micromachine is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. When such a substrate is used, a transistor with excellent characteristics or a transistor with low power consumption can be formed, a device with high durability or high heat resistance can be provided, or reduction in weight or thickness can be achieved.

[Insulating Layer 102]

The insulating layer 102 can be formed with a single layer or a stack of layers using a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, hafnium silicate, hafnium silicate to which nitrogen is added, and hafnium aluminate to which nitrogen is added. Alternatively, a material in which two or more materials selected from an oxide material, a nitride material, an oxynitride material, and a nitride oxide material are mixed may be used. The insulating layer 102 can be formed by a sputtering method, a CVD method, a thermal oxidation method, a coating method, a printing method, or the like.

Note that in this specification, a nitride oxide refers to a compound that includes more nitrogen than oxygen. An oxynitride refers to a compound that includes more oxygen than nitrogen. Note that the content of each element can be measured by Rutherford backscattering spectrometry (RBS), for example.

In the case where the insulating layer 102 is a stacked layer including a plurality of layers, the stacked layer may include a silicon nitride layer as a first layer and a silicon oxide layer as a second layer. In that case, the silicon oxide layer may be a silicon oxynitride layer. In addition, the silicon nitride layer may be a silicon nitride oxide layer.

Furthermore, the insulating layer 102 is preferably formed using an insulating material that does not easily transmit oxygen and impurities such as hydrogen, water, an alkali metal, and an alkaline earth metal. Examples of the insulating material include insulating oxide materials such as aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, and tantalum oxide. The insulating layer 102 formed using the above material can prevent or reduce impurity diffusion from the substrate 101 side to the transistor. The insulating layer 102 can function as a base layer.

An insulating layer that contains oxygen at a higher proportion than oxygen in the stoichiometric composition, which is described later, may be used as the insulating layer 102. In the case where a silicon oxide layer, a silicon oxynitride layer, or a silicon nitride oxide layer is formed as the insulating layer 102, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

Furthermore, the surface of the insulating layer 102 may be subjected to chemical mechanical polishing (CMP) treatment (hereinafter, also referred to as CMP treatment). By the CMP treatment, unevenness of the sample surface can be reduced, and coverage with an insulating layer or a conductive layer formed later can be increased.

[Electrodes 103 and 104]

As a conductive material for forming the electrodes 103 and 104 (including other electrodes and wirings formed using the same layer as the electrodes 103 and 104), a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor having a high electric conductivity, which is typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The gate electrode 206 may have a single-layer structure or a stacked-layer structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, an alloy film or a nitride film that contains aluminum and one or more elements selected from titanium, tantalum, tungsten, molybdenum, chromium, neodymium, and scandium may be used.

Alternatively, the electrodes 103 and 104 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, a stacked structure of a layer containing the light-transmitting conductive material and a layer containing the above metal element may be employed.

For example, the electrodes 103 and 104 can be formed in the following manner. First, a conductive layer to be the electrodes 103 and 104 is formed over the insulating layer 102 by a sputtering method, a CVD method, an evaporation method, or the like, and a resist mask is formed over the conductive layer. The resist mask can be formed by a photolithography method, a printing method, an inkjet method, or the like as appropriate. Formation of the resist mask by an inkjet method needs no photomask; thus, manufacturing cost can be reduced. Next, part of the conductive layer to be the electrodes 103 and 104 is etched using the resist mask, and then the resist mask is removed; thus, the electrodes 103 and 104 are formed. In that case, other wirings and electrodes can be formed at the same time.

The etching of the conductive layer may be performed by a dry etching method, a wet etching method, or both of them. Note that in the case where the conductive layer is etched by a dry etching method, ashing treatment may be performed before the resist mask is removed, whereby the resist mask can be easily removed using a stripper. After the etching of the conductive layer, the resist mask is removed.

Note that instead of the above formation method, the electrodes 103 and 104 may be formed by an electrolytic plating method, a printing method, an ink-jet method, or the like.

Note that the CVD method can be typically classified into a plasma enhanced CVD (PECVD) method using plasma, a thermal CVD (TCVD) method using heat, and the like. The CVD method can be further classified into a metal CVD (MCVD) method, a metal organic CVD (MOCVD) method, and the like according to a source gas to be used.

Furthermore, the evaporation method can be typically classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using the PECVD method, a high-quality film can be formed at a relatively low temperature. By using a deposition method that does not use plasma for deposition, such as the MOCVD method or the evaporation method, a film can be formed with few defects because damage is not easily caused on a surface on which the film is deposited.

[Insulating Layer 105]

The insulating layer 105 can be formed with a material and a method similar to those of the insulating layer 102. The insulating layer 105 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose density of a spin corresponding to a signal with a g factor of 2.001 in electron spin resonance (ESR) is less than or equal to $3\times10^{17}$ spins/cm$^3$, preferably less than or equal to $5\times10^{16}$ spins/cm$^3$ is used. As the silicon oxide layer, a silicon oxide layer containing excess oxygen is preferably used. As the silicon nitride layer, a silicon nitride layer from which hydrogen and ammonia are less likely to be released is preferably used. The amount of discharge of hydrogen or ammonia may be measured by TDS.

A capacitor typically has such a structure that a dielectric is sandwiched between two electrodes that face each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, because of a tunnel effect or the like, a current unintentionally flowing between the two electrodes (hereinafter, also referred to as a "leakage current") tends to increase and the withstand voltage of the capacitor tends to be lower.

A portion where a gate electrode, a gate insulating layer, and a semiconductor layer of a transistor overlap with each other functions as a capacitor (hereinafter, also referred to as a "gate capacitor"). A channel is formed in a region in the semiconductor layer, which overlaps with the gate electrode with the gate insulating layer provided therebetween. That is, the gate electrode and the channel formation region function as two electrodes of the capacitor, and the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as hafnium silicate ($HfSi_xO_y$(x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used for the insulating layer 105, even if the thickness of the insulating layer 105 is made thick, sufficient capacitance between the insulating layer 105 and the semiconductor layer 106 can be ensured.

For example, in the case where a high-k material with a high dielectric constant is used for the insulating layer 105, even when the insulating layer 105 is made thick, a capacitance similar to that in the case of using silicon oxide for the insulating layer 105 can be obtained. This enables a reduction in leakage current between the electrode 103 and the semiconductor layer 106. Furthermore, a leakage current between the electrode 103 or a wiring formed using the same layer as the electrode 103 and another wiring that overlaps with the wiring can also be reduced. The insulating layer 105 may have a stacked-layer structure of the high-k material and another insulating material.

In the case where an oxide semiconductor is used for the semiconductor layer 106, the hydrogen concentration in the insulating layer 105 is preferably lowered in order to prevent an increase in hydrogen concentration in the oxide semiconductor. Specifically, in the insulating layer 105, the hydrogen concentration measured by secondary ion mass spectrometry (SIMS) is $2\times10^{20}$ atoms/cm$^3$ or lower, preferably $5\times10^{19}$ atoms/cm$^3$ or lower, further preferably $1\times10^{19}$ atoms/cm$^3$ or lower, and still further preferably $5\times10^{18}$ atoms/cm$^3$ or lower. Furthermore, the nitrogen concentration in at least part of the insulating layer 105 that is in contact with or adjacent to the semiconductor layer 106 is preferably lowered in order to prevent an increase in nitrogen concentration in the oxide semiconductor. Specifically, the nitrogen concentration in the insulating layer, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Note that the concentration measured by SIMS analysis may include a variation within a range of ±40%.

Furthermore, in the case where an oxide semiconductor is used for the semiconductor layer 106, an insulating layer containing oxygen or an insulating layer containing oxygen at a higher proportion than oxygen in the stoichiometric composition is preferably used for the insulating layer 105. From the insulating layer containing oxygen at a higher proportion than oxygen in the stoichiometric composition, part of oxygen is released by heating. The insulating layer containing oxygen at a higher proportion than oxygen in the stoichiometric composition is an insulating layer of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis in which heat treatment is performed so that the surface temperature of the insulating layer is higher than or equal to 100° C. and lower than or equal to 700° C., preferably higher than or equal to 100° C. and lower than or equal to 500° C.

The insulating layer that contains oxygen at a higher proportion than oxygen in the stoichiometric composition (hereinafter, also referred to as an "insulating layer containing excess oxygen") can also be formed through treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. Note that in this specification, the treatment for adding oxygen is also referred to as "oxygen doping treatment". In addition, in the case where oxygen doping treatment is performed on an insulating layer or a semiconductor layer, the insulating layer or the semiconductor layer is preferably heated during oxygen doping treatment because damage in oxygen doping treatment can be reduced.

Furthermore, in the case where an oxide semiconductor is used for the semiconductor layer 106, not only the insulating layer 105 but also the insulating layer in contact with the semiconductor layer 106 preferably contains oxygen. In particular, an insulating layer containing excess oxygen is preferably used.

[Semiconductor Layer 106]

The semiconductor layer 106 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

Furthermore, in the case where an organic semiconductor is used for the semiconductor layer 106, a low molecular organic material having an aromatic ring, a ni-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

In addition, since an oxide semiconductor has a band gap of 2 eV or more, a transistor including an oxide semiconductor in a semiconductor layer in which a channel is formed has an extremely low leakage current (also referred to as "off-state current") when the transistor is off. Specifically, the off-state current per micrometer of channel width at room temperature can be lower than $1\times10^{-20}$ A, preferably lower than $1\times10^{-22}$ A, and further preferably lower than $1\times10^{-24}$ A. Thus, a transistor with low power consumption can be provided. Furthermore, a semiconductor device or the like with low power consumption can be provided.

In addition, an OS transistor has high withstand voltage between its source and drain. Thus, a transistor with high reliability can be provided. Furthermore, a semiconductor device or the like with high reliability can be provided.

Furthermore, in the case where the semiconductor layer 106 is formed using an oxide semiconductor, heat treatment is preferably performed on the semiconductor layer 106 so that impurities such as moisture and hydrogen in the semiconductor layer 106 are reduced (the semiconductor layer 106 is dehydrated or dehydrogenated) to purify the oxide semiconductor used for the semiconductor layer 106. For example, the semiconductor layer 106 is subjected to heat treatment in a reduced-pressure atmosphere, an inert gas atmosphere of nitrogen, a rare gas, or the like, an oxidation atmosphere, or an ultra-dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

The heat treatment is performed at a temperature higher than or equal to 250° C. and lower than or equal to 650° C., preferably higher than or equal to 300° C. and lower than or equal to 500° C. The treatment time is 3 minutes to 24 hours. Heat treatment for over 24 hours is not preferable because the productivity is reduced.

There is no particular limitation on a heat treatment apparatus used for the heat treatment, and the apparatus may be provided with a device for heating an object to be processed by heat radiation or heat conduction from a heating element such as a resistance heating element. For example, an electric furnace or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

The heat treatment enables impurities such as hydrogen (water or a compound having a hydroxyl group) to be released from the oxide semiconductor used for the semiconductor layer 106. Thus, the impurities in the oxide semiconductor can be reduced, so that the oxide semiconductor used for the semiconductor layer 106 can be highly purified. Furthermore, in particular, hydrogen serving as an unstable carrier source can be detached from the semiconductor layer 106; thus, the negative shift of the threshold voltage of the transistor can be prevented, and the reliability of the transistor can be improved.

By heat treatment performed in an atmosphere containing an oxidation gas, oxygen vacancies in the oxide semiconductor used for the semiconductor layer 106 can be reduced at the same time as the release of the impurities. Alternatively, after heat treatment is performed in an inert gas atmosphere, another heat treatment may be performed in an atmosphere containing an oxidizing gas at 10 ppm or more, 1% or more, or 10% or more in order to compensate desorbed oxygen. Alternatively, after heat treatment is performed in an inert gas atmosphere, another heat treatment may be successively performed in the atmosphere that is switched to an atmosphere containing an oxidizing gas at 10 ppm or more, 1% or more, or 10% or more.

In the formation of the oxide semiconductor layer with the sputtering apparatus, increasing the purity of the sputtering gas is necessary. For example, as an oxygen gas or an argon gas used for a sputtering gas, a gas that is highly purified to have a dew point of −40° C. or lower, preferably −80° C. or lower, further preferably −100° C. or lower, and still further preferably −120° C. or lower is used, whereby entry of moisture or the like into the oxide semiconductor layer can be minimized. Furthermore, a chamber in the sputtering apparatus is preferably subjected to high vacuum evacuation (to a vacuum of about $5\times10^{-7}$ Pa to $1\times10^{-4}$ Pa) with use of a suction vacuum evacuation pump such as a cryopump so that water or the like, which is an impurity for the oxide semiconductor layer, is removed as much as possible. Alternatively, a turbo molecular pump and a cold trap are preferably combined to prevent a backflow of a gas, especially a gas containing carbon or hydrogen from an exhaust system to the inside of the chamber.

In addition, the heat treatment may be performed at any time after the oxide semiconductor for forming the semiconductor layer 106 is formed. Furthermore, the heat treatment may be performed more than once. For example, the heat treatment may be performed before and/or after the oxide semiconductor layer is processed into the island-shaped semiconductor layer 106. The heat treatment can reduce oxygen vacancies in the semiconductor layer 106 by diffusing oxygen contained in the insulating layer 105 into the oxide semiconductor (the semiconductor layer 106). Furthermore, oxygen doping treatment may be performed before and/or after the oxide semiconductor layer is processed into the island-shaped semiconductor layer 106. The oxygen doping treatment may be performed before and/or after the heat treatment.

[Electrodes 107a and 107b]

The electrodes 107a and 107b (including another electrode or wiring that is formed using the same layer as these electrodes) can be formed with a material and a method similar to those of the electrodes 103 and 104. That is, the electrodes 107a and 107b can be formed by selectively etching a conductive layer for forming the electrodes 107a and 107b. At this time, part of the exposed semiconductor layer 106 is etched in some cases.

The electrodes 107a and 107b may have a single-layer structure or a stacked-layer structure of two or more layers. For example, a single-layer structure of an aluminum layer containing silicon, a two-layer structure in which an aluminum layer and a titanium layer are stacked, a two-layer structure in which a titanium nitride layer and a titanium layer are stacked, a two-layer structure in which a titanium nitride layer and a tungsten layer are stacked, a two-layer structure in which a tantalum nitride layer and a tungsten layer are stacked, a two-layer structure in which a tungsten layer and a copper layer are stacked, a three-layer structure in which a titanium layer, an aluminum layer, and a titanium layer are stacked in this order, and the like can be given. Alternatively, an alloy that contains aluminum and one or more elements selected from titanium, tantalum, tungsten, molybdenum, chromium, neodymium, and scandium may be used.

Note that in the case where an oxide semiconductor is used for the semiconductor layer 106, a material that is capable of removing oxygen from part of the semiconductor layer 106 to generate oxygen vacancies is preferably used for parts of the electrodes 107a and 107b that are in contact with at least the semiconductor layer 106. The carrier concentration in the regions of the semiconductor layer 106 in which oxygen vacancies are generated is increased, so that the regions become n-type regions (n$^+$ layers). Accordingly, the regions can function as a source region and a drain region. In the case where an oxide semiconductor is used for the semiconductor layer 106, examples of the material that is capable of removing oxygen from the semiconductor layer 106 to cause oxygen vacancies include tungsten and titanium.

In addition, the source region and the drain region formed in the semiconductor layer 106 can reduce the contact resistance between the semiconductor layer 106 and each of the electrodes 107a and 107b. Accordingly, the electrical characteristics of the transistor, such as the field-effect mobility and the threshold voltage, can be favorable.

[Insulating Layer 108]

The insulating layer 108 can be formed with a material and a method similar to those of the insulating layer 102. The insulating layer 108 may have a single-layer structure or a stacked-layer structure. Note that in the case where an oxide semiconductor is used for the semiconductor layer 106, an oxide material or an insulating material containing excess oxygen is preferably used for at least part of the insulating layer 108 that is in contact with the semiconductor layer 106. In particular, an oxide material containing excess oxygen is preferably used for the insulating layer 108.

FIG. 3 shows an example in which the insulating layer 108 includes an insulating layer 108a and an insulating layer 108b, which are stacked from the side closer to the semiconductor layer 106. The insulating layer 108a preferably contains more oxygen than the insulating layer 108b. In the case where an oxide semiconductor is used for the semiconductor layer 106, an insulating layer containing excess oxygen is preferably provided as the insulating layer 108a on the side closer to the semiconductor layer 106. Note that an insulating layer containing excess oxygen may be used for both of the insulating layers 108a and 108b.

[Insulating Layer 109]

The insulating layer 109 can be formed with a material and a method similar to those of the insulating layer 102. Furthermore, the insulating layer 109 is preferably formed using a material that has a function of preventing or reducing the diffusion of impurities into the transistor from the insulating layer 110 side. Note that the insulating layer 109 may be omitted if needed.

Note that in the case where an oxide semiconductor is used for the semiconductor layer 106, heat treatment may be performed before and/or after the insulating layer 109 is formed. The heat treatment can fill oxygen vacancies in the semiconductor layer 106 by diffusing oxygen contained in the insulating layer 108 into the semiconductor layer 106. Alternatively, oxygen vacancies in the semiconductor layer 106 can be filled by forming the insulating layer 109 while heating.

[Insulating Layer 110]

The insulating layer 110 can be formed with a material and a method similar to those of the insulating layer 102. For the insulating layer 110, a low-dielectric constant material (low-k material), a siloxane-based resin, BPSG (Boron Phosphorus Silicate Glass), PSG (Phosphorus Silicate Glass), silicon oxide to which carbon is added (SiOC), silicon oxide to which fluorine is added (SiOF), TEOS (Tetraethyl Orthosilicate), which is silicon oxide made from Si(OC$_2$H$_5$)$_4$, HSQ (Hydrogen Silsesquioxane), MSQ (Methyl Silsesquioxane), OSG (Organo Silicate Glass), an organic polymer-based material, or the like can be used.

Furthermore, an insulating layer having a flat surface is preferably used as the insulating layer 110. The use of the insulating layer having a flat surface as the insulating layer 110 can increase the coverage with an insulating layer or a conductive layer that is formed later.

Furthermore, the surface of the insulating layer 110 may be subjected to chemical mechanical polishing (CMP) treatment (hereinafter, also referred to as "CMP treatment"). By the CMP treatment, unevenness of the sample surface can be reduced, and coverage with an insulating layer or a conductive layer formed later can be increased.

Moreover, the opening 111 can be provided when a resist mask or the like is formed over the insulating layer 110 and part of each of the insulating layers 110, 109, and 108 is selectively etched.

[Electrode 112]

The electrode 112 can be formed when the opening 111 is filled with a conductive material. As the conductive material, for example, a conductive material with high embeddability, such as tungsten or polysilicon, can be used. In addition, although not illustrated, the side surface and the bottom surface of the material can be covered with a barrier layer (a diffusion prevention layer) such as a titanium layer, a titanium nitride layer, or a stack of these layers. In that case, the barrier film is regarded as part of the electrode 112. Note that the electrode 112 may be referred to as a "contact plug".

[Electrode 113]

The electrode 113 (including another electrode or wiring that is formed using the same layer as the electrode 113) can be formed with a material and a method similar to those of the electrodes 107a and 107b.

[Insulating Layer 114]

The insulating layer 114 can be formed with a material and a method similar to those of the insulating layer 110. Furthermore, the surface of the insulating layer 114 may be subjected to CMP treatment. Moreover, the opening 115 can be provided when a resist mask or the like is formed over the insulating layer 114 and part of the insulating layer 114 is selectively etched.

[Electrode 116]

The electrode 116 can be formed with a material and a method similar to those of the electrode 112. Note that the electrode 116 may be referred to as a "contact plug".

[Electrodes 121, 122, and 123, and Pillar 125]

The electrodes 121, 122, and 123, and the pillar 125, which are included in the structure body 180, can be formed using a material similar to that of the electrodes 107a and 107b. In addition, the structure body 180 can be formed by a method using a sacrificial layer, or the like.

The sacrificial layer can be formed using an organic resin such as polyimide or acrylic, an inorganic insulating film such as silicon oxide, silicon nitride, silicon oxynitride, or silicon nitride oxide, or the like. For example, the sacrificial layer is removed after the electrode 121 is formed over the electrodes 122 and 123, so that the structure body 180 can be fabricated. In addition, an insulating layer such as alumina, silicon oxide, silicon nitride, silicon oxynitride, silicon nitride oxide, or DLC (Diamond-Like Carbon) is preferably formed on the surface of the electrode 121, in which case deterioration over time of the structure body 180 can be reduced.

Modification Example 1

Figure 3B:
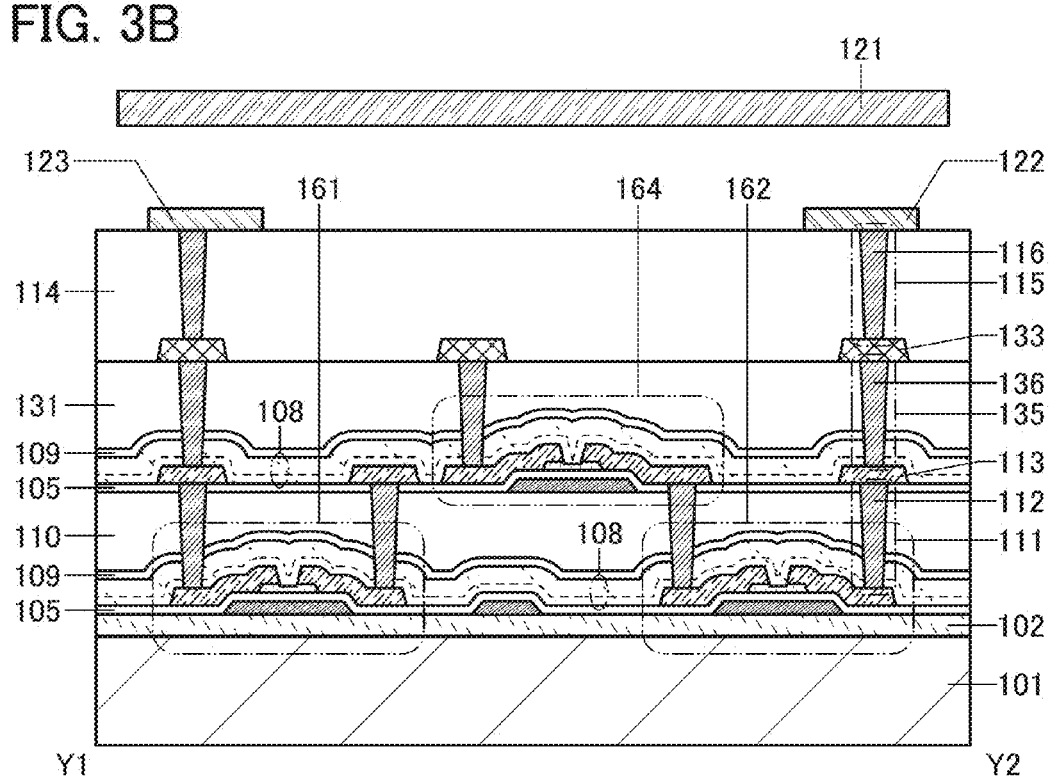

FIG. 3(B) shows a modification example of the micromachine 100 described with reference to FIG. 3(A). In the micromachine 100, another transistor may be further provided above the transistor. FIG. 3(B) shows an example in which a transistor 164, which is formed with a material and a method similar to those of the transistors 161 and 162, is provided over the insulating layer 110.

In FIG. 3(B), one of a source and a drain of the transistor 164 is electrically connected to one of the source and the drain of the transistor 162 through one of the electrodes 112 provided in the insulating layer 110. Furthermore, an insulating layer 131 is provided over the transistor 164 and an electrode 133 is provided over the insulating layer 131. Moreover, openings 135 are provided in the insulating layers 108, 109, and 131 over the electrode 113, and electrodes 136 are provided in the openings 135. The electrodes 133 are electrically connected to the electrodes 113 through the electrodes 136.

The insulating layer 131 can be formed with a material and a method similar to those of the insulating layer 110. Furthermore, the electrode 133 can be formed with a material and a method similar to those of the electrode 113. Moreover, the electrode 136 can be formed with a material and a method similar to those of the electrode 112. The opening 135 can be formed in a manner similar to that of the opening 111.

In addition, another transistor may be further provided above the transistor 164. Stacking transistors can reduce the area occupied by the circuit 151, allowing the manufacture of a more minute micromachine. Furthermore, a display element with higher resolution can be achieved by using that micromachine.

Modification Example 2

Figure 4:
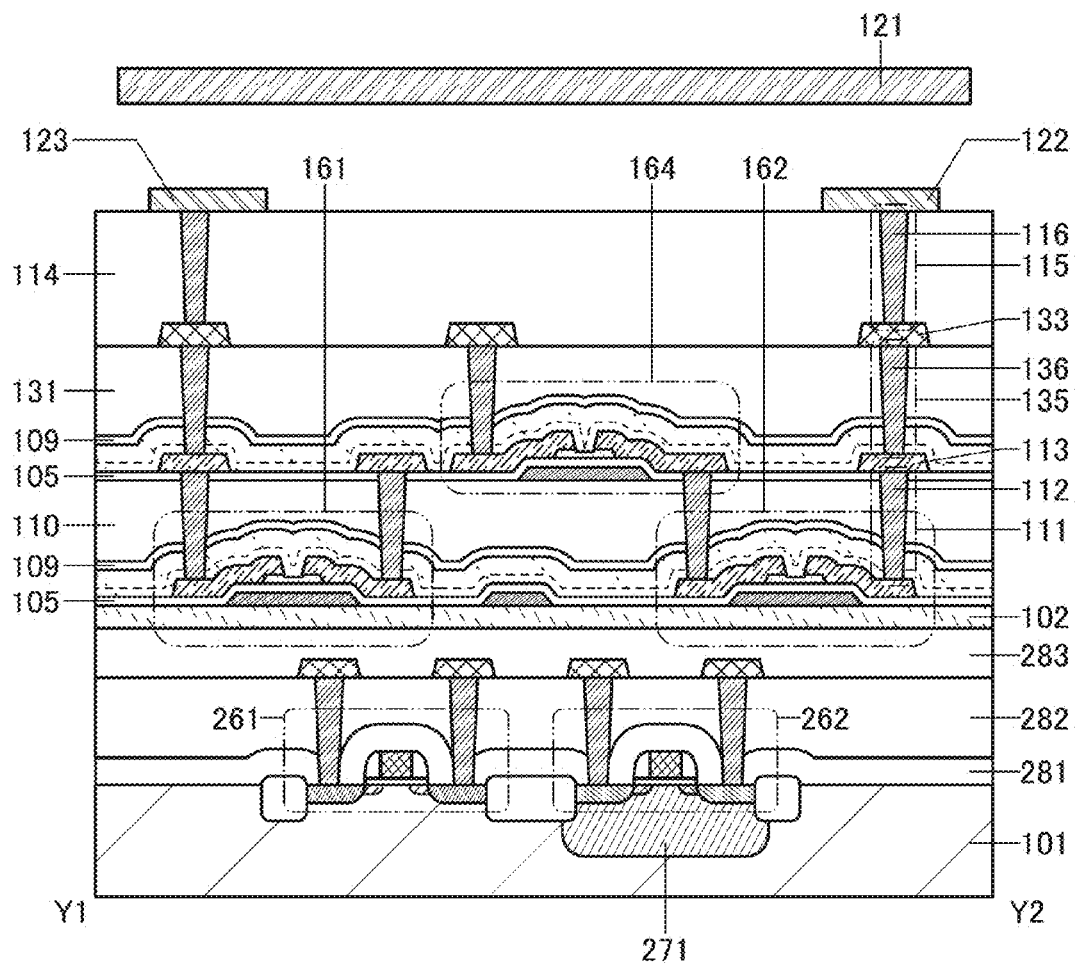
FIG. 4 A cross-sectional view illustrating one mode of a micromachine

FIG. 4 shows a modification example of the micromachine 100 that is different from the examples in FIG. 3(A) and FIG. 3(B). For example, in the case where a semiconductor substrate is used as the substrate 101, a transistor 261, a transistor 262, and the like, each of which includes a channel in part of the substrate 101, may be provided on the substrate 101 and the transistors 161 to 164 and the like may be provided thereabove.

For example, in the case where an n-type semiconductor substrate is used as the substrate 101, the p-channel transistor 261 may be provided on the substrate 101. Furthermore, a p-type impurity may be introduced into part of the substrate 101 to provide a well 271 functioning as a p-type semiconductor, and an n-channel transistor 262 may be provided on the well 271.

In addition, the transistors 261 and 262 formed on the substrate 101 (including other similarly formed transistors) may constitute a circuit by themselves, or they may be connected to at least one of the transistors 161 to 164 formed thereabove (including other similarly formed transistors) to constitute a circuit.

In FIG. 4, an insulating layer 281, an insulating layer 282, and an insulating layer 283 are provided over the transistors 261 and 262, and the insulating layer 102 is provided over the insulating layer 283. The insulating layers 281 to 283 can be formed with a material and a method similar to those of the insulating layer 102 or 110.

Stacking the transistors 161 to 164, the transistors 261 and 262, and the like can reduce the area occupied by the fabricated circuit.

Modification Example 3

Figure 5:
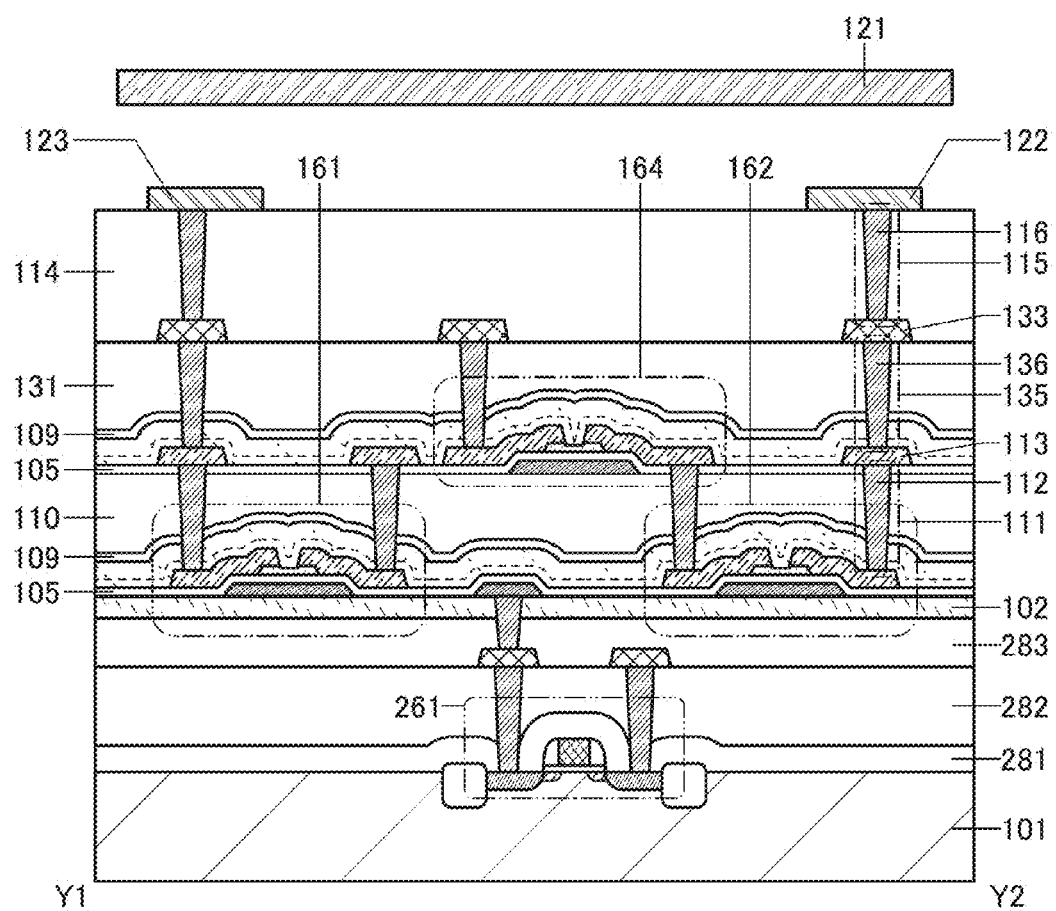
FIG. 5 A cross-sectional view illustrating one mode of a micromachine

Alternatively, as illustrated in FIG. 5, only one of a p-channel transistor and an n-channel transistor may be provided on the substrate 101 and a transistor provided thereabove may be used as a transistor with the other channel type.

For example, the p-channel transistor 261 may be provided on the substrate 101 and a transistor provided thereabove may be used as the n-channel transistor.

Providing only one of the p-channel transistor and the n-channel transistor on the substrate 101 can reduce the fabrication steps of the semiconductor device. This improves the productivity of the semiconductor device. In addition, the manufacturing costs of the semiconductor device can be reduced.

<Configuration of Circuit 151 and Operation of Micromachine 100>

Figure 6A:
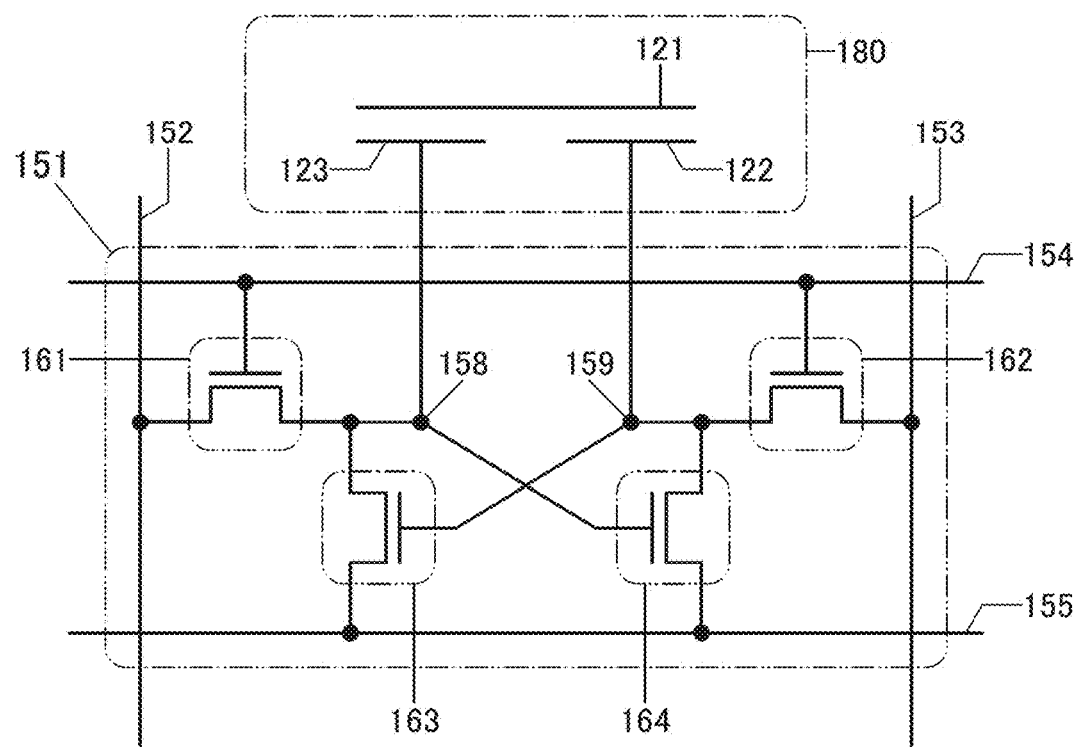
FIG. 6 A circuit diagram and a timing chart of one embodiment of the present invention FIG. 7 Perspective views illustrating operation of a micromachine FIG. 8 Circuit diagrams of one embodiment of the present invention FIG. 9 A circuit diagram of one embodiment of the present invention FIG. 10 Perspective views illustrating examples of a display element FIG. 11 Diagrams illustrating operation examples of a display device FIG. 12 A diagram illustrating an example of a structure body FIG. 13 Diagrams illustrating examples of semiconductor devices FIG. 14 Diagrams illustrating examples of semiconductor devices FIG. 15 Diagrams illustrating examples of a semiconductor device FIG. 16 Diagrams illustrating examples of a semiconductor device FIG. 17 Diagrams illustrating examples of a semiconductor device FIG. 18 Diagrams illustrating examples of a semiconductor device FIG. 19 Diagrams illustrating energy band structures FIG. 20 Cs-corrected high-resolution TEM images of a cross section of a CAAC-OS and a cross-sectional schematic view of the CAAC-OS FIG. 21 Cs-corrected high-resolution TEM images of a plane of a CAAC-OS FIG. 22 Graphs showing structural analysis of a CAAC-OS and a single crystal oxide semiconductor by XRD FIG. 23 Photographs showing electron diffraction patterns of a CAAC-OS FIG. 24 A graph showing a change of crystal parts in an In—Ga—Zn oxide owing to electron irradiation FIG. 25 Schematic views illustrating deposition models of a CAAC-OS and an nc-OS FIG. 26 Diagrams illustrating an InGaZnO$_4$ crystal and a pellet FIG. 27 Schematic views illustrating deposition models of a CAAC-OS FIG. 28 Views illustrating examples of electronic devices FIG. 29 Graphs showing the Id-Vg characteristics and drain withstand voltage of transistors FIG. 30 Graphs showing the Id-Vg characteristics and drain withstand voltage of transistors FIG. 31 Graphs showing the gate withstand voltage of transistors
Figure 6B:
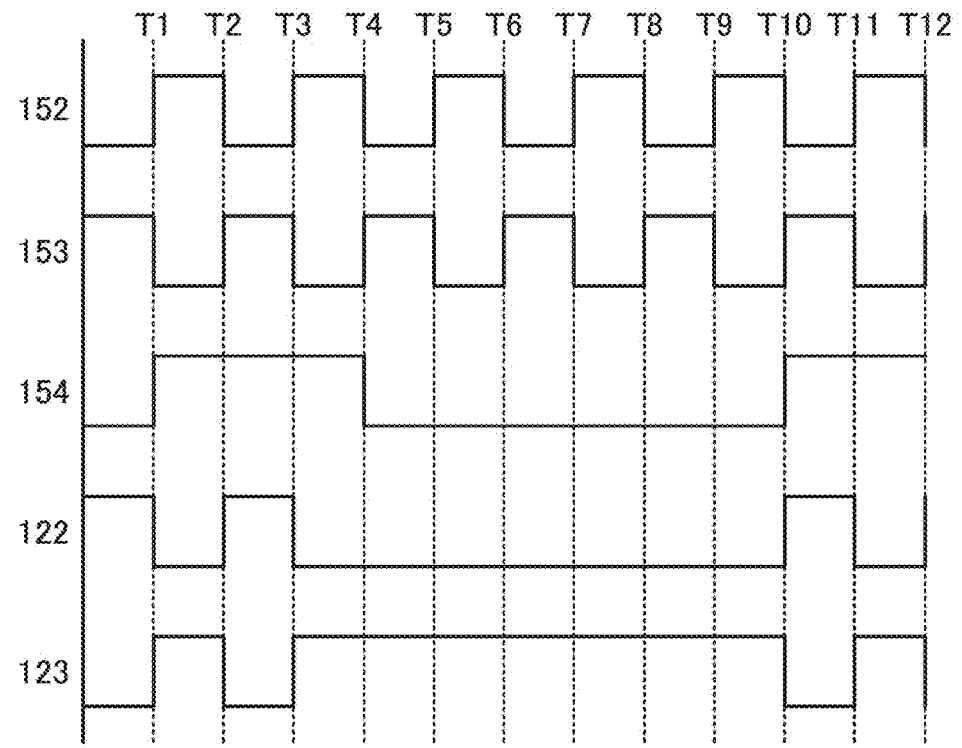
Figures 2, 7A:
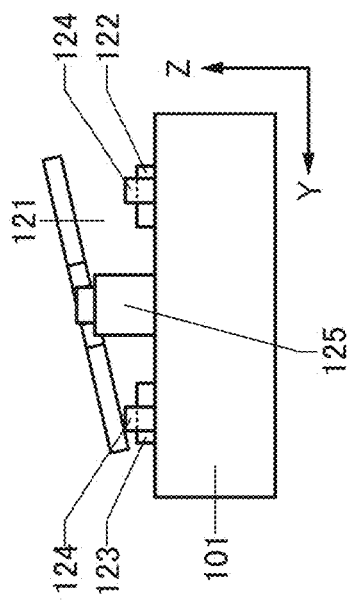
Figures 2, 7B:
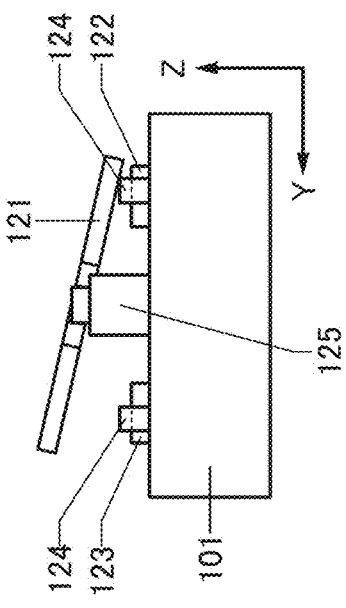
Figures 1, 7A:
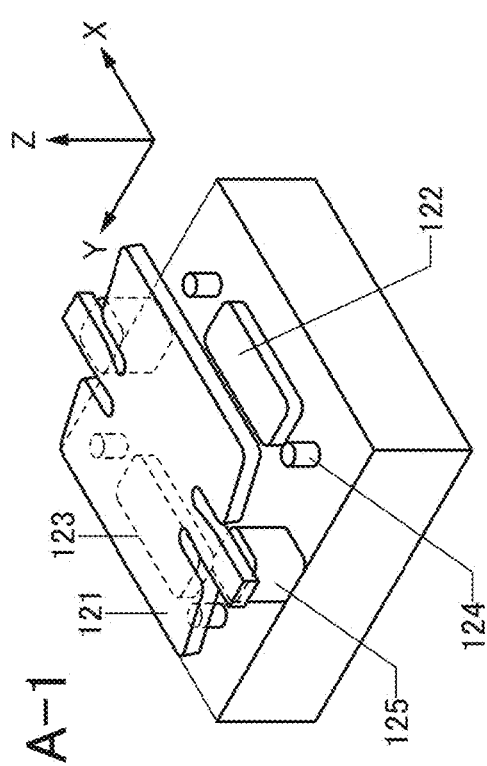
Figures 1, 7B:
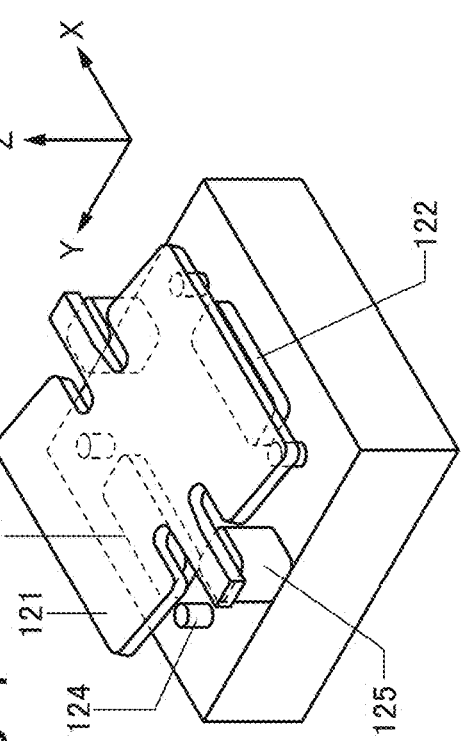

FIG. 6(A) illustrates a circuit diagram of the circuit 151. FIG. 6(B) is a timing chart for describing the operation of the circuit 151.

First, a circuit configuration of the circuit 151 exemplified in this embodiment is described with reference to FIG. 6(A). The circuit 151 exemplified in this embodiment includes the transistors 161 to 164. The transistors 161 to 164 are n-channel transistors.

One of a source and a drain of the transistor 161 is electrically connected to a wiring 152 and the other is electrically connected to a node 158. In addition, a gate of the transistor 161 is electrically connected to a wiring 154. One of a source and a drain of the transistor 162 is electrically connected to a wiring 153 and the other is electrically connected to a node 159. In addition, a gate of the transistor 162 is electrically connected to the wiring 154. Furthermore, one of a source and a drain of the transistor 163 is electrically connected to the node 158 and the other is electrically connected to a wiring 155. In addition, a gate of the transistor 163 is electrically connected to the node 159. Moreover, one of a source and a drain of the transistor 164 is electrically connected to the node 159 and the other is electrically connected to the wiring 155. Furthermore, a gate of the transistor 164 is electrically connected to the node 158.

In addition, the electrode 122 is electrically connected to the node 159, and the electrode 123 is electrically connected to the node 158.

[Operation of Micromachine 100]

Next, an operation example of the circuit 151 exemplified in this embodiment is described with reference to FIG. 6(B). An H potential or an L potential is supplied to the wirings 152, 153, and 154. In addition, an L potential is supplied to the wiring 155 and the electrode 121. Furthermore, different potentials are supplied to the wirings 152 and 153.

At Time T1, an H potential is supplied to the wiring 152, an L potential is supplied to the wiring 153, and a potential that turns on the transistors 161 and 162 is supplied to the wiring 154. Here, the potential that turns on the transistors 161 and 162 is the higher of the two potentials: a potential greater than or equal to the sum of the potential of the wiring 152 and the threshold voltage of the transistor 161, and a potential greater than or equal to the sum of the potential of the wiring 153 and the threshold voltage of the transistor 162.

When the transistors 161 and 162 are turned on, an H potential is supplied to the node 158 whereas an L potential is supplied to the node 159. Then, the transistor 164 is turned on and the transistor 163 is turned off. In addition, an H potential is supplied to the electrode 123 through the node 158, and an L potential is supplied to the electrode 122 through the node 159.

When an H potential and an L potential are supplied to the electrode 123 and the electrode 122, respectively, the electrode 121 is attracted to the electrode 123 by static electricity (Coulomb force), thereby tilting to the electrode 123 side. FIG. 7(A-1) shows a perspective view of the micromachine 100 in which the electrode 121 tilts to the electrode 123 side. In addition, a side view of the micromachine 100 that is seen from the X-axis direction is shown in FIG. 7(A-2).

The electrode 121 attracted to the electrode 123 tilts until touching the stopper 124. The stopper 124 can prevent a phenomenon (pull-in phenomenon) in which the electrode 123 is in contact with and sticks to the electrode 121.

At Time T2, an L potential is supplied to the wiring 152 whereas an H potential is supplied to the wiring 153; then, an L potential and an H potential are supplied to the electrode 123 and the electrode 122, respectively. Then, the electrode 121 is attracted to the electrode 122 by static electricity (Coulomb force), thereby tilting to the electrode 122 side. FIG. 7(B-1) shows a perspective view of the micromachine 100 in which the electrode 121 tilts to the electrode 122 side. In addition, a side view of the micromachine 100 that is seen from the X-axis direction is shown in FIG. 7(B-2).

The electrode 121 attracted to the electrode 122 tilts until touching the stopper 124. The stopper 124 can prevent a phenomenon in which the electrode 122 is in contact with and sticks to the electrode 121.

At Time T3, an H potential is supplied to the wiring 152 whereas an L potential is supplied to the wiring 153; then, the electrode 121 tilts to the electrode 123 side.

At Time T4, when a potential (e.g., an L potential) that turns off the transistors 161 and 162 is supplied to the wiring 154, the transistors 161 and 162 are turned off. When the transistors 161 and 162 are turned off, the supply of a potential from the wiring 152 to the node 158 and the supply of a potential from the wiring 153 to the node 159 are stopped. Hence, in a period (in FIG. 6B, a period from Time T4 to Time T10) during which the potential that turns off the transistors 161 and 162 is supplied to the wiring 154, the last potentials of the electrodes 122 and 123 are maintained.

When the potential that turns on the transistors 161 and 162 is supplied to the wiring 154 at Time T10, the electrode 121 can be turned around in accordance with signals (potentials) supplied from the wirings 152 and 153 (see Time T10 to Time T12).

In the micromachine 100, the electrode 121 is operated by utilizing static electricity, which requires a potential difference between the H potential and the L potential to be approximately 20 V or higher. Therefore, a transistor having high withstand voltage between its source and drain is preferably used as the transistors 161 to 164.

An oxide semiconductor has an energy gap as wide as 3.0 eV or more, and a transistor using the oxide semiconductor in a semiconductor layer where a channel is formed (hereinafter, also referred to as an "OS transistor") has high withstand voltage between its source and drain. Hence, the OS transistor is preferably used as the transistors 161 to 164. When the OS transistor is used as the transistors 161 to 164, the micromachine 100 with high durability and reliability can be provided.

Furthermore, the OS transistor has an extremely low off-state current. Therefore, when the OS transistor is used as at least one of the transistors 161 to 164, the micromachine 100 with low power consumption can be provided.

In addition, when the OS transistor, which has an extremely low off-state current, is used as the transistors 161 to 164, the H potential of the node 158 or 159 can be maintained for a long period when the transistors 161 and 162 are off.

Figure 8A:
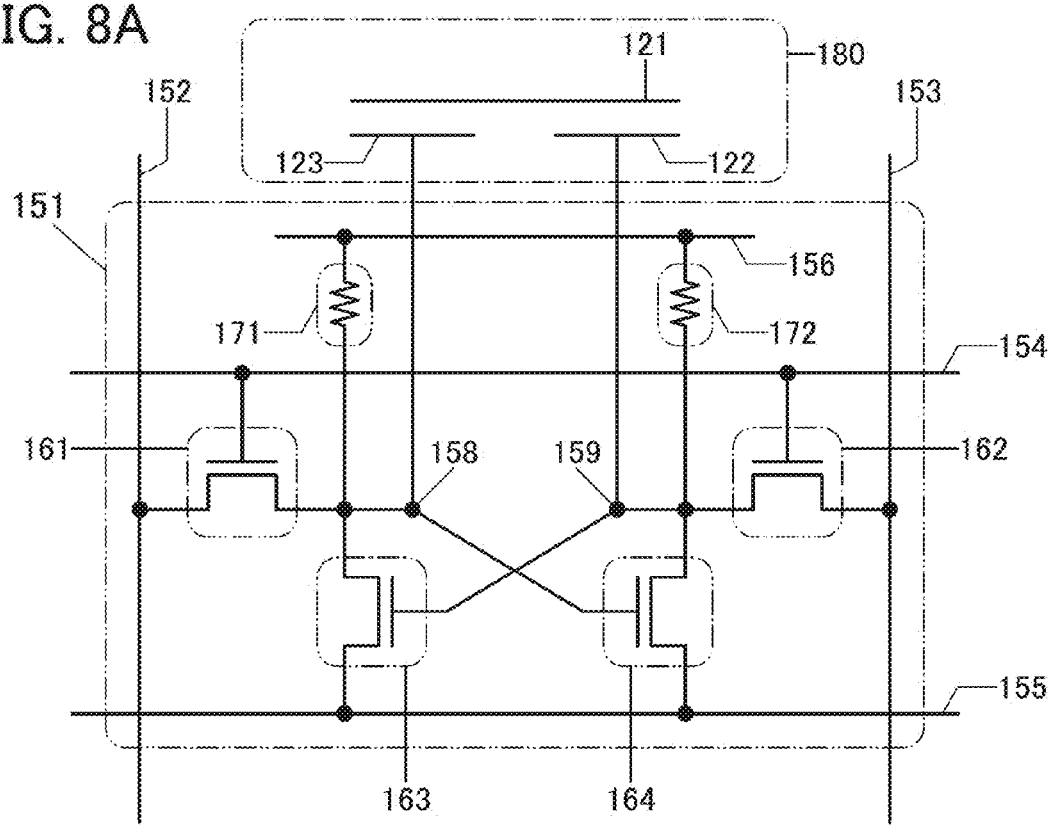

Moreover, a resistor 171 and a resistor 172 may be provided in the circuit 151 as illustrated in FIG. 8(A). Specifically, one terminal of the resistor 171 is electrically connected to the node 158 and the other terminal is electrically connected to a wiring 156. In addition, one terminal of the resistor 172 is electrically connected to the node 159 and the other terminal is electrically connected to the wiring 156. An H potential is supplied to the wiring 156. With such a circuit configuration, the node 158 or 159 can be set to the H potential more quickly. This can increase the operation speed of the electrode 121.

Figure 8B:
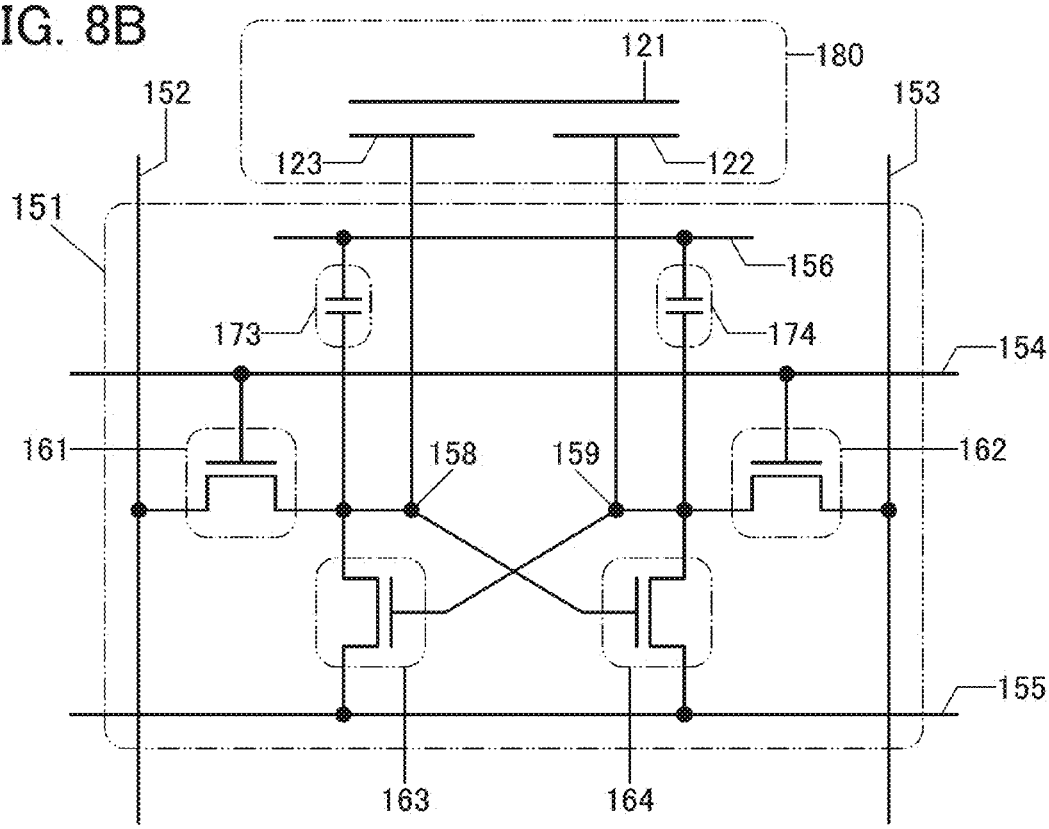

Moreover, a capacitor 173 and a capacitor 174 may be provided in the circuit 151 as illustrated in FIG. 8(B). Specifically, one terminal of the capacitor 173 is electrically connected to the node 158 and the other terminal is electrically connected to the wiring 156. In addition, one terminal of the capacitor 174 is electrically connected to the node 159 and the other terminal is electrically connected to the wiring 156. An H potential, an L potential, or a given fixed potential is supplied to the wiring 156. With such a circuit configuration, the H potential of the node 158 or 159 can be maintained for a longer period when the transistors 161 and 162 are off. In other words, the potential of the node 158 or 159 can be maintained more accurately.

Furthermore, the OS transistor is preferably used as the transistors 161 to 164. When the OS transistor, which has an extremely low off-state current, is used as the transistors 161 to 164, the capacitor 174 can have a smaller size. Alternatively, the capacitor 174 can be omitted and the parasitic capacitance of a transistor and the like can be used as a substitute for the capacitor 174. This can reduce the area occupied by the micromachine in the circuit 151. As a result, the area occupied by the micromachine 100 can be reduced, a display element using the micromachine 100 can easily have a high definition, and the display quality of a display device using the display element can be improved.

Figure 9:
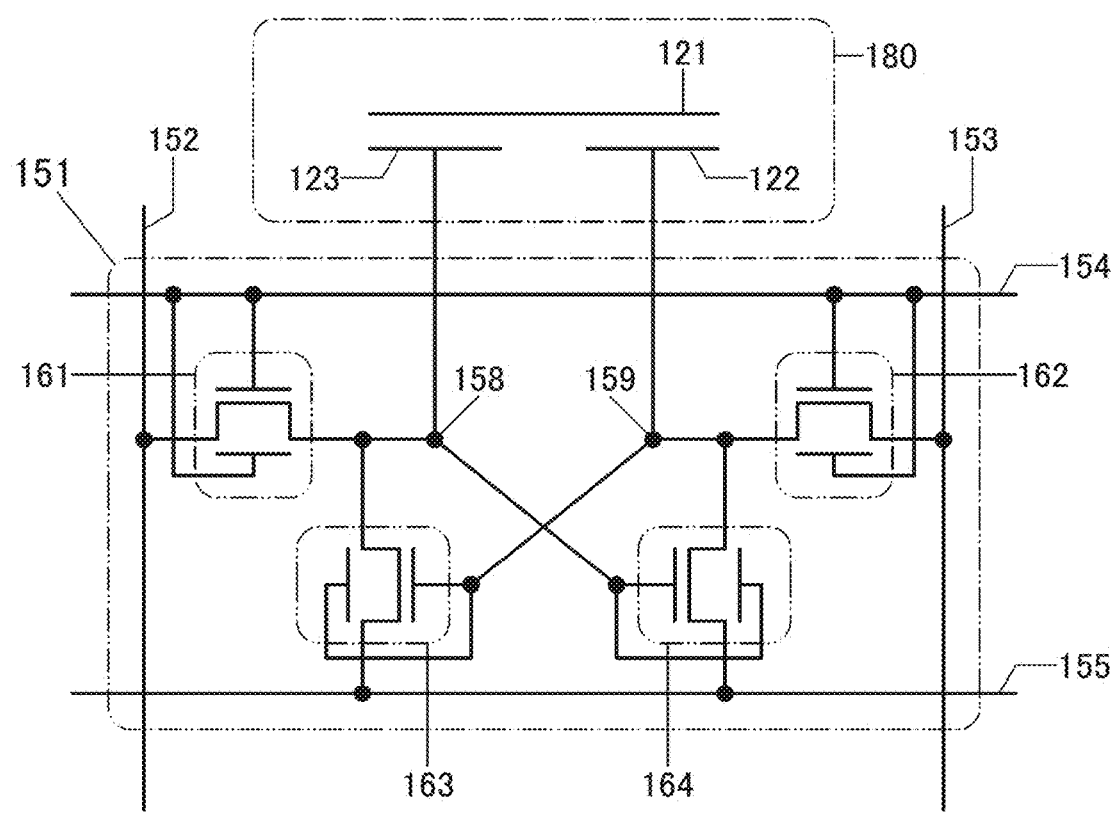

In addition, each of the transistors 161 to 164 may include a back gate electrode as illustrated in FIG. 9. Note that the back gate electrode will be described later.

<Example of Display Element>

Figure 10A:
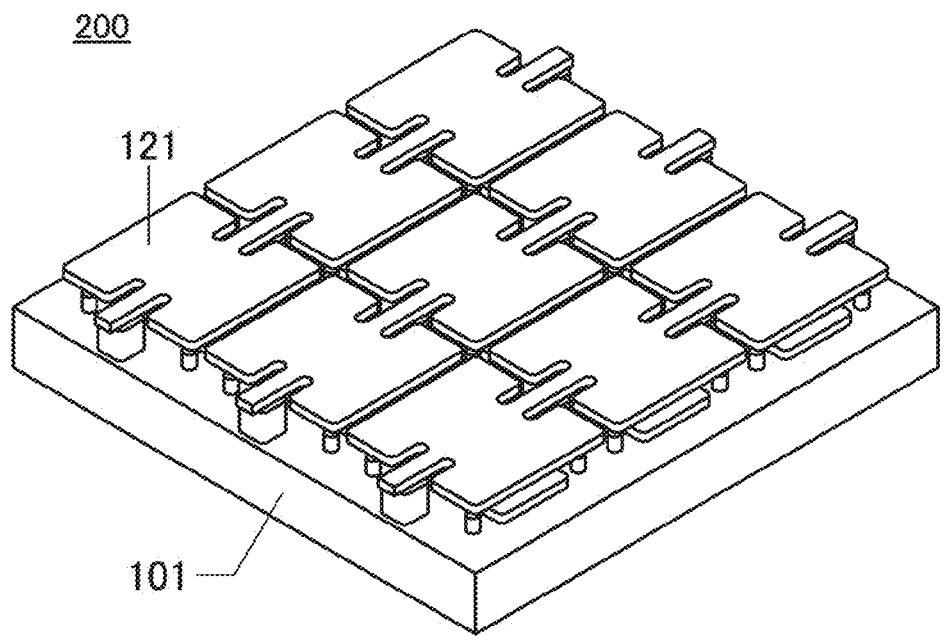
Figure 10B:
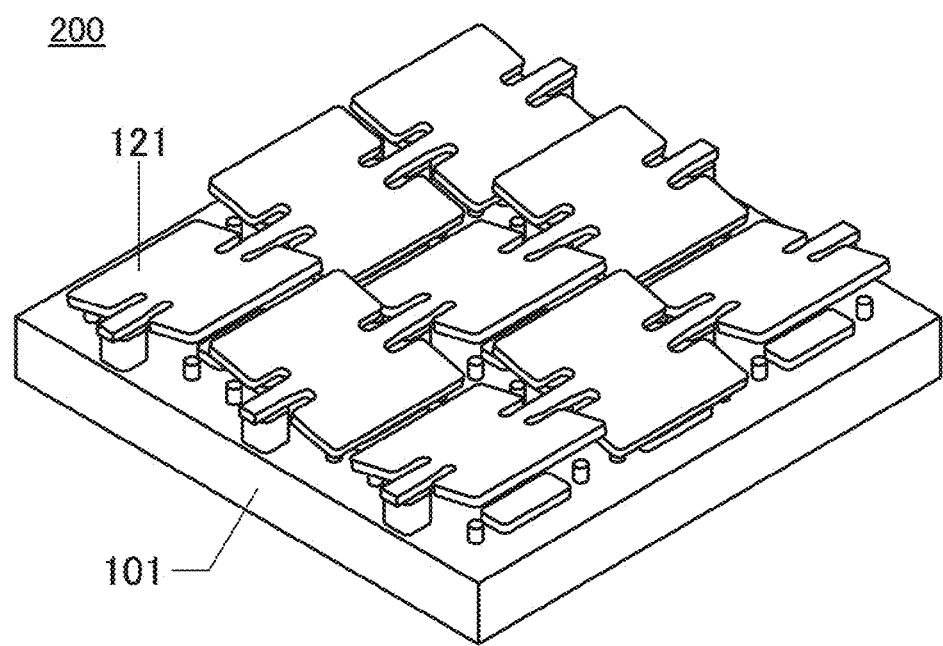

A plurality of micromachines 100 can be arranged in a matrix to function as a display element for displaying characters and images. FIG. 10(A) is a perspective view of a display element 200. The display element 200 exemplified in FIG. 10(A) includes 9 micromachines 100 arranged in a matrix of 3×3. Furthermore, FIG. 10(B) is a perspective view illustrating an example of the operation of the display element 200.

For example, when the micromachines 100 are arranged in a matrix of 1920×1080, the display element 200 can display full high vision images. Furthermore, when the micromachines 100 are arranged in a matrix of 4096×2160, the display element 200 can display 4K images. Moreover, when the micromachines 100 are arranged in a matrix of 8192×4320, the display element 200 can display 4K images.

<Example of Display Device>

Figure 11A:
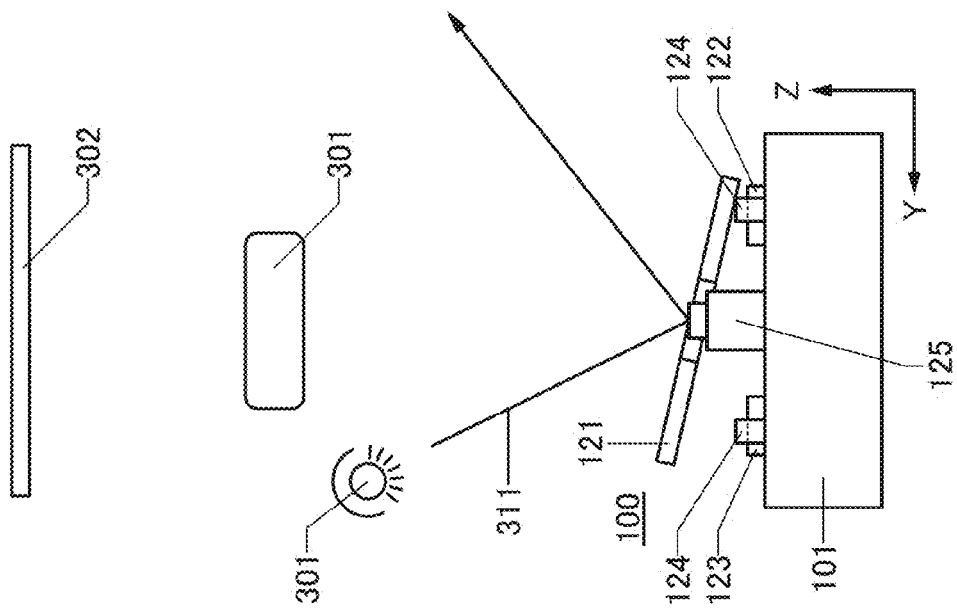
Figure 11B:
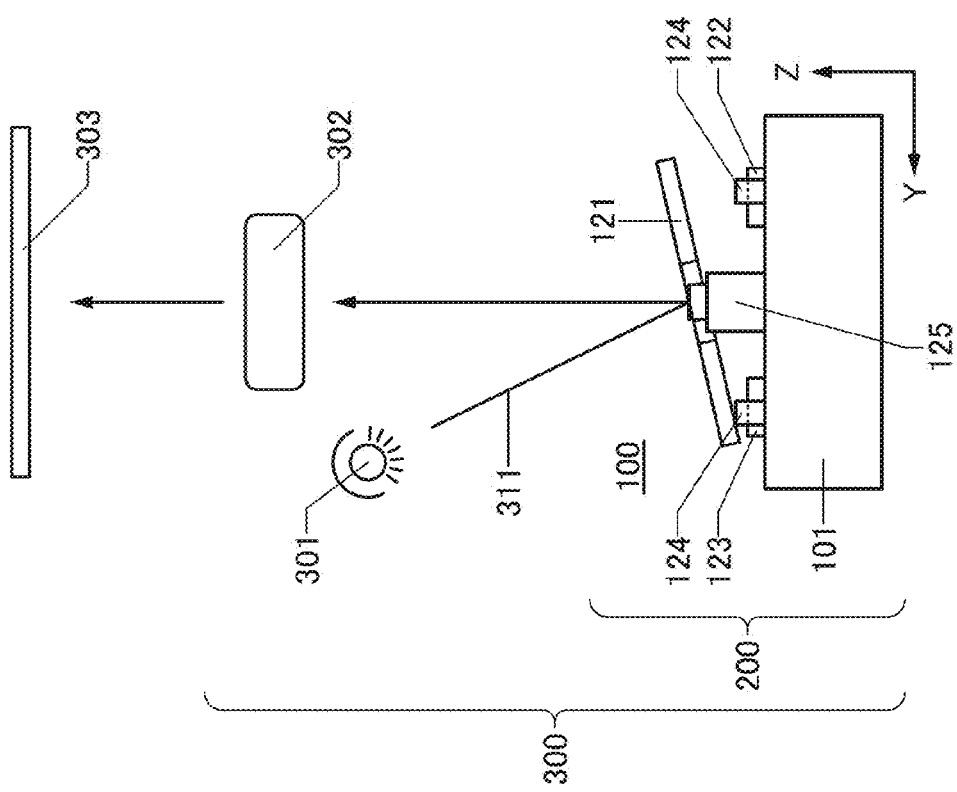

A structure example and operation of a display device 300 using the display element 200 are described with reference to FIG. 11(A) and FIG. 11(B). The display device 300 includes a light source 301, the display element 200, and a lens 302. Note that in FIG. 11(A) and FIG. 11(B), one of the micromachines 100 included in the display element 200 is exemplified as the display element 200.

In the case where the electrode 121 tilts to the electrode 123 side, light 311 ejected from the light source 301 reflects off the electrode 121, enters the lens 302, and then is projected onto a screen 303. This state of the micromachine 100 is referred to as an on state.

Meanwhile, in the case where the electrode 121 tilts to the electrode 122 side, the light 311 ejected from the light source 301 reflects off the electrode 121 but does not enter the lens 302. Hence, the light 311 is not projected onto the screen 303. This state of the micromachine 100 is referred to an off state. In addition, by adjusting the switching frequency between the on state and the off state of the micromachine 100, gray scale display (time gray scale) utilizing a phenomenon of afterimage in the eyes can be achieved.

In addition, color display can be achieved when a color filter for sequentially switching RGB is provided between the light source 301 and the micromachine 100 or between the micromachine 100 and the screen 303.

One embodiment of the present invention can be used not only for a DMD but also for other MEMS elements, for example, a DMS (Digital Micro Shutter), a GLV (Grating Light Valve), an RF MEMS, and the like. Alternatively, one embodiment of the present invention can be used for MIRASOL (registered trademark), an IMOD (interferometric modulator) element, a MEMS shutter display element, an optical interference type MEMS display element, and the like.

Also in this specification and the like, the micromachine, the display element, and the display device that includes the display element can be combined with various elements. Examples of the elements include an EL (electroluminescence) element (an EL element including organic and inorganic materials, an organic EL element, or an inorganic EL element), an LED (a white LED, a red LED, a green LED, a blue LED, or the like), a transistor that emits light in accordance with current, an electron emitter, a liquid crystal element, electronic ink, an electrophoretic element, an electrowetting element, piezoelectric ceramics, and a carbon nanotube.

Examples of display devices using EL elements include an EL display. Examples of display devices using electron emitters include a field emission display (FED) and an SED-type flat panel display (SED: surface-conduction electron-emitter display). Examples of display devices using liquid crystal elements include a liquid crystal display (a transmissive liquid crystal display, a transflective liquid crystal display, a reflective liquid crystal display, a direct-view liquid crystal display, or a projection liquid crystal display). Examples of display devices using electronic ink, electronic liquid powder (registered trademark), or electrophoretic elements include electronic paper.

Note that in the case of using an LED in combination, graphene or graphite may be provided under an electrode or a nitride semiconductor of the LED. Graphene or graphite may be a multilayer film in which a plurality of layers are stacked. Such provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED can be formed. Note that an AlN layer may be provided between graphene or graphite and the n-type GaN semiconductor layer including crystals. The GaN semiconductor layers included in the LED may be formed by MOCVD. Note that when the graphene is provided, the GaN semiconductor layers included in the LED can also be formed by a sputtering method.

Figure 12:
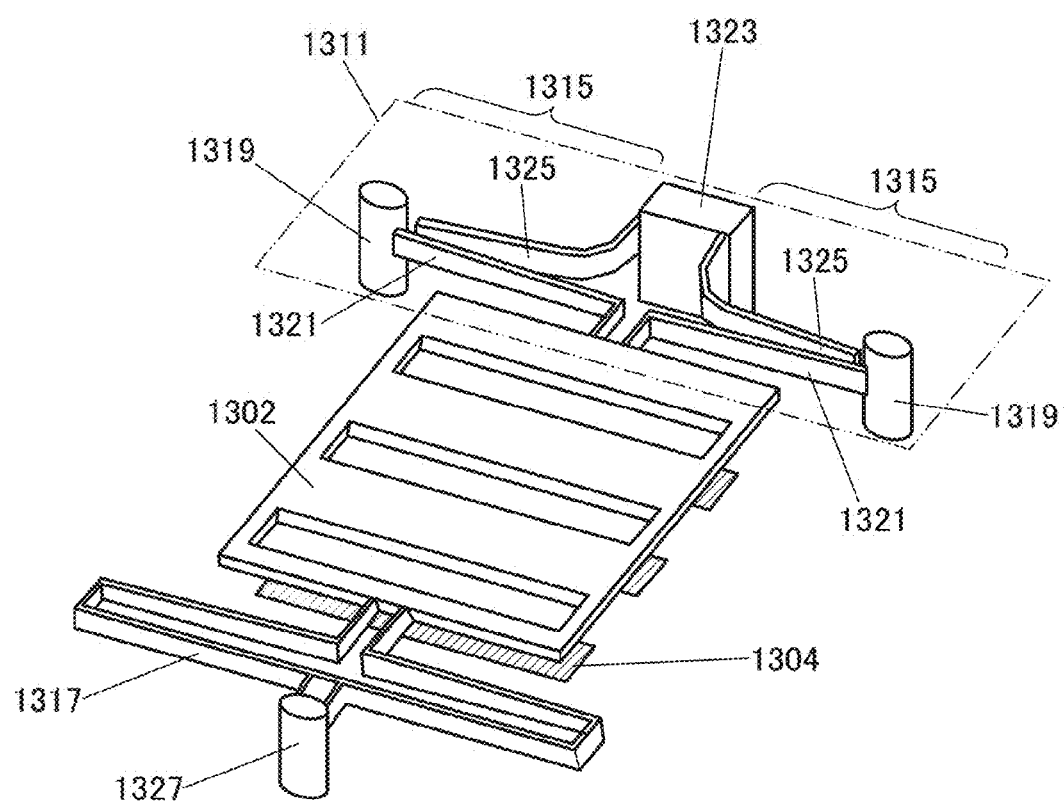

FIG. 12 illustrates a structure example of a MEMS shutter. A shutter 1300 illustrated in FIG. 12 includes a movable light-blocking layer 1302 bonded to an actuator 1311. The actuator 1311 is provided over a light-blocking layer (not illustrated for simplicity) having an opening 1304 and includes two flexible actuators 315. A side of the movable light-blocking layer 1302 is electrically connected to the actuators 1315. The actuators 1315 have a function of moving the movable light-blocking layer 1302 in a lateral direction parallel to the surface of the light-blocking layer having the opening 1304.

The actuators 1315 each include a movable electrode 1321 electrically connected to the movable light-blocking layer 1302 and a structure body 1319, and a movable electrode 1325 electrically connected to a structure body 1323. The movable electrode 1325 is adjacent to the movable electrode 1321. One end of the movable electrode 1325 is electrically connected to the structure body 1323, and the other end thereof can move freely. The other end of the movable electrode 1325, which can move freely, is curved so as to be closest to a connection portion of the movable electrode 1321 and the structure body 1319.

The other side of the movable light-blocking layer 1302 is connected to a spring 1317 having restoring force to resist force applied by the actuator 1311. The spring 1317 is connected to the structure body 1327.

The structure body 1319, the structure body 1323, and the structure body 1327 function as mechanical supports to make the movable light-blocking layer 1302, the actuators 1315, and the spring 1317 float in the vicinity of the surface of the light-blocking layer having the opening 1304.

Under the movable light-blocking layer 1302, the opening 1304 surrounded by the light-blocking layer is placed. Note that the shapes of the movable light-blocking layer 1302 and the opening 1304 are not limited to these.

The structure body 1323 included in the shutter 1300 is electrically connected to a transistor (not illustrated). The transistor drives the movable light-blocking layer. Thus, a given voltage can be applied through the transistor to the movable electrode 1325 connected to the structure body 1323. The structure bodies 1319 and 1327 are connected to a ground electrode (GND). Accordingly, the movable electrode 1321 connected to the structure body 1319 and the spring 1317 connected to the structure body 1327 each have a potential of GND. Note that the structure bodies 1319 and 1327 may be electrically connected to a common electrode to which a given voltage can be applied. The structure bodies 1319 and 1327 may be replaced with another actuator 1311 so that the shutter includes the two actuators 1311.

When a voltage is applied to the movable electrode 1325, the movable electrode 1325 and the movable electrode 1321 are electrically attracted to each other by a potential difference therebetween. As a result, the movable light-blocking layer 1302 connected to the movable electrode 1321 is drawn toward the structure body 1323 and moves to the structure body 1323 in the lateral direction. Since the movable electrode 1321 serves as a spring, when the potential difference between the movable electrodes 1321 and 1325 is eliminated, the movable electrode 1321 releases the stress accumulated therein so that the movable light-blocking layer 1302 returns to its original position. Note that in a state where the movable electrode 1321 is drawn to the movable electrode 1325, the movable light-blocking layer 1302 may block the opening 1304 or may be positioned so as not to overlap with the opening 1304.

This embodiment can be implemented in appropriate combination with the structures described in the other embodiments.

Embodiment 2

In this embodiment, structure examples of a transistor that can be used as the transistors described in the above embodiment are described with reference to FIG. 13 to FIG. 18.

[Bottom-Gate Transistor]

A transistor 410 exemplified in FIG. 13(A1) is a channel-protective transistor that is a type of bottom-gate transistor. The transistor 410 includes, over the insulating layer 102, an electrode 246 that can function as a gate electrode. The transistor 410 also includes a semiconductor layer 242 over the electrode 246 with an insulating layer 216 positioned therebetween. The electrode 246 can be formed with a material and a method similar to those of the electrode 103. The insulating layer 216 can be formed with a material and a method similar to those of the insulating layer 105. The semiconductor layer 242 can be formed with a material and a method similar to those of the semiconductor layer 106.

In addition, the transistor 410 includes, over a channel formation region in the semiconductor layer 242, an insulating layer 209 that can function as a channel protective layer. The insulating layer 209 can be formed with a material and a method similar to those of the insulating layer 216. Furthermore, the transistor 410 includes an electrode 244a and an electrode 244b that are in contact with part of the semiconductor layer 242 and over the insulating layer 216. Part of the electrode 244a and part of the electrode 244b are formed over the insulating layer 209.

With the insulating layer 209 provided over the channel formation region, the semiconductor layer 242 can be prevented from being exposed at the time of forming the electrodes 244a and 244b. Thus, the channel formation region in the semiconductor layer 242 can be prevented from being etched at the time of forming the electrodes 244a and 244b. According to one embodiment of the present invention, a transistor with favorable electrical characteristics can be provided.

Furthermore, the transistor 410 includes an insulating layer 218 over the electrode 244a, the electrode 244b, and the insulating layer 209 and further includes an insulating layer 219 over the insulating layer 218. The insulating layer 218 can be formed with a material and a method similar to those of the insulating layer 108. The insulating layer 219 can be formed with a material and a method similar to those of the insulating layer 109.

A transistor 411 illustrated in FIG. 13(A2) is different from the transistor 410 in that an electrode 213 that can function as a back gate electrode is provided over the insulating layer 118. The electrode 213 can be formed with a material and a method similar to those of the electrode 103.

The back gate electrode is typically formed using a conductive layer and positioned so that the channel formation region in the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or an arbitrary potential. By changing a potential of the back gate electrode independently of the potential of the gate electrode, the threshold voltage of the transistor can be changed.

The electrodes 246 and 213 can both function as gate electrodes. Thus, the insulating layers 216, 209, and 218 each can function as a gate insulating layer.

Note that in the case where one of the electrodes 246 and 213 is referred to as a "gate electrode", the other can be referred to as a "back gate electrode". For example, in the transistor 411, in the case where the electrode 213 is referred to as a "gate electrode", the electrode 246 may be referred to as a "back gate electrode". Also in the case where the electrode 213 is used as a "gate electrode", the transistor 411 can be regarded as a kind of bottom-gate transistor. Furthermore, one of the electrodes 246 and 213 may be referred to as a "first gate electrode", and the other may be referred to as a "second gate electrode".

By providing the electrodes 246 and 213 with the semiconductor layer 242 positioned therebetween and setting the potentials of the electrodes 246 and 213 to be the same, a region of the semiconductor layer 242 through which carriers flow is enlarged in the film thickness direction; thus, the number of transferred carriers is increased. As a result, the on-state current and the field-effect mobility of the transistor 411 are increased.

Thus, the transistor 411 has large on-state current for the area occupied by the transistor 411. That is, the area occupied by the transistor 411 can be small for required on-state current. According to one embodiment of the present invention, the area occupied by a transistor can be reduced. Thus, according to one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer so that the semiconductor layer is covered with the back gate electrode, the electric field blocking function can be enhanced.

In addition, since the electrodes 246 and 213 each have a function of blocking an electric field generated outside, charges of charged particles and the like generated on the insulating layer 102 side or above the electrode 213 do not influence the channel formation region in the semiconductor layer 242. Thus, degradation by a stress test (e.g., a gate bias temperature (−GBT) stress test in which negative charges are applied to a gate) can be reduced, and a change in the rising voltage of on-state current at different drain voltages can be reduced. Note that this effect can be obtained when the electrodes 246 and 213 have the same potential or different potentials.

Note that the BT stress test is a kind of accelerated test and can evaluate, in a short time, a change by long-term use (a change over time) in characteristics of transistors. In particular, the amount of change in threshold voltage of the transistor between before and after the BT stress test is an important indicator when examining the reliability of the transistor. As the change in the threshold voltage is smaller, the transistor has higher reliability.

Also by providing the electrodes 246 and 213 and setting the potentials of the electrodes 246 and 213 to be the same, the change in threshold voltage is reduced. Accordingly, variation in electrical characteristics among a plurality of transistors is also reduced.

In addition, the transistor including the back gate electrode has a smaller change in threshold voltage by a positive GBT stress test in which positive electric charge is applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Thus, photodegradation of the semiconductor layer can be prevented and deterioration in electrical characteristics of the transistor, such as a shift of the threshold voltage, can be prevented.

According to one embodiment of the present invention, a transistor with high reliability can be provided. In addition, a semiconductor device with high reliability can be provided.

A transistor 420 exemplified in FIG. 13(B1) is a channel-protective transistor that is a type of bottom-gate transistor. The transistor 420 has substantially the same structure as the transistor 410 but is different from the transistor 410 in that the insulating layer 209 covers the semiconductor layer 242. The semiconductor layer 242 is electrically connected to the electrode 244a in an opening that is formed by selectively removing part of the insulating layer 209 overlapping with the semiconductor layer 242. The semiconductor layer 242 is also electrically connected to the electrode 244b in the opening that is formed by selectively removing part of the insulating layer 209 overlapping with the semiconductor layer 242. A region of the insulating layer 209 that overlaps with the channel formation region can function as a channel protective layer.

A transistor 421 illustrated in FIG. 13(B2) is different from the transistor 420 in that the electrode 213 that can function as a back gate electrode is provided over the insulating layer 118.

With the insulating layer 209, the semiconductor layer 242 can be prevented from being exposed at the time of forming the electrodes 244a and 244b. Thus, the semiconductor layer 242 can be prevented from being reduced in thickness at the time of forming the electrodes 244a and 244b.

The distance between the electrodes 244a and 246 and the distance between the electrodes 244b and 246 in the transistors 420 and 421 are longer than those in the transistors 410 and 411. Thus, the parasitic capacitance generated between the electrodes 244a and 246 can be reduced. Furthermore, the parasitic capacitance generated between the electrodes 244b and 246 can be reduced. According to one embodiment of the present invention, a transistor with favorable electrical characteristics can be provided.

[Top-Gate Transistor]

A transistor 430 exemplified in FIG. 14(A1) is a type of top-gate transistor. The transistor 430 includes the semiconductor layer 242 over the insulating layer 102; the electrodes 244a and 244b that are over the semiconductor layer 242 and the insulating layer 102 and in contact with part of the semiconductor layer 242; the insulating layer 216 over the semiconductor layer 242 and the electrodes 244a and 244b; and the electrode 246 over the insulating layer 216.

Since the electrode 246 overlaps with neither the electrode 244a nor the electrode 244b in the transistor 430, the parasitic capacitance generated between the electrodes 246 and 244a and the parasitic capacitance generated between the electrodes 246 and 244b can be reduced. After the formation of the electrode 246, an impurity element 255 is introduced into the semiconductor layer 242 using the electrode 246 as a mask, so that an impurity region can be formed in the semiconductor layer 242 in a self-aligned manner (see FIG. 14(A3)). According to one embodiment of the present invention, a transistor with favorable electrical characteristics can be provided.

Note that the introduction of the impurity element 255 can be performed with an ion implantation apparatus, an ion doping apparatus, or a plasma treatment apparatus.

As the impurity element 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity element 255.

A transistor 431 illustrated in FIG. 14(A2) is different from the transistor 430 in that the electrode 213 and an insulating layer 217 are included. The transistor 431 includes the electrode 213 formed over the insulating layer 102 and the insulating layer 217 formed over the electrode 213. As mentioned above, the electrode 213 can function as a back gate electrode. Thus, the insulating layer 217 can function as a gate insulating layer. The insulating layer 217 can be formed with a material and a method that are similar to those of the insulating layer 216.

The transistor 431 as well as the transistor 411 has large on-state current for the area occupied by the transistor 431. That is, the area occupied by the transistor 431 can be small for required on-state current. According to one embodiment of the present invention, the area occupied by a transistor can be reduced. Thus, according to one embodiment of the present invention, a semiconductor device having a high degree of integration can be provided.

A transistor 440 exemplified in FIG. 14(B1) is a type of top-gate transistor. The transistor 440 is different from the transistor 430 in that the semiconductor layer 242 is formed after the formation of the electrodes 244a and 244b. A transistor 441 exemplified in FIG. 14(B2) is different from the transistor 440 in that the electrode 213 and the insulating layer 217 are provided. Thus, in the transistors 440 and 441, part of the semiconductor layer 242 is formed over the electrode 244a and another part of the semiconductor layer 242 is formed over the electrode 244b.

The transistor 441 as well as the transistor 411 has large on-state current for the area occupied by the transistor 441. That is, the area occupied by the transistor 441 can be small for required on-state current. According to one embodiment of the present invention, the area occupied by a transistor can be reduced. Thus, according to one embodiment of the present invention, a semiconductor device having a high degree of integration can be provided.

Also in the transistors 440 and 441, after the formation of the electrode 246, the impurity element 255 is introduced into the semiconductor layer 242 using the electrode 246 as a mask, so that an impurity region can be formed in the semiconductor layer 242 in a self-aligned manner. According to one embodiment of the present invention, a transistor with favorable electrical characteristics can be provided. Furthermore, according to one embodiment of the present invention, a semiconductor device having a high degree of integration can be provided.

[S-Channel Transistor]

FIG. 15 illustrates an example of a structure of a transistor using an oxide semiconductor for the semiconductor layer 242. In a transistor 450 exemplified in FIG. 15, a semiconductor layer 242b is formed over a semiconductor layer 242a, and a semiconductor layer 242c covers a top surface and a side surface of the semiconductor layer 242b and a side surface of the semiconductor layer 242a. FIG. 15(A) is a top view of the transistor 450. FIG. 15(B) is a cross-sectional view (in the channel length direction) taken along dashed-dotted line X1-X2 in FIG. 15(A). FIG. 15(C) is a cross-sectional view (in the channel width direction) taken along dashed-dotted line Y1-Y2 in FIG. 15(A).

Each of the semiconductor layers 242a, 242b, and 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn). The element M is one or more kinds of elements selected from Al, Ti, Ga, Y, Zr, La, Ce, Nd, and Hf and has a higher strength of bonding with oxygen than In has.

The semiconductor layers 242a and 242c are preferably formed using a material containing one or more kinds of metal elements contained in the semiconductor layer 242b. With the use of such a material, interface states at interfaces between the semiconductor layers 242a and 242b and between the semiconductor layers 242c and 242b are less likely to be generated. Accordingly, carriers are not likely to be scattered or captured at the interfaces, which results in an improvement in field-effect mobility of the transistor. Furthermore, threshold voltage variation of the transistor can be reduced. Thus, a semiconductor device having favorable electrical characteristics can be obtained.

Each of the thicknesses of the semiconductor layers 242a and 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 242b is an In-M-Zn oxide and the semiconductor layers 242a and 242c are each an In-M-Zn oxide, the semiconductor layers 242a and 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the semiconductor layers 242a, 242c, and 242b are selected so that $y_1/x_1$ is larger than $y_2/x_2$. Preferably, the semiconductor layers 242a, 242c, and 242b are selected so that $y_1/x_1$ is 1.5 times or more as large as $y_2/x_2$. More preferably, the semiconductor layers 242a, 242c, and 242b are selected so that $y_1/x_1$ is twice or more as large as $y_2/x_2$. Still further preferably, the semiconductor layers 242a, 242c, and 242b are selected so that $y_1/x_1$ is three times or more as large as $y_2/x_2$. As this time, $y_1$ is preferably larger than or equal to $x_1$ in the semiconductor layer 242b because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layers 242a and 242c have the above compositions, the semiconductor layers 242a and 242c can each be a layer in which oxygen vacancies are less likely to be generated than in the semiconductor layer 242b.

Note that in the case where the semiconductor layers 242a and 242c are each an In-M-Zn oxide, the content percentages of In and an element M, not taking Zn and O into consideration, are preferably as follows: the content percentage of In is lower than 50 atomic % and the percentage of M is higher than or equal to 50 atomic %; more preferably, the content percentage of In is lower than 25 atomic % and the content percentage of M is higher than or equal to 75 atomic %. In the case where the semiconductor layer 242b is an In-M-Zn oxide, the content percentages of In and element M, not taking Zn and O into consideration, are preferably as follows: the percentage of In is higher than or equal to 25 atomic % and the percentage of M is lower than 75 atomic %; more preferably, the content percentages of In is higher than or equal to 34 atomic % and the percentage of M is lower than 66 atomic %.

For example, an In—Ga—Zn oxide that is formed using a target having an atomic ratio of In:Ga:Zn=1:3:2, 1:3:4, 1:3:6, 1:6:4, or 1:9:6, an In—Ga oxide that is formed using a target having an atomic ratio of In:Ga=1:9, or gallium oxide can be used for each of the semiconductor layers 242a and 242c containing In or Ga. Furthermore, an In—Ga—Zn oxide that is formed using a target having an atomic ratio of In:Ga:Zn=3:1:2, 1:1:1, 5:5:6, 5:1:7, 4:2:3, 4:2:4.1, or the like can be used for the semiconductor layer 242b. Note that the atomic ratio of each of the semiconductor layers 242a, 242b, and 242c may vary within a range of ±20% of any of the above-described atomic ratios as an error.

In order to give stable electrical characteristics to the transistor including the semiconductor layer 242b, impurities and oxygen vacancies in the semiconductor layer 242b are preferably reduced to obtain a highly purified semiconductor layer, so that the semiconductor layer 242b can be regarded as an intrinsic or substantially intrinsic oxide semiconductor layer. Furthermore, it is preferable that at least the channel formation region of the semiconductor layer 242b be a semiconductor layer that can be regarded as an intrinsic or substantially intrinsic semiconductor layer.

Note that the substantially intrinsic oxide semiconductor layer refers to an oxide semiconductor layer in which the carrier density is higher than or equal to $1 \times 10^{-9}/cm^3$ and lower than $8 \times 10^{11}/cm^3$ or lower than $1 \times 10^{-9}/cm^3$.

Figure 16A:
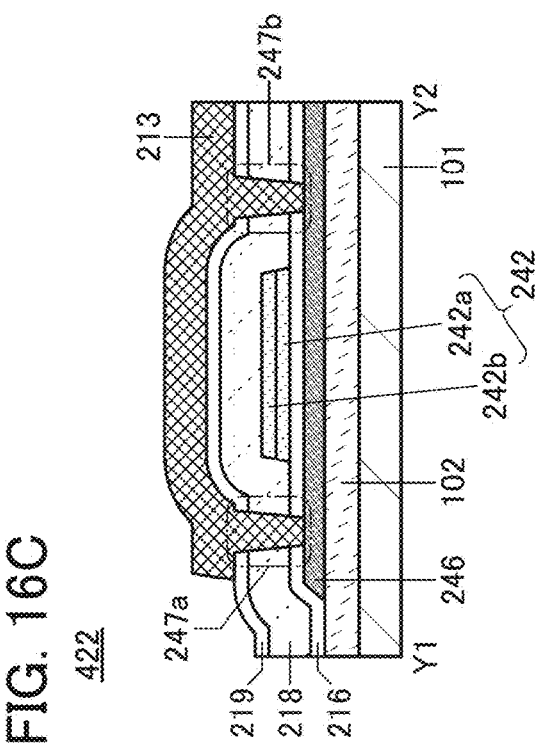
Figure 16B:
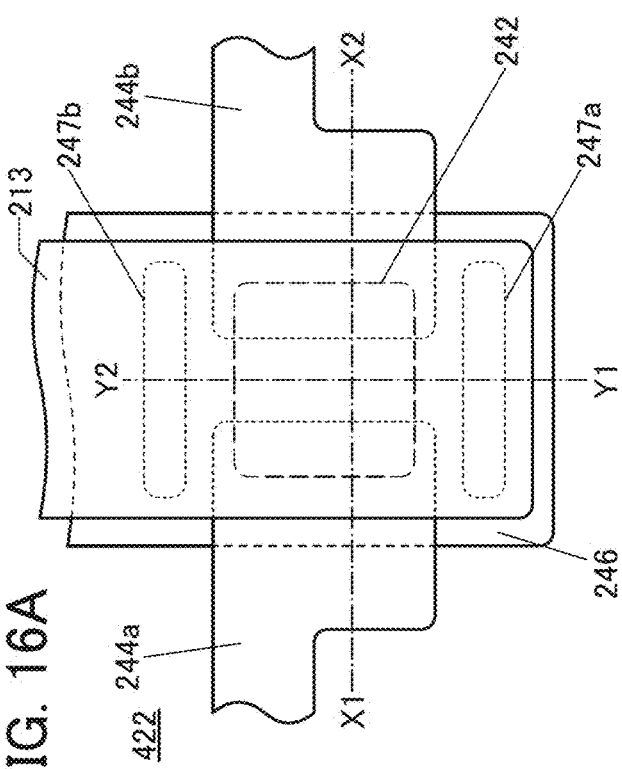
Figure 16C:
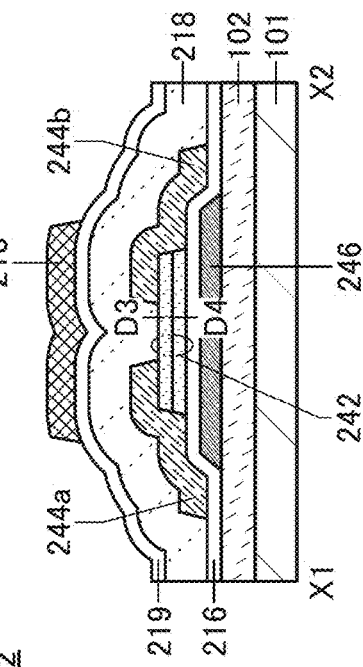

FIG. 16 illustrates an example of a structure of a transistor including an oxide semiconductor for the semiconductor layer 242. In a transistor 422 exemplified in FIG. 16, the semiconductor layer 242b is formed over the semiconductor layer 242a. The transistor 422 is a kind of bottom-gate transistor having a back-gate electrode. FIG. 16(A) is a top view of the transistor 422. FIG. 16(B) is a cross-sectional view (in the channel length direction) taken along dashed-dotted line X1-X2 in FIG. 16(A). FIG. 16(C) is a cross-sectional view (in the channel width direction) taken along the dash-dot line Y1-Y2 in FIG. 16(A).

The electrode 213 over the insulating layer 219 is electrically connected to the electrode 246 in an opening 247a and an opening 247b provided in the insulating layers 216, 218, and 219. Thus, the same potential is supplied to the electrodes 213 and 246. Furthermore, either or both of the openings 247a and 247b may be omitted. In the case where neither the opening 247a nor the opening 247b is provided, different potentials can be applied to the electrode 213 and 246.

[Energy Band Structure of Oxide Semiconductor]

Figure 19A:
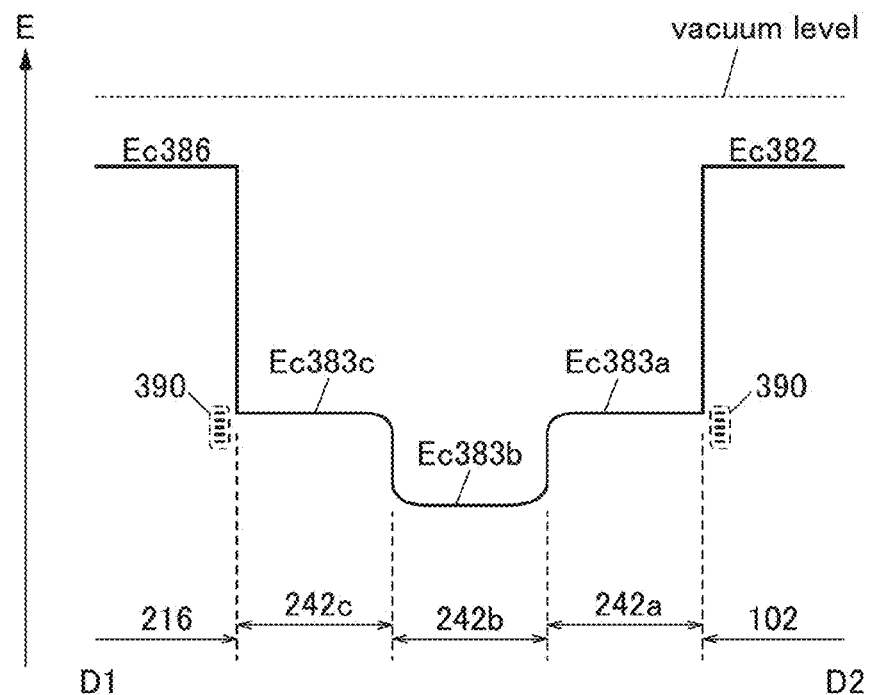
Figure 19B:
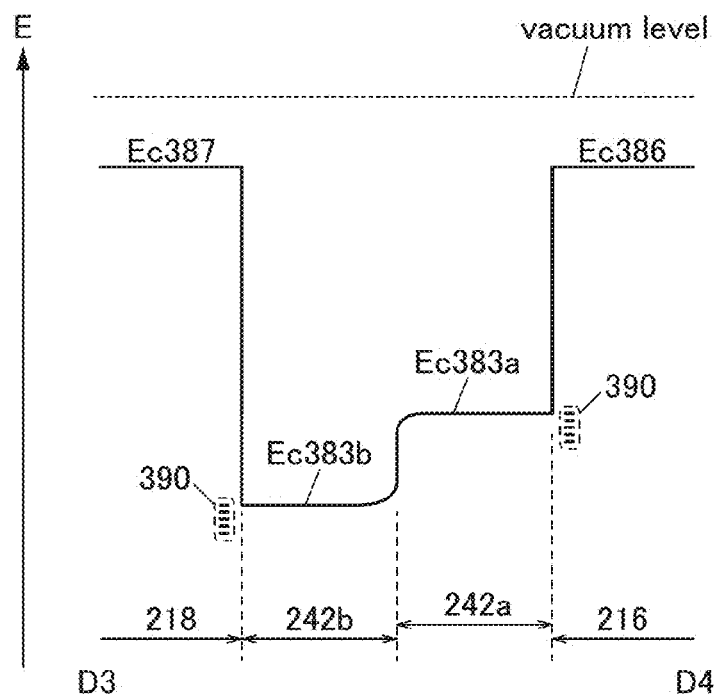

Here, the function and effect of the semiconductor layer 242 that is a stacked layer of the semiconductor layers 242a, 242b, and 242c are described with an energy band structure diagram shown in FIG. 19(A) and FIG. 19(B). FIG. 19(A) is the energy band structure diagram showing a portion along dashed-dotted line D1-D2 in FIG. 15(B). FIG. 19(A) shows the energy band structure of a channel formation region of the transistor 450.

In FIG. 19(A), Ec382, Ec383a, Ec383b, Ec383c, and Ec386 show the energies of bottoms of the conduction band in the insulating layer 102, the semiconductor layer 242a, the semiconductor layer 242b, the semiconductor layer 242c, and the insulating layer 216, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide that is formed using a target having an atomic ratio of In:Ga:Zn=1:3:2 has an energy gap of approximately 3.5 eV and an electron affinity of approximately 4.5 eV. An In—Ga—Zn oxide that is formed using a target having an atomic ratio of In:Ga:Zn=1:3:4 has an energy gap of approximately 3.4 eV and an electron affinity of approximately 4.5 eV. An In—Ga—Zn oxide that is formed using a target having an atomic ratio of In:Ga:Zn=1:3:6 has an energy gap of approximately 3.3 eV and an electron affinity of approximately 4.5 eV. An In—Ga—Zn oxide that is formed using a target having an atomic ratio of In:Ga:Zn=1:6:2 has an energy gap of approximately 3.9 eV and an electron affinity of approximately 4.3 eV. An In—Ga—Zn oxide that is formed using a target having an atomic ratio of In:Ga:Zn=1:6:8 has an energy gap of approximately 3.5 eV and an electron affinity of approximately 4.4 eV. An In—Ga—Zn oxide that is formed using a target having an atomic ratio of In:Ga:Zn=1:6:10 has an energy gap of approximately 3.5 eV and an electron affinity of approximately 4.5 eV. An In—Ga—Zn oxide that is formed using a target having an atomic ratio of In:Ga:Zn=1:1:1 has an energy gap of approximately 3.2 eV and an electron affinity of approximately 4.7 eV. An In—Ga—Zn oxide that is formed using a target having an atomic ratio of In:Ga:Zn=3:1:2 has an energy gap of approximately 2.8 eV and an electron affinity of approximately 5.0 eV.

Since the insulating layers 102 and 216 are insulators, Ec382 and Ec386 are closer to the vacuum level (have a smaller electron affinity) than Ec383a, Ec383b, and Ec383c.

Furthermore, Ec383a is closer to the vacuum level than Ec383b. Specifically, Ec383a is preferably closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Furthermore, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of an interface between the semiconductor layers 242a and 242b and the vicinity of an interface between the semiconductor layers 242b and 242c, mixed regions are formed; thus, the energy of the bottom of the conduction band continuously changes. In other words, no state or few states exist at these interfaces.

Accordingly, electrons move mainly through the semiconductor layer 242b in the stacked-layer structure having the above energy band structure. Thus, even when an interface state exists at an interface between the semiconductor layer 242a and the insulating layer 107 or an interface between the semiconductor layer 242c and the insulating layer 216, the interface state hardly influences the transfer of the electrons. In addition, the interface state does not exist or hardly exists at the interface between the semiconductor layers 242a and 242b and at the interface between the semiconductor layers 242c and 242b; thus, the transfer of electrons are not prohibited in the region. Accordingly, high field-effect mobility can be obtained in the transistor 134 having the above stacked-layer structure of the oxide semiconductors.

Note that although trap states 390 due to impurities or defects might be formed in the vicinity of the interface between the semiconductor layer 242a and the insulating layer 102 and in the vicinity of the interface between the semiconductor layer 242c and the insulating layer 216 as shown in FIG. 19(A), the semiconductor layer 242b can be separated from the trap states owing to the existence of the semiconductor layers 242a and 242c.

In particular, in the transistor 134 exemplified in this embodiment, a top surface and a side surface of the semiconductor layer 242b are in contact with the semiconductor layer 242c, and a bottom surface of the semiconductor layer 242b is in contact with the semiconductor layer 242a. In this manner, the semiconductor layer 242b is surrounded by the semiconductor layers 242a and 242c, whereby the influence of the trap state can be further reduced.

However, in the case where an energy difference between Ec383a and Ec383b or between Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in the positive direction.

Thus, each of the energy differences between Ec383a and Ec383b and between Ec383c and Ec383b is preferably set to be larger than or equal to 0.1 eV, further preferably larger than or equal to 0.15 eV, in which case a change in the threshold voltage of the transistor can be reduced and the transistor can have favorable electrical characteristics.

Moreover, each of the band gaps of the semiconductor layers 242a and 242c is preferably larger than band gap of the semiconductor layer 242b.

FIG. 19(B) is the energy band structure diagram of a portion along dashed-dotted line D3-D4 in FIG. 16(B). FIG. 19(B) shows the energy band structure of a channel formation region of the transistor 422.

Figure 18C:
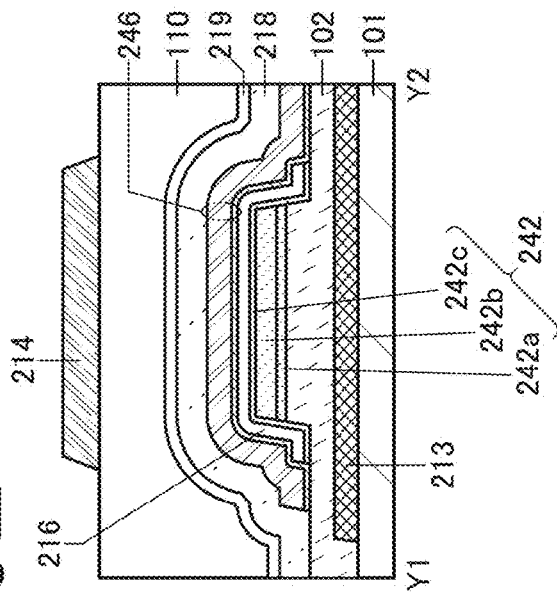
Figure 18A:
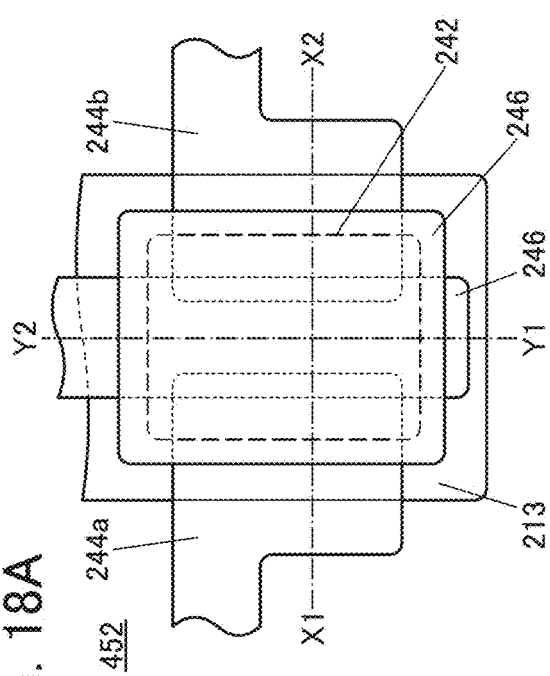
Figure 18B:
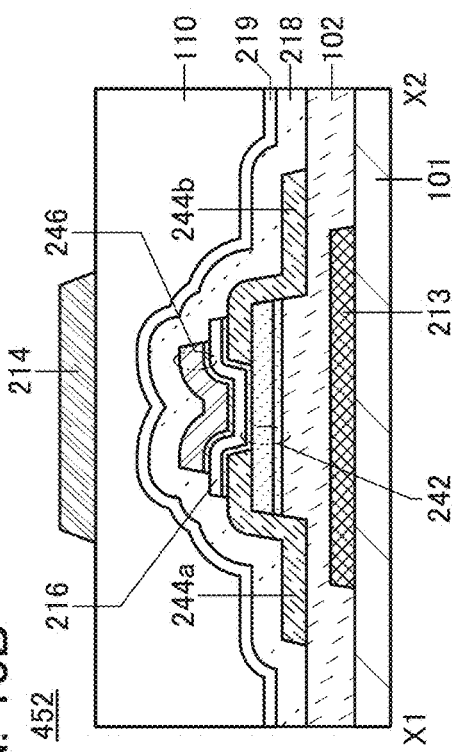

In FIG. 18(B), Ec387 shows an energy of the bottom of the conduction band of the insulating layer 218. In the case where the semiconductor layer 242 includes two layers of the semiconductor layers 242a and 242b, the transistor is easily affected by the trap states 390 because the semiconductor layer 242c is not provided. However, a higher field-effect mobility can be achieved than that in the case where the semiconductor layer 242 has a single-layer structure.

According to one embodiment of the present invention, a transistor with a small variation in electrical characteristics can be provided. Accordingly, a semiconductor device with a small variation in electrical characteristics can be provided. According to one embodiment of the present invention, a transistor with high reliability can be provided. Accordingly, a semiconductor device with high reliability can be provided.

In addition, an oxide semiconductor has an energy gap as wide as 3.0 eV or more and high visible-light transmissivity. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). Therefore, a semiconductor device with low power consumption can be provided.

According to one embodiment of the present invention, a transistor with low power consumption can be provided. Accordingly, a display element or a semiconductor device such as a display device with low power consumption can be provided. Alternatively, a display element or a semiconductor device such as a display device with high reliability can be provided.

The transistor 450 illustrated in FIG. 15 is described again. A semiconductor layer 242b is provided over a projecting portion of the insulating layer 102, in which case the electrode 246 can also cover a side surface of the semiconductor layer 242b. That is, the transistor 450 has a structure in which the semiconductor layer 242b can be electrically surrounded by electric field of the electrode 246. Such a structure of a transistor in which the semiconductor layer in which the channel is formed is electrically surrounded by the electric field of the conductive film is called a surrounded channel (s-channel) structure. A transistor having an s-channel structure is referred to as an "s-channel type transistor" or an "s-channel transistor".

In the s-channel transistor, a channel is sometimes formed in the whole (bulk) of the semiconductor layer 242b. In the s-channel structure, the drain current of the transistor can be increased, so that a larger amount of on-state current can be obtained. Furthermore, the entire channel formation region of the semiconductor layer 242b can be depleted by the electric field of the electrode 246. Accordingly, the off-state current of the transistor with an s-channel structure can be further reduced.

Note that when the projecting portion of the insulating layer 102 is increased in height and the channel width is shortened, the effects of the s-channel structure to increase the on-state current and reduce the off-state current can be enhanced. In addition, part of the semiconductor layer 242a exposed in the formation of the semiconductor layer 242b may be removed. In this case, the side surfaces of the semiconductor layers 242a and 242b may be aligned to each other.

Figure 17C:
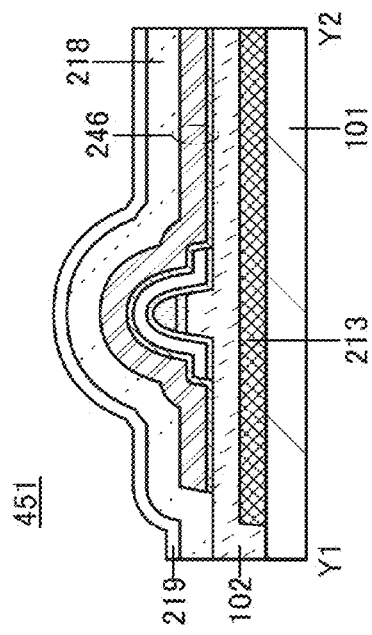
Figure 17A:
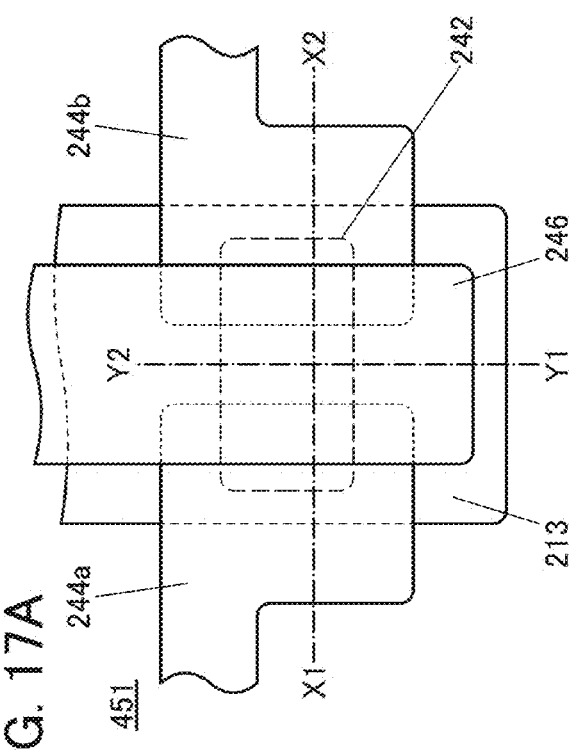
Figure 17B:
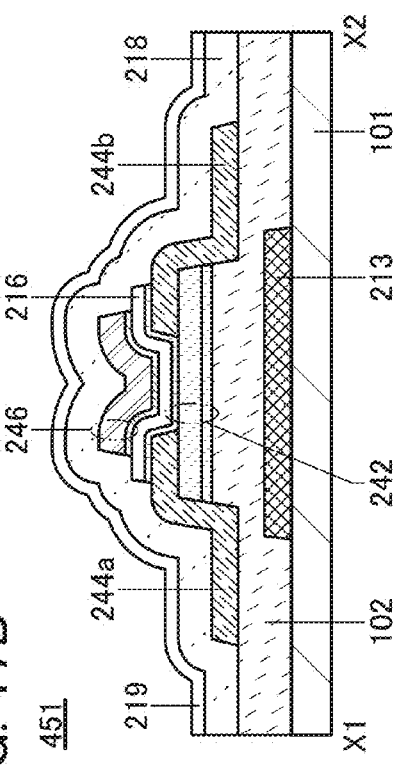

As in a transistor 451 illustrated in FIG. 17, the electrode 213 may be provided below the semiconductor layer 242 with an insulating layer interposed therebetween. FIG. 17(A) is a top view of a transistor 451. FIG. 17(B) is a cross-sectional view taken along dashed-dotted line X1-X2 in FIG. 17(A). FIG. 17(C) is a cross-sectional view taken along dashed-dotted line Y1-Y2 in FIG. 17(A).

Also as in a transistor 452 illustrated in FIG. 18, an insulating layer 110 may be provided above the electrode 246 and a layer 214 may be provided over the insulating layer 110. FIG. 18(A) is a top view of the transistor 452. FIG. 18(B) is a cross-sectional view taken along dashed-dotted line X1-X2 in FIG. 18(A). FIG. 18(C) is a cross-sectional view taken along dashed-dotted line Y1-Y2 in FIG. 18(A).

Note that the layer 214 is provided over the insulating layer 110 in FIG. 18; it may be provided over the insulating layer 218. When the layer 214 is formed using a material having a light-blocking property, change in characteristics or decrease in reliability of the transistor, which is caused by light irradiation, can be prevented. When the layer 214 is formed larger than at least the semiconductor layer 242b to cover the semiconductor layer 242b, the above effects can be improved. The layer 214 can be formed using an organic material, an inorganic material, or a metal material. In the case where the layer 214 is formed using a conductive material, voltage can be supplied to the layer 214 or the layer 214 may be set to an electrically-floating state.

This embodiment can be implemented in appropriate combination with the structures described in the other embodiments.

Embodiment 3

In this embodiment, a structure of an oxide semiconductor is described.

<Structure of Oxide Semiconductor>

Oxide semiconductors are classified into single crystal oxide semiconductors and non-single-crystal oxide semiconductors. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can also be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 20A:
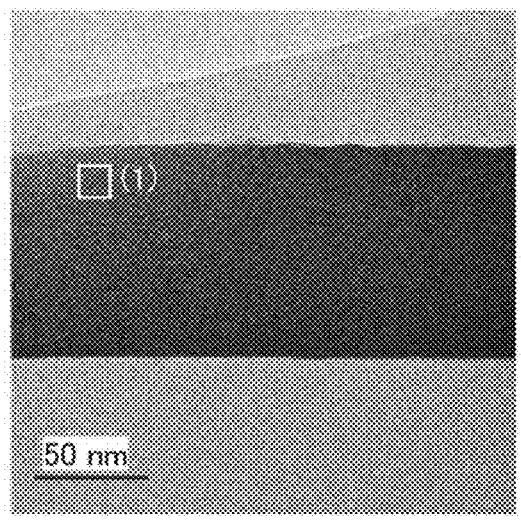

A CAAC-OS observed with TEM is described below. FIG. 20(A) shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 20B:
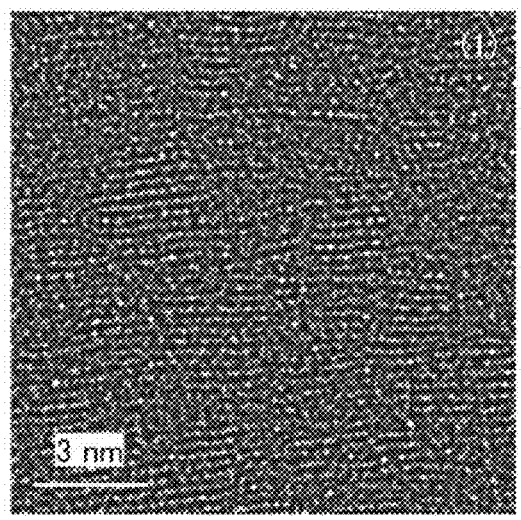

FIG. 20(B) is an enlarged Cs-corrected high-resolution TEM image of a region (1) in FIG. 20(A). FIG. 20(B) shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 20C:
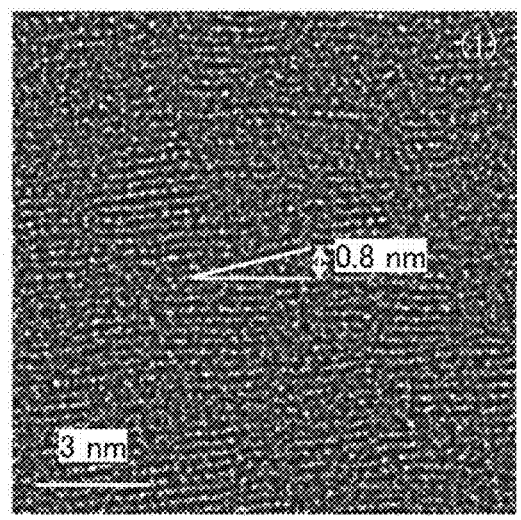

As shown in FIG. 20(B), the CAAC-OS has a characteristic atomic arrangement. The characteristic atomic arrangement is denoted by an auxiliary line in FIG. 20(C). FIG. 20(B) and FIG. 20(C) prove that the size of a pellet is approximately 1 nm to 3 nm, and the size of a space caused by tilt of the pellets is approximately 0.8 nm. Therefore, the pellet can also be referred to as a nanocrystal (nc).

Figure 20D:
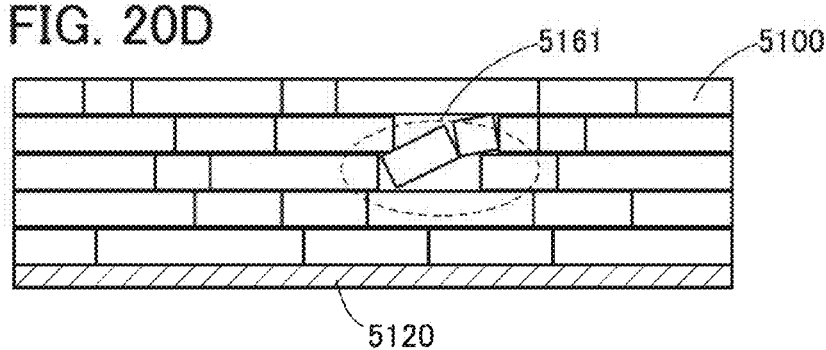

Here, according to the Cs-corrected high-resolution TEM images, the schematic arrangement of pellets 5100 of a CAAC-OS over a substrate 5120 is illustrated by such a structure in which bricks or blocks are stacked (see FIG. 20(D)). The part in which the pellets are tilted as observed in FIG. 20(C) corresponds to a region 5161 shown in FIG. 20(D).

Figure 21A:
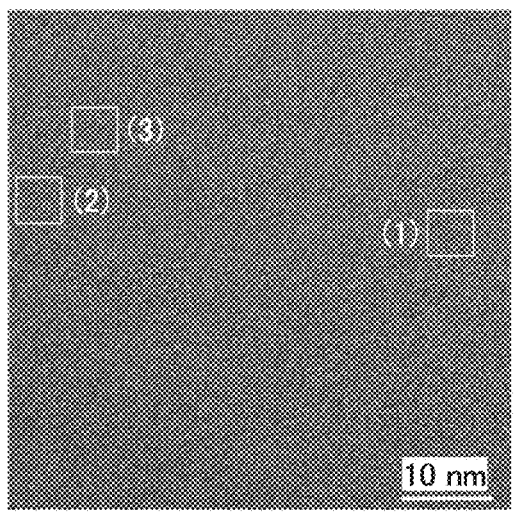
Figure 21B:
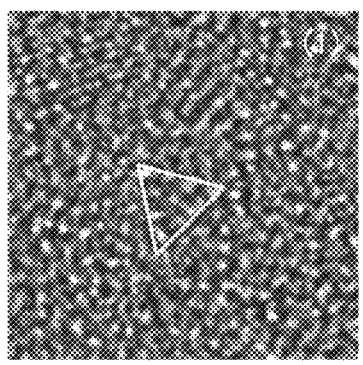
Figure 21C:
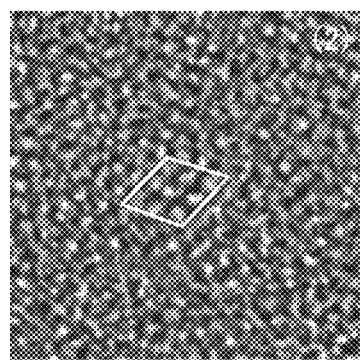
Figure 21D:
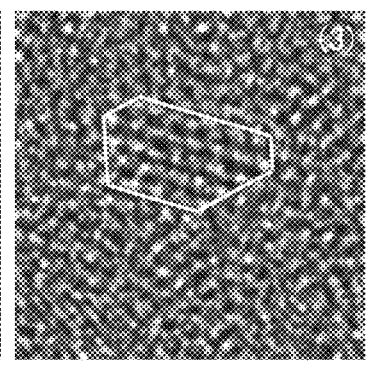

FIG. 21(A) shows a Cs-corrected high-resolution TEM image of a plane of the CAAC-OS observed from a direction substantially perpendicular to the sample surface. FIG. 21(B), FIG. 21(C), and FIG. 21(D) are enlarged Cs-corrected high-resolution TEM images of a region (1), a region (2), and a region (3) in FIG. 21(A), respectively. FIG. 21(B), FIG. 21(C), and FIG. 21(D) indicate that metal atoms are arranged in a triangular, quadrangular, or hexagonal configuration in a pellet. However, there is no regularity of arrangement of metal atoms between different pellets.

Figure 22A:
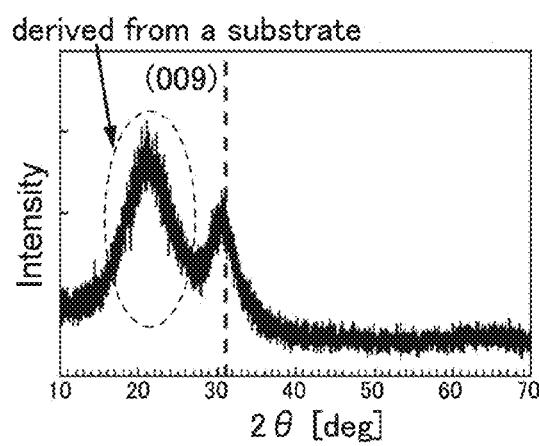

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 22(A). This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31 and that a peak not appear when 2θ is around 36°.

Figure 22B:
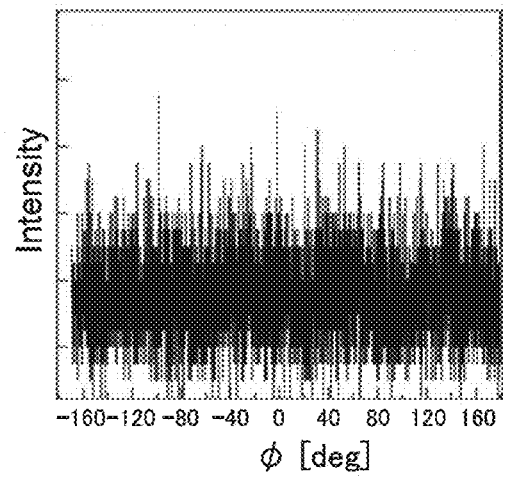
Figure 22C:
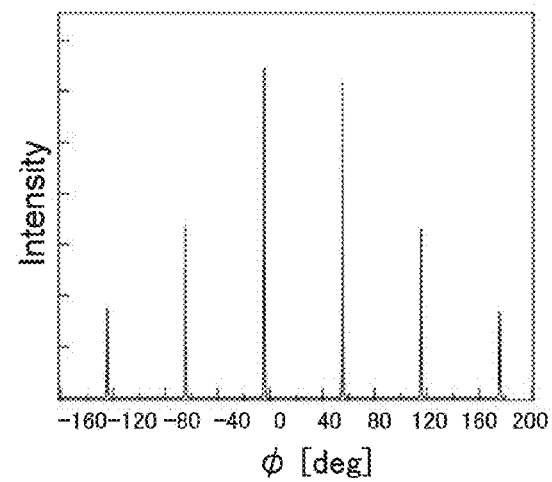

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 22(B), a peak is not clearly observed. In contrast, in the case of a single crystal oxide semiconductor of $InGaZnO_4$, when φ scan is performed with 2θ fixed at around 56°, as shown in FIG. 22(C), six peaks which are derived from crystal planes equivalent to the (110) plane are observed. Accordingly, the structural analysis using XRD shows that the directions of a-axes and b-axes are irregularly oriented in the CAAC-OS.

Figure 23A:
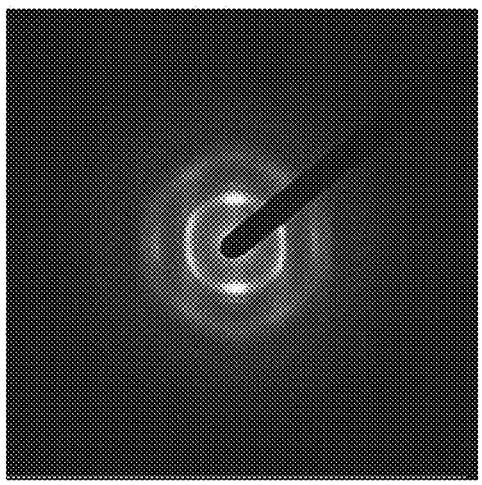
Figure 23B:
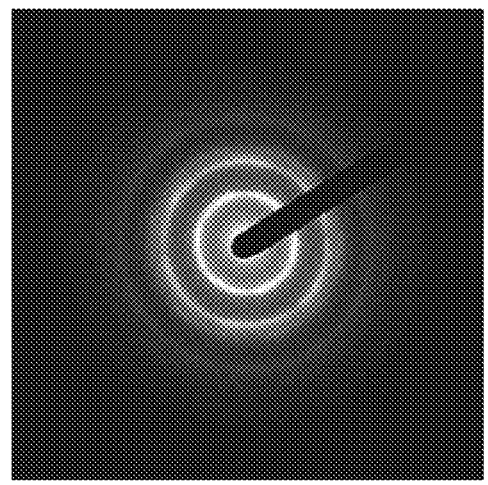

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 23(A) can be sometimes obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 23(B) shows a diffraction pattern obtained in such a manner that an electron beam with a probe diameter of 300 nm is incident on the same sample in a direction perpendicular to the sample surface. As shown in FIG. 23(B), a ring-like diffraction pattern is observed. Thus, the electron diffraction also indicates that the a-axes and b-axes of the pellets included in the CAAC-OS do not have regular alignment. Note that the first ring in FIG. 23(B) is considered to be derived from the (010) plane, the (100) plane, and the like of the $InGaZnO_4$ crystal. In addition, the second ring in FIG. 23(B) is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor might serve as carrier traps or carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released, and may behave like a fixed electric charge. Thus, the transistor including the oxide semiconductor having a high impurity concentration and a high density of defect states might have unstable electrical characteristics. However, a transistor including a CAAC-OS has small variation in electrical characteristics and high reliability.

In addition, since the CAAC-OS has a low density of defect states, carriers generated by light irradiation or the like are less likely to be trapped in defect states. Therefore, in a transistor including a CAAC-OS, variation in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Furthermore, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering within the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 24:
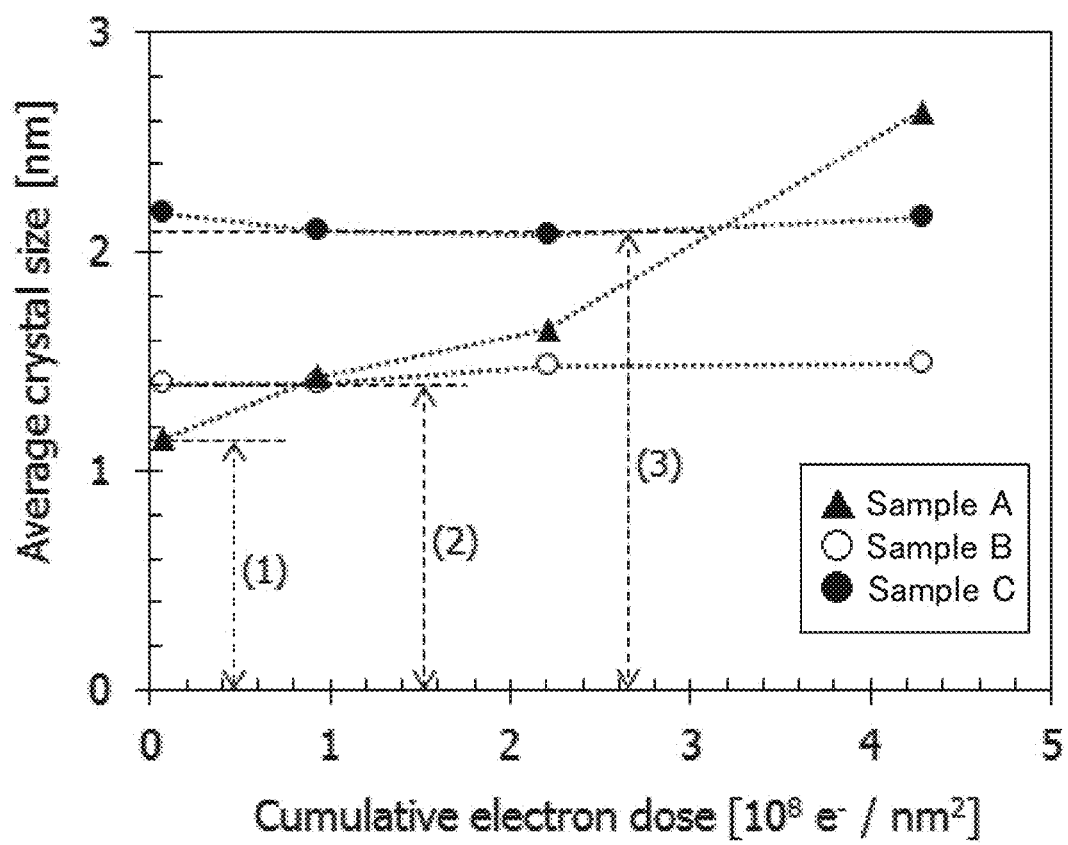

FIG. 24 shows change in the average size of crystal parts (at 22 points to 45 points) in each sample. Note that the crystal part size corresponds to the length of a lattice fringe. FIG. 24 indicates that the crystal part size in the a-like OS increases with an increase in the cumulative electron dose. Specifically, as shown by (1) in FIG. 24, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 24, the crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

Furthermore, the a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, for example, in the case of the oxide semiconductor having an atomic ratio of In:Ga: Zn=1:1:1, the density of the a-like OS is higher than or equal to 5.0 $g/cm^3$ and lower than 5.9 $g/cm^3$. Also in the case of the oxide semiconductor having an atomic ratio of In:Ga: Zn=1:1:1, for example, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 25A:
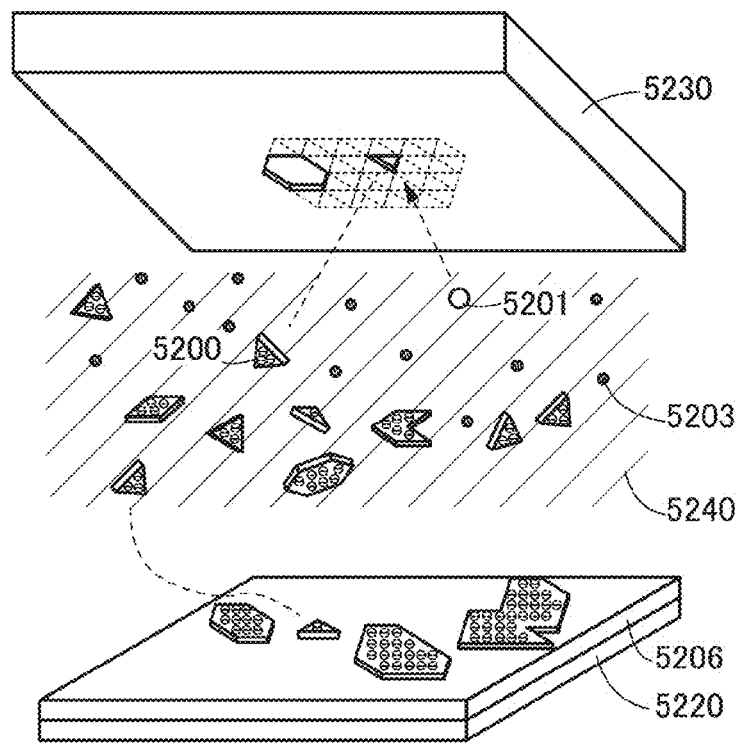

FIG. 25(A) is a schematic view of the inside of a deposition chamber where a CAAC-OS is deposited by a sputtering method.

A target 5130 is attached to a backing plate. A plurality of magnets are provided to face the target 5130 with the backing plate positioned therebetween. The plurality of magnets generate a magnetic field. A sputtering method in which the deposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 26A:
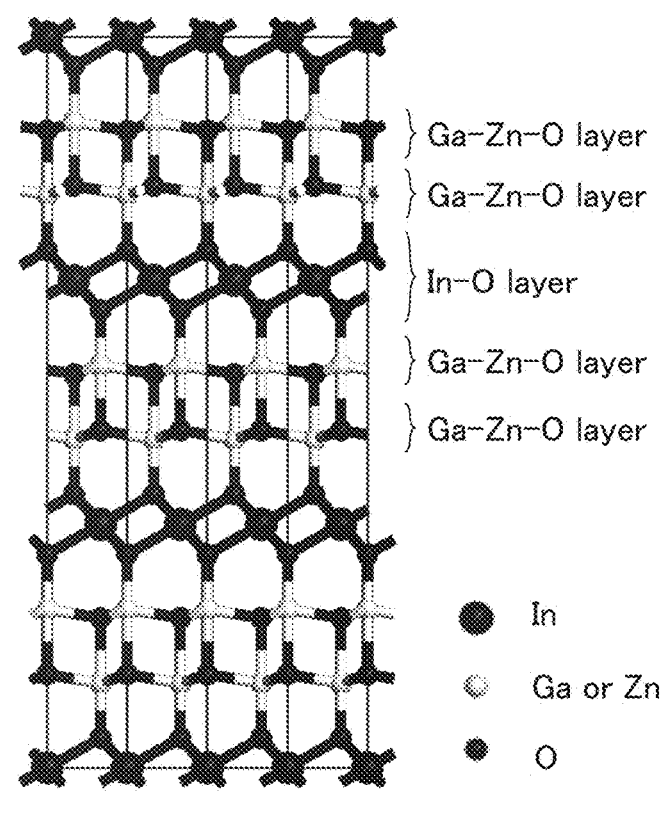

Here, the target 5130 has a polycrystalline structure which includes a plurality of crystal grains and in which a cleavage plane exists in at least one crystal grain. FIG. 26(A) shows a structure of an $InGaZnO_4$ crystal included in the target 5130 as an example. Note that FIG. 26(A) shows a structure of the case where the $InGaZnO_4$ crystal is observed from a direction parallel to the b-axis. FIG. 26(A) indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like or pellet-like sputtered particle having a triangle plane, e.g., regular triangle plane. The pellet 5100b is a flat-plate-like or pellet-like sputtered particle having a hexagon plane, e.g., regular hexagon plane. Note that flat-plate-like or pellet-like sputtered particles such as the pellet 5100a and the pellet 5100b are collectively called pellets 5100. The shape of a flat plane of the pellet 5100 is not limited to a triangle or a hexagon; for example, the flat plane may have a shape formed by combining two or more triangles. For example, a quadrangle (e.g., rhombus) may be formed by combining two triangles (e.g., regular triangles).

Figure 26B:
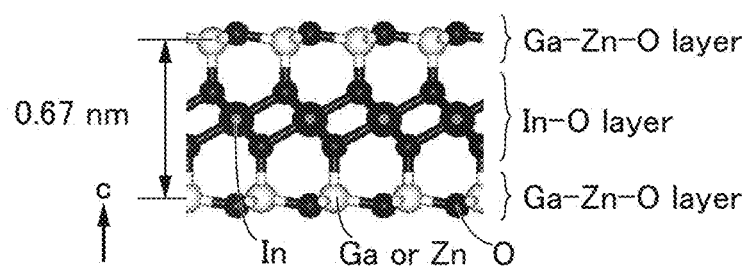
Figure 26C:
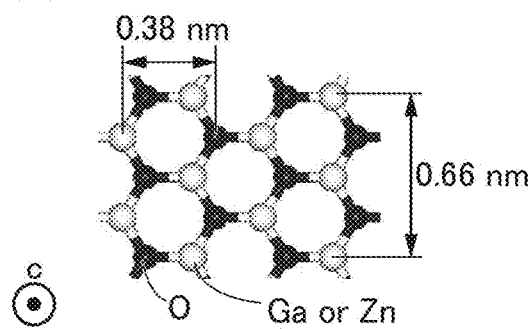

The thickness of the pellet 5100 is determined by the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 24. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 26(B) is separated. FIG. 26(C) shows the structure of the separated pellet 5100 which is observed from a direction parallel to the c-axis. The pellet 5100 can be considered to have a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate or pellet shape. Note that in the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 24 corresponds to the amount of growth in plasma. Here, in the case where the temperature of the substrate 5120 is around room temperature, the pellet 5100 on the substrate 5120 hardly grows; thus, an nc-OS is formed (see FIG. 25(B)). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 25B:
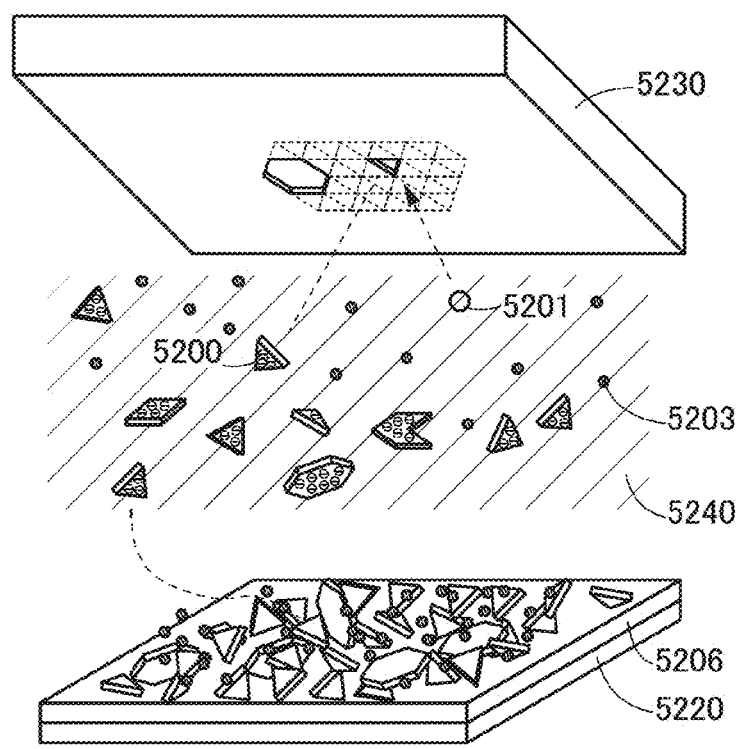

As shown in FIG. 25(A) and FIG. 25(B), for example, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, when the substrate 5120 is heated as shown in FIG. 25(A), the resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, because the pellet 5100 are substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIG. 27 shows cross-sectional schematic views.

Figure 27A:
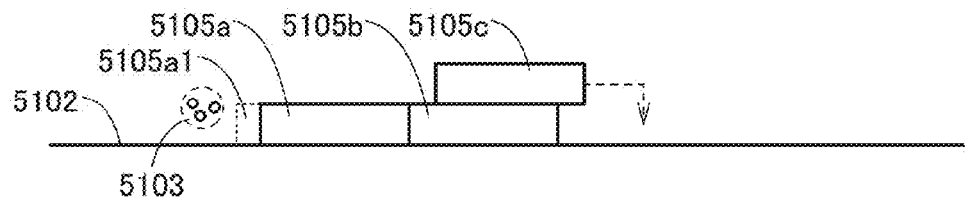

As illustrated in FIG. 27(A), a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide are crystallized by heat from the substrate 5120 to form a region 5105a1 on another side surface of the of the pellet 5105a. Note that the plurality of particles 5103 may contain oxygen, zinc, indium, gallium, or the like.

Figure 27B:
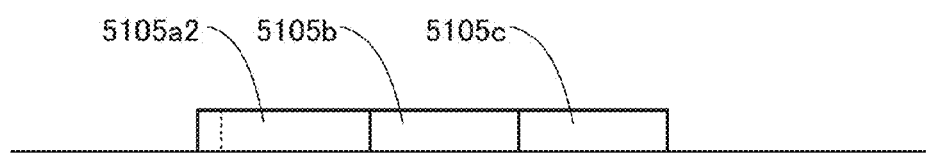

Then, as illustrated in FIG. 27(B), the region 5105a1 grows to part of the pellet 5105a to form a pellet 5105a2. In addition, a side surface of the pellet 5105c is in contact with another side surface of the pellet 5105b.

Figure 27C:
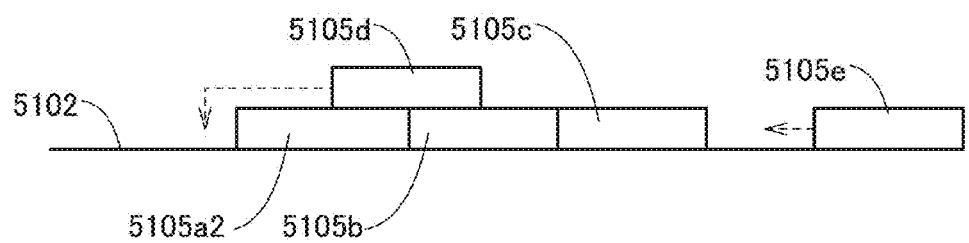

Next, as illustrated in FIG. 27(C), a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 27D:
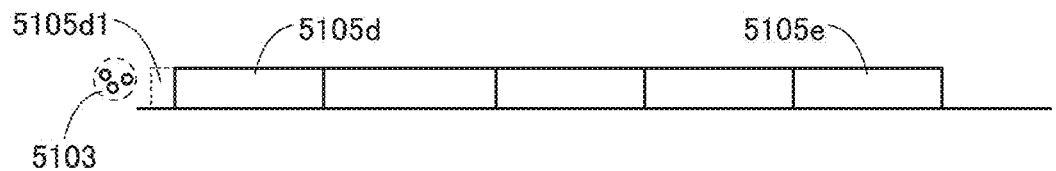

Then, as illustrated in FIG. 27(D), the pellet 5105d is placed so that its side surface is in contact with a side surface of the pellet 5105a2. Furthermore, a side surface of the pellet 5105e is in contact with another side surface of the pellet 5105c. A plurality of particles 5103 separated from the target 5130 together with the zinc oxide are crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 24 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., amorphous silicon oxide), a CAAC-OS can be deposited.

In addition, it is found that in formation of the CAAC-OS, the pellets 5100 are arranged along the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS has a structure in which n layers (n is a natural number) in each of which the pellets 5100 are arranged along the unevenness are stacked. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

This embodiment can be implemented in appropriate combination with the structures described in the other embodiments.

Embodiment 4

In this embodiment, examples of an electronic device including the micromachine of one embodiment of the present invention are described with reference to drawings.

Examples of the electronic device that uses the micromachine of one embodiment of the present invention are as follows: display devices of televisions, monitors, and the like, lighting devices, desktop and laptop personal computers, word processors, image reproduction devices that reproduce still images or moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, stationary game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given. In addition, moving objects and the like driven by electric motors using power from a power storage unit are also included in the category of electronic devices. Examples of the moving objects are electric vehicles (EV), hybrid electric vehicles (HEV) that include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

In particular, as examples of electronic devices including the display device of one embodiment of the present invention, the following can be given: television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, large game machines such as pachinko machines, and the like.

Figure 28A:
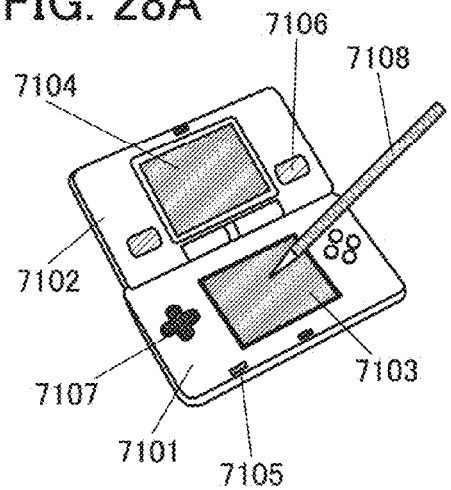

FIG. 28(A) illustrates a portable game console, which includes a housing 7101, a housing 7102, a display portion 7103, a display portion 7104, a microphone 7105, a speaker 7106, an operation key 7107, a stylus 7108, and the like. The micromachine of one embodiment of the present invention can be used for, for example, the display element in the display portion 7103 or 7104. Although the portable game machine illustrated in FIG. 28(A) includes two display portions, the display portions 7103 and 7104, the number of display portions included in the portable game machine is not limited to two.

Figure 28B:
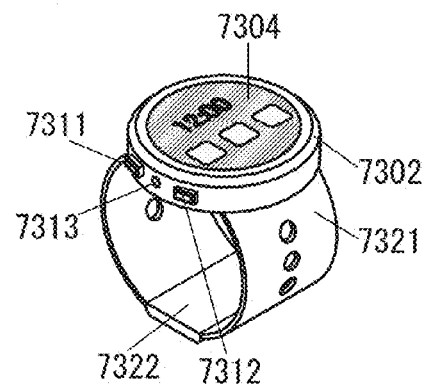

FIG. 28(B) illustrates a smart watch, which includes a housing 7302, a display portion 7304, operation buttons 7311 and 7312, a connection terminal 7313, a band 7321, a clasp 7322, and the like. The micromachine of one embodiment of the present invention can be used for, for example, the display element in the display portion 7304.

Figure 28C:
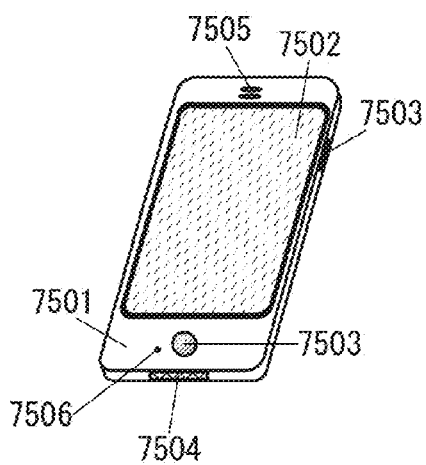

FIG. 28(C) illustrates a portable information terminal, which includes a display portion 7502 incorporated in a housing 7501, operation buttons 7503, an external connection port 7504, a speaker 7505, a microphone 7506, a display portion 7502, and the like. The micromachine of one embodiment of the present invention can be used for, for example, the display element in the display portion 7502.

Figure 28D:
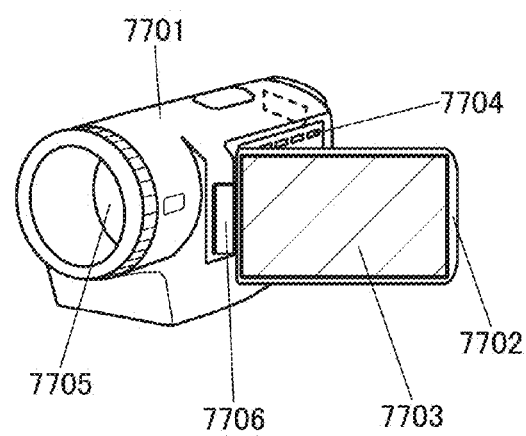

FIG. 28(D) illustrates a video camera, which includes a housing 7701, a housing 7702, a display portion 7703, operation keys 7704, a lens 7705, a joint 7706, and the like. The operation keys 7704 and the lens 7705 are provided for the housing 7701, and the display portion 7703 is provided for the housing 7702. The housing 7701 and the housing 7702 are connected to each other with the joint 7706, and the angle between the housing 7701 and the housing 7702 can be changed with the joint 7706. Images displayed on the display portion 7703 may be switched in accordance with the angle at the joint 7706 between the housing 7701 and the housing 7702. The micromachine of one embodiment of the present invention can be used for, for example, the display element in the display portion 7703.

Figure 28E:
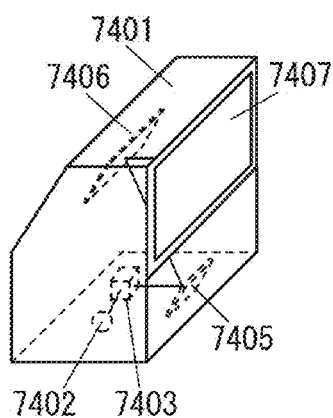

FIG. 28(E) is a rear projector (projection TV), which includes a main body 7401, a light source 7402, a display device 7403, a reflector 7405, a reflector 7406, and a screen 7407. The micromachine of one embodiment of the present invention can be used for, for example, the display device 7403.

Figure 28F:
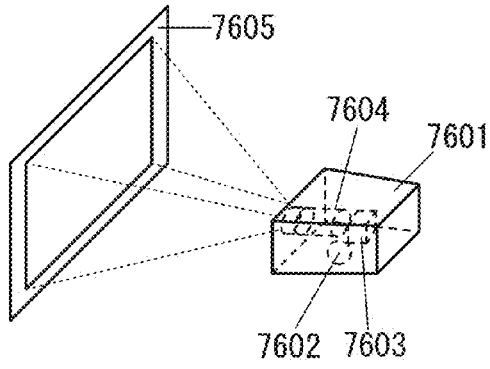

FIG. 28(F) is a front projector, which includes a main body 7601, a light source 7602, a display device 7603, an optical system 7604, and a screen 7605. The micromachine of one embodiment of the present invention can be used for, for example, the display device 7603.

This embodiment can be implemented in appropriate combination with the structures described in the other embodiments.

Example

With use of the materials and methods described in the above embodiments, a transistor A and a transistor B that have structures similar to the structure of the transistor 451 were fabricated and the electrical characteristics such as the Id-Vg characteristics were measured.

Here, Id is a current flowing through a drain (also referred to as a "drain current"), and Ig is a current flowing through a gate (also referred to as a "gate current"). In addition, Vs is a source potential, and Vd is a potential difference between the source and the drain with the source potential used as a reference (also referred as a "drain voltage"). Furthermore, Vg is a potential difference between the source and the gate with the source potential used as a reference (also referred to as a "gate voltage"). Moreover, Vbg is a potential difference between the source and a back gate with the source potential used as a reference (also referred to as a "back gate voltage").

As a semiconductor layer in the transistor A, a stack of In—Ga—Zn oxides, which have an atomic ratio and a film thickness of In:Ga:Zn=1:3:2 (20 nm), 1:1:1 (20 nm), and 1:3:2 (5 nm), was used. Furthermore, as a gate insulating layer, a silicon oxynitride layer with a thickness of 20 nm and a relative permittivity of 4.1 was used. Moreover, the channel length L and the channel width W of the transistor A are 0.38 μm and 0.81 μm, respectively.

As a semiconductor layer in the transistor B, a stack of In—Ga—Zn oxides, which have an atomic ratio and a film thickness of In:Ga:Zn=1:3:4 (20 nm), 1:1:1 (20 nm), and 1:3:2 (5 nm), was used. Furthermore, as a gate insulating layer, a stack of an aluminum oxide layer and a silicon oxynitride layer, which has a thickness of 31 nm and a relative permittivity of 6.3 was used. Moreover, the channel length L and the channel width W of the transistor A are 0.38 μm and 0.81 μm, respectively.

The transistors A and B are n-channel (n-ch type) transistors. Note that the aforementioned atomic ratios are those of sputtering target materials that are used when an In—Ga—Zn oxide is deposited by a sputtering method.

Figure 29A:
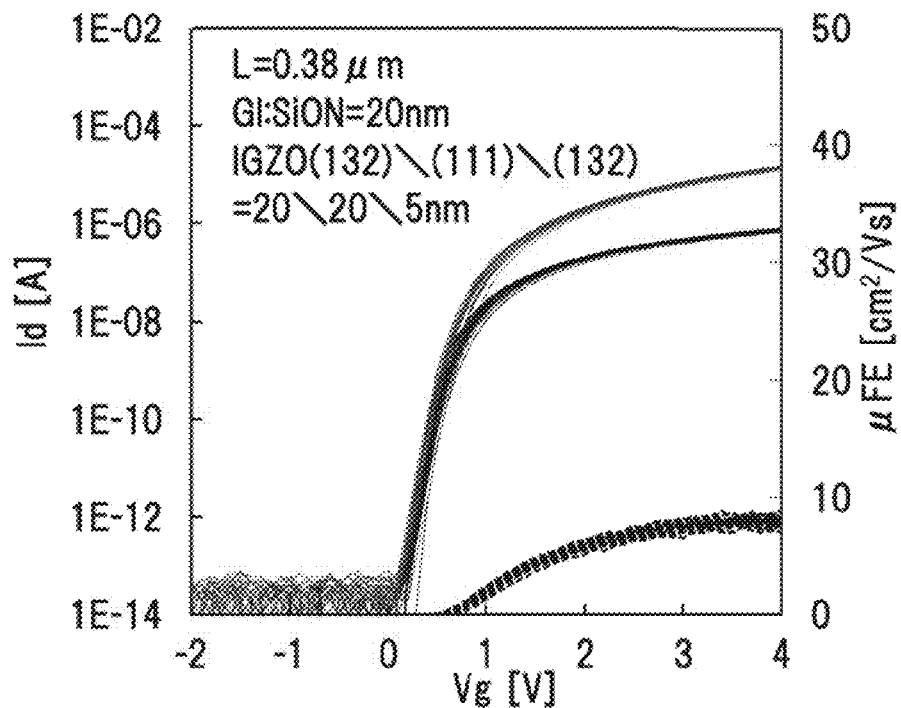
Figure 29B:
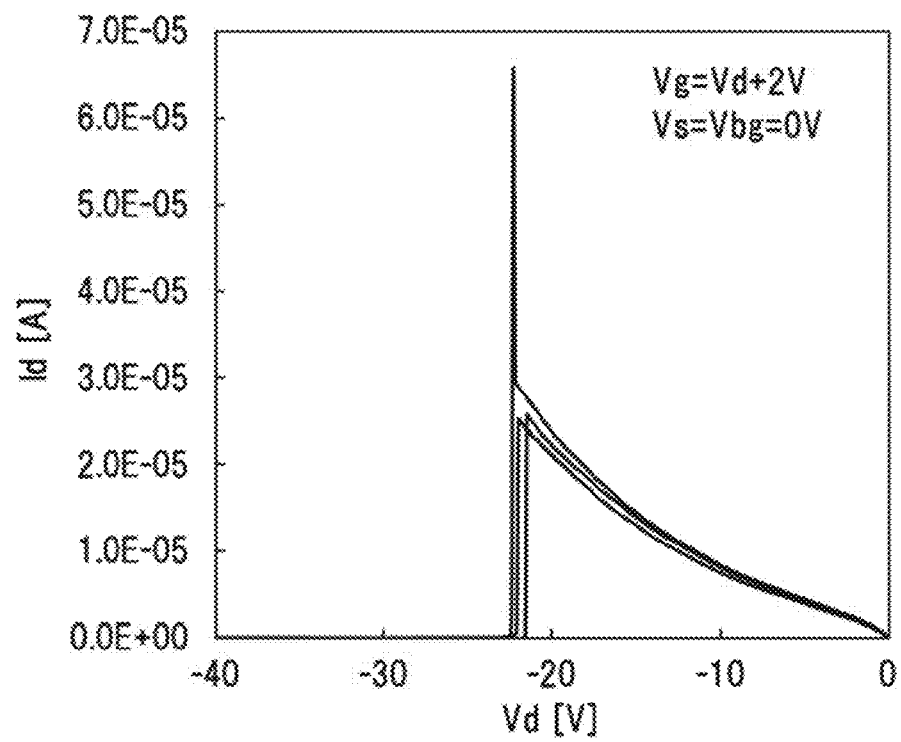
Figure 30A:
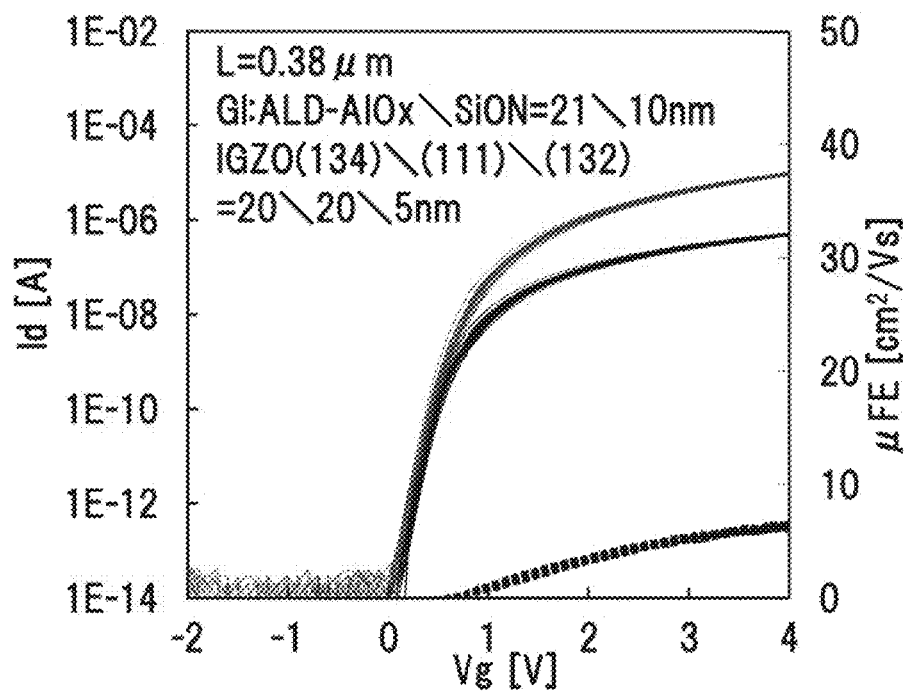
Figure 30B:
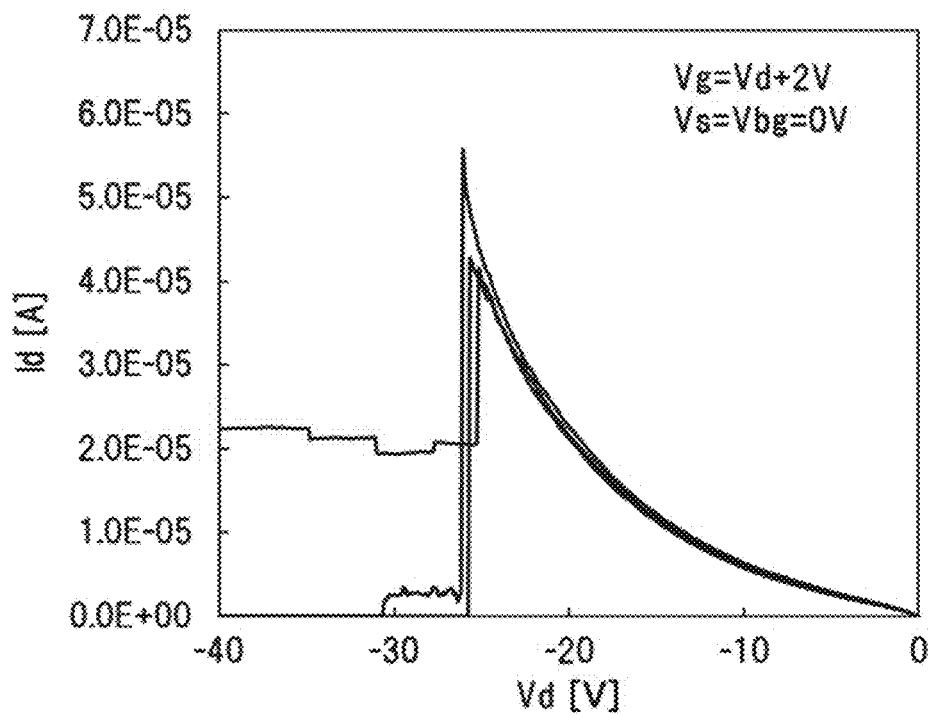

FIG. 29(A) shows the Id-Vg characteristics and field-effect mobility of the transistor A (22 samples), and FIG. 29(B) shows measured data of the drain withstand voltage (withstand voltage between the source and the drain) of the transistor A (3 samples). Furthermore, FIG. 30(A) shows the Id-Vg characteristics and field-effect mobility of the transistor B (25 samples), and FIG. 30(B) shows measured data of the drain withstand voltage of the transistor B (3 samples). Note that the measurement was performed with Vs being 0 V and Vbg being equal to Vs (Vbg=Vs=0 V).

FIG. 29(A) and FIG. 30(A) each show the Id-Vg characteristics at Vd=0.1 V, the Id-Vg characteristics at Vd=3.3 V, and the field-effect mobility at Vd=3.3 V. Note that the field-effect mobility is denoted by a dashed line in the graphs. FIG. 29(A) and FIG. 30(A) indicate that both the transistor A and the transistor B can function as a switching element.

FIG. 29(B) and FIG. 30(B) show the Id-Vg characteristics at the time when Vd is changed from 0 V to −40 V under the conditions where the gate voltage is always higher than the drain voltage by 2 V (Vg=Vd+2 V). The Id of the transistor A is maximum at a Vd of around −22 V and sharply decreases after that (see FIG. 29(B)). This indicates that the drain withstand voltage of the transistor A is approximately 22 V. Similarly, the Id of the transistor B is maximum at a Vd of around −25 V and sharply decreases after that (see FIG. 30(B)). This indicates that the drain withstand voltage of the transistor B is approximately 25 V.

Figure 31A:
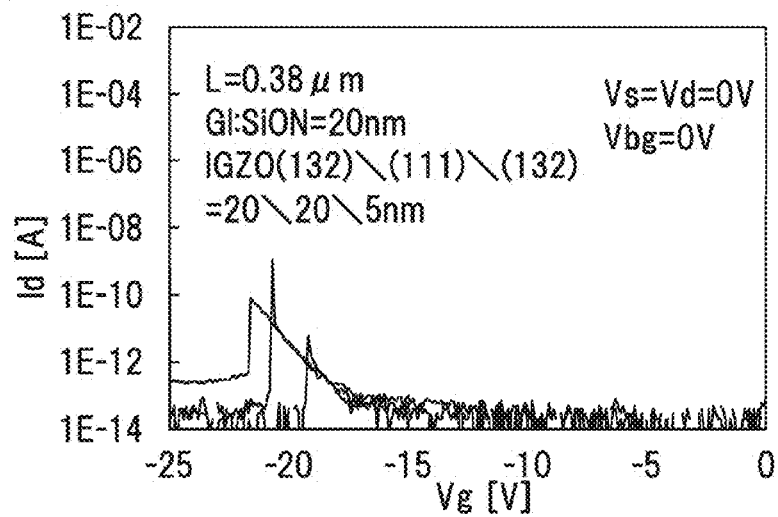
Figure 31B:
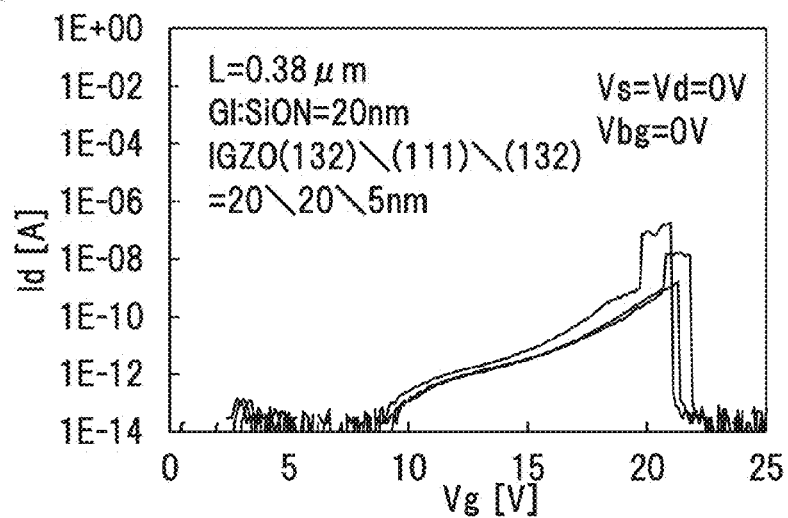

Furthermore, FIG. 31(A) and FIG. 31(B) show measured data of the gate withstand voltage (withstand voltage between the source and the gate) of the transistor A (3 samples). The measurement was performed with Vs, Vd, and Vbg being 0 V. FIG. 31(A) shows the data at the time when Vg is changed from 0 V to −25 V, and FIG. 31(B) shows the data at the time when Vg is changed from 0 V to 25 V. In FIG. 31(A), Id is maximum at a Vg of around −21 V and sharply decreases after that. In FIG. 31(B), Id is maximum at a Vg of around 21 V and sharply decreases after that. These indicate that the gate withstand voltage of the transistor A is approximately 21 V.

Figure 31C:
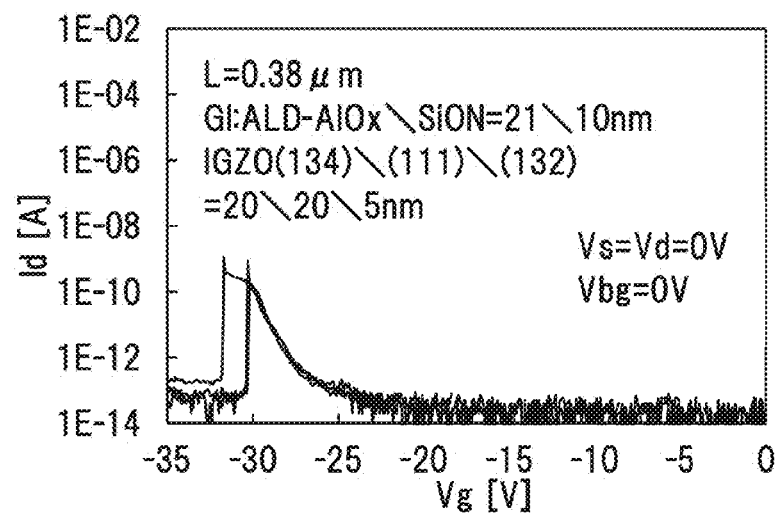

Furthermore, FIG. 31(C) shows measured data of the gate withstand voltage of the transistor B (3 samples). The measurement was performed with Vs, Vd, and Vbg being 0 V. FIG. 31(C) shows the data at the time when Vg is changed from 0 V to −35 V. In FIG. 31(C), Id is maximum at a Vg of around −30 V and sharply decreases after that. This indicates that the gate withstand voltage of the transistor B is approximately 30 V. It is found that the gate withstand voltage increases when aluminum oxide is used for the gate insulating layer.

When an oxide semiconductor is used for a semiconductor layer in which a channel is formed, a transistor with a high withstand voltage and a low off-state current can be provided even with a channel length of 0.5 μm or less. As a result, a highly reliable and low power consumption transistor can be provided.

EXPLANATION OF REFERENCE 100 micromachine
101 substrate
102 insulating layer
103 electrode
104 electrode
105 insulating layer
106 semiconductor layer
107 insulating layer
108 insulating layer
109 insulating layer
110 insulating layer
111 opening
112 electrode
113 electrode
114 insulating layer
115 opening
116 electrode
118 insulating layer
121 electrode
122 electrode
123 electrode
124 stopper
125 pillar
126 support
131 insulating layer
133 electrode
134 transistor
135 opening
136 electrode
151 circuit
152 wiring
153 wiring
154 wiring
155 wiring
156 wiring
158 node
159 node
161 transistor
162 transistor
163 transistor
164 transistor
171 resistor
172 resistor
173 capacitor
174 capacitor
180 structure body
200 display element
206 gate electrode
209 insulating layer
213 electrode
214 layer
216 insulating layer
217 insulating layer
218 insulating layer
219 insulating layer
242 semiconductor layer
246 electrode
255 impurity element
261 transistor
262 transistor
271 well
281 insulating layer
282 insulating layer
283 insulating layer
300 display device
301 light source
302 lens
303 screen
311 light
315 actuator
382 Ec
386 Ec
387 Ec
390 trap state
410 transistor
411 transistor
420 transistor
421 transistor
422 transistor
430 transistor
431 transistor
440 transistor
441 transistor
450 transistor
451 transistor
452 transistor
1300 shutter
1302 movable light-blocking layer
1304 opening
1311 actuator
1315 actuator
1317 spring
1319 structure body
1321 movable electrode
1323 structure body
1325 movable electrode
1327 structure body
5100 pellet
5101 ion
5102 zinc oxide layer
5103 particle
5120 substrate
5130 target
5161 region
7101 housing
7102 housing
7103 display portion
7104 display portion
7105 microphone
7106 speaker
7107 operation key
7108 stylus 7302 housing
7304 display portion
7311 operation button
7312 operation button
7313 connection terminal
7321 band
7322 clasp
7401 main body
7402 light source
7403 display device
7405 reflector
7406 reflector
7407 screen
7501 housing
7502 display portion
7503 operation button
7504 external connection port
7505 speaker
7506 microphone
7601 main body
7602 light source
7603 display device
7604 optical system
7605 screen
7701 housing
7702 housing
7703 display portion
7704 operation key
7705 lens
7706 joint
107a electrode
107b electrode
108a insulating layer
108b insulating layer
242a semiconductor layer
242b semiconductor layer
242c semiconductor layer
244a electrode
244b electrode
247a opening
247b opening
383a Ec
383b Ec
383c Ec
5100a pellet
5100b pellet
5105a pellet
5105a1 region
5105a2 pellet
5105b pellet
5105c pellet
5105d pellet
5105d1 region
5105e pellet

The invention claimed is:

1. A display element comprising first to fourth wirings, first to fourth transistors, and first to third electrodes,
wherein at least one of the first to fourth transistors includes an oxide semiconductor,
wherein one of a source and a drain of the first transistor is electrically connected to the first wiring,
wherein the other of the source and the drain of the first transistor is electrically connected to a first node,
wherein a gate of the first transistor is electrically connected to the second wiring,
wherein one of a source and a drain of the second transistor is electrically connected to the third wiring,
wherein the other of the source and the drain of the second transistor is electrically connected to a second node,
wherein a gate of the second transistor is electrically connected to the second wiring,
wherein one of a source and a drain of the third transistor is electrically connected to the first node,
wherein the other of the source and the drain of the third transistor is electrically connected to the fourth wiring,
wherein a gate of the third transistor is electrically connected to the second node,
wherein one of a source and a drain of the fourth transistor is electrically connected to the second node,
wherein the other of the source and the drain of the fourth transistor is electrically connected to the fourth wiring,
wherein a gate of the fourth transistor is electrically connected to the first node,
wherein the first electrode is electrically connected to the first node, and the second electrode is electrically connected to the second node, and
wherein the third electrode has a function of tilting in accordance with signals supplied to the first electrode and the second electrode.

2. The display element according to claim 1, wherein at least one of the first to fourth transistors comprises a back gate electrode.

3. The display element according to claim 1, wherein the first electrode and the second electrode are fixed electrodes.

4. The display element according to claim 1, wherein the third electrode is a movable electrode.

5. A display device comprising:
the display element according to claim 1; and
a lens or a reflector.

6. An electronic device comprising:
the display element according to claim 1; and
a microphone, a speaker, or a housing.

7. A display element comprising first to fourth wirings, first to fourth transistors, and first to third electrodes,
wherein at least one of the first to fourth transistors includes an oxide semiconductor,
wherein one of a source and a drain of the first transistor is electrically connected to the first wiring,
wherein the other of the source and the drain of the first transistor is electrically connected to a first node,
wherein a gate of the first transistor is electrically connected to the second wiring,
wherein one of a source and a drain of the second transistor is electrically connected to the third wiring,
wherein the other of the source and the drain of the second transistor is electrically connected to a second node,
wherein a gate of the second transistor is electrically connected to the second wiring,
wherein one of a source and a drain of the third transistor is electrically connected to the first node,
wherein the other of the source and the drain of the third transistor is electrically connected to the fourth wiring,
wherein a gate of the third transistor is electrically connected to the second node,
wherein one of a source and a drain of the fourth transistor is electrically connected to the second node,
wherein the other of the source and the drain of the fourth transistor is electrically connected to the fourth wiring,
wherein a gate of the fourth transistor is electrically connected to the first node,
wherein the first electrode is electrically connected to the first node, and the second electrode is electrically connected to the second node, wherein the third electrode is over the first and second electrodes with a space therebetween, and wherein the third electrode has a function of tilting in accordance with signals supplied to the first electrode and the second electrode.

8. The display element according to claim 7, wherein at least one of the first to fourth transistors comprises a back gate electrode.

9. The display element according to claim 7, wherein the first electrode and the second electrode are fixed electrodes.

10. The display element according to claim 7, wherein the third electrode is a movable electrode.

11. A display device comprising:

the display element according to claim 7; and a lens or a reflector.

12. An electronic device comprising:

the display element according to claim 7; and a microphone, a speaker, or a housing.

13. The display element according to claim 7, wherein a channel length of one of the first to fourth transistors is 0.5 µm or less.

14. The display element according to claim 7, wherein an off-state current per micrometer of channel width of one of the first to fourth transistors at room temperature is lower than $1 \times 10^{-20}$ A.

15. The display element according to claim 7, wherein a drain withstand voltage of one of the first to fourth transistors is higher than or equal to 21 V and lower than or equal to 25 V.

* * * * *